(12) United States Patent
Nagahama et al.

(10) Patent No.: US 6,677,619 B1
(45) Date of Patent: Jan. 13, 2004

(54) NITRIDE SEMICONDUCTOR DEVICE

(75) Inventors: Shinichi Nagahama, Anan (JP); Masayuki Senoh, Anan (JP); Shuji Nakamura, Santa Barbara, CA (US)

(73) Assignee: Nichia Chemical Industries, Ltd., Tokushima (JP)

( * ) Notice: Subject to any disclaimer, the term of this patent is extended or adjusted under 35 U.S.C. 154(b) by 0 days.

(21) Appl. No.: 09/714,143

(22) Filed: Nov. 17, 2000

Related U.S. Application Data

(63) Continuation of application No. 09/004,925, filed on Jan. 9, 1998, now Pat. No. 6,172,382.

(30) Foreign Application Priority Data

| Jan. 9, 1997 | (JP) | P09-001937 |
|---|---|---|
| Jan. 27, 1997 | (JP) | P09-012707 |
| Apr. 3, 1997 | (JP) | P09-102793 |
| May 26, 1997 | (JP) | P09-134210 |
| Sep. 9, 1997 | (JP) | P09-244342 |
| Oct. 27, 1997 | (JP) | P09-274438 |
| Oct. 27, 1997 | (JP) | P09-311272 |

(51) Int. Cl.$^7$ ............................................. H01L 33/00
(52) U.S. Cl. .............................. 257/94; 251/96; 251/97; 251/200
(58) Field of Search ............................. 257/200, 777, 257/94, 96, 97

(56) References Cited

U.S. PATENT DOCUMENTS

| 5,005,057 A | | 4/1991 | Izumiya et al. | |
|---|---|---|---|---|
| 5,146,465 A | * | 9/1992 | Khan et al. | 372/43 |
| 5,306,662 A | | 4/1994 | Nakamura et al. | |
| 5,585,648 A | * | 12/1996 | Tischler | 257/103 |

(List continued on next page.)

FOREIGN PATENT DOCUMENTS

| GB | 2 298 735 | 9/1996 |
|---|---|---|
| JP | 2288371 | 11/1990 |
| JP | 5-110138 A | 4/1993 |

(List continued on next page.)

OTHER PUBLICATIONS

S. Nakamura et al., "Present Status of InGaN/GaN/AlGaN--Based Laser Diodes", Proceedings of the Second International Conference on Nitride Semiconductors (INCS '97), 1997, p. 444–446.

T. Shibata et al., "Hybride Vaper Phase Epitaxy Growth . . . , Overgrowth", Proceedings of the Second International Conference on Nitride Semiconductors (INCS '97), 1997, p. 154–155.

H. Matsushima et al., "Sub–micron Fine Structure of GaN by MOVPE Selective Area Growth (SAG) and Buried Structure by Epitaxial Lateral Overgrowth (ELO)", Proceedings of the Second International Conference on Nitride Semiconductors (ICNS '97), p. 492–493.

(List continued on next page.)

*Primary Examiner*—Nathan J. Flynn
*Assistant Examiner*—Leonardo Andújar
(74) *Attorney, Agent, or Firm*—Birch, Stewart, Kolasch & Birch, LLP

(57) ABSTRACT

A nitride semiconductor device including a light emitting device comprises a n-type region of one or more nitride semiconductor layers having n-type conductivity, a p-type region of one or more nitride semiconductor layers having p-type conductivity and an active layer between the n-type region and the p-type region. In such devices, there is provided with a super lattice layer comprising first layers and second layers which are nitride semiconductors having a different composition respectively. The super lattice structure makes working current and voltage of the device lowered, resulting in realization of more efficient devices.

8 Claims, 9 Drawing Sheets

U.S. PATENT DOCUMENTS

| | | | |
|---|---|---|---|
| 5,592,501 A | * | 1/1997 | Edmond et al. .............. 372/45 |
| 5,747,827 A | | 5/1998 | Duggan et al. |
| 5,903,017 A | | 5/1999 | Itaya et al. |
| 6,377,596 B1 | | 4/2002 | Tanaka et al. |

FOREIGN PATENT DOCUMENTS

| | | |
|---|---|---|
| JP | 5-110139 A | 4/1993 |
| JP | 5-183189 A | 7/1993 |
| JP | 6-021511 A | 1/1994 |
| JP | 6-268257 A | 9/1994 |
| JP | 7-169701 | 7/1995 |
| JP | 7-169701 A | 7/1995 |
| JP | 8-23124 | 1/1996 |
| JP | 8-023124 A | 1/1996 |
| JP | 8-56015 | 2/1996 |
| JP | 8-056015 A | 2/1996 |
| JP | 8-070139 A | 3/1996 |
| JP | 8-203834 | 8/1996 |
| JP | 8-203834 A | 8/1996 |
| JP | 6-228048 A | 9/1996 |
| JP | 8-250810 | 9/1996 |
| JP | 8-116234 A | 5/1997 |
| JP | 9148678 | 6/1997 |
| JP | 9-148678 A | 6/1997 |
| JP | 9-232629 A | 9/1997 |
| JP | 9-232629 | 9/1997 |
| JP | 9-293935 A | 11/1997 |
| JP | 9-293935 | 11/1997 |
| JP | 9-298341 A | 11/1997 |
| JP | 9-298341 | 11/1997 |
| JP | 10-93194 | 4/1998 |
| JP | 10-145004 | 5/1998 |
| WO | WO 97/11518 | 3/1997 |

OTHER PUBLICATIONS

S. Nakamura et al., "InGaN–Based Multi–Quantum–Well-–Structure Laser Diodes", Jpn. J. Appl. Phys., vol. 35 (1996), p. L74–L76, Part 2, No. 1B, Jan. 15, 1996S.

Nakamura et al., "In GaN–Based Multi–Quantum–Well-–Structure Laser Diodes with Cleaved Mirror Cavity Facets", Jpn. J. Appl. Phys., vol. 35 (1996), p. L217–L220, Part 2, No. 2B, Feb. 15, 1996.

S. Nakamura et al., "High–Power, Long–Lifetime InGaN Multi–Quantum–Well–Structure Laser Diodes", Jpn. J. Appl. Phys., vol. 36 (1997), p. L1059–L1061, Part 2, No. 8B, Aug. 15, 1997.

F.L. Degertekin et al., "Single mode Lamb wave excitation in thin plates by Hertzian contacts", Appl. Phys. Lett. 69 (2), p. 146–148, Jul. 8, 1996.

M. Shao et al., "Radio–frequency . . . ", Appl. Phys. Lett. 69 (2), p. 3045–3047, Nov. 11, 1996.

S. Nakamura et al., "Room–temperature continuous–wave operation of InGaN multi–quantum–well structure laser diodes", Appl. Phys. Lett. 69 (2), p. 4056–4058, Dec. 23, 1996.

Suemune, Ikuo, "Doping in a superlattice structure: Improved hole activation in wide–gap II–VI materials," J. Appl. Phys. vol. 67, No. 5 (Mar. 1, 1990), pp. 2364–2369.

* cited by examiner

NITRIDE SEMICONDUCTOR DEVICE

This application is a continuation of application Ser. No. 09/004,925, filed on Jan. 9, 1998 now U.S. Pat. No. 6,172,382, the entire contents of which are hereby incorporated by reference.

TECHNICAL FIELD OF THE INVENTION

This invention relates to a device provided with a nitride semiconductor $In_xAl_yGa_{1-x-y}N$ (0=x, 0=y, x+y=1) including light emitting devices such as LED (light emitting diode), LD (laser diode) and SLD (super luminescent diode), solar cells, light receiving devices such as optical sensors and electronic devices such as transistors and power devices.

BACKGROUND OF THE INVENTION

Nitride semiconductors have been recently produced as materials used for a high bright blue LED and a pure green LED, a full color LED display and a traffic signal LED. Such LEDs are provided with an active layer of SQW (Single Quantum Well) or MQW (Multi Quantum Well) where the well layer is made of InGaN and positioned between a p-type nitride layer and an n-type nitride layer to form a DH (Double Hetero) structure. The wavelength of the blue or green light emitting from the active layer depends on a ratio of In in the InGaN well layer.

The inventors have first realized laser emitting by using the above nitride materials and reported it in Jpn. J. Appl. Phys. 35(1996)L74 and Jpn. J. Appl. Phys. 35(1996)L217. The laser device comprises the DH structure where the active layer is MQW having InGaN well layers and showed the following data:

Threshold current: 610 mA;

Threshold current density: 8.7 kA/m2;

Wavelength: 410 nm (pulse width 2 $\mu$m and pulse cycle 2 ms) p The inventors have further improved the laser device and reported it in Appl. Phys. Lett. 69(1996)1477. The laser device comprises a ridge strip structure formed on a part of p-type nitride semiconductor and showed the following data.

Threshold current: 187 mA;

Threshold current density: 3 kA/m2;

Wavelength: 410 nm (pulse width 2 $\mu$m, pulse cycle 2 ms and duty ratio: 0.1%)

The inventors have first succeeded in CW (Continuous-Wave) Oscillation or Operation at room temperature and reported it in Gijutsu-Sokuho of Nikkei Electronics issued on Dec. 2, 1996, Appl. Phys. Lett. 69(1996) and Appl. Phys. Lett. 69(1996)4056.

The laser diode showed a lifetime of 27 hours at 20° C. under the threshold current density of 3.6 ka/cm$^2$ the threshold voltage of 5.5 V and the output of 1.5 mW.

On the other hand, the blue and green LED of nitrides showed a forward current (If) of 20 mA and a forward voltage (Vf) of 3.4 to 3.6 V which are higher by 2 V or more than those of red LEDs made of GaAlAs semiconductors. Therefore, further decrease of Vf in the blue and green LED was required. Additionally, there was required an effective LD which can decrease the threshold current and voltage to get a longer lifetime of CW operation at room temperature, because the conventional LD still had a higher threshold current and voltage.

The inventors have gotten the idea that technology of decreasing the threshold in LDs was applicable to LEDs in order to decrease the Vf. Therefore, a first object of the present invention is to decrease the threshold current and voltage of nitride semiconductor LDs and realize a longer lifetime of CW operation.

In the specification, it should be understood that the general formulae: $In_xGa_{1-x}N$ and $Al_yGa_{1-y}N$ show chemical atoms which compose of nitride layers and therefore, even if different layers are represented by the same formula, the different layers do not necessarily have the same composition, that is, the same x or y does not mean the same ratio.

DISCLOSURE OF THE INVENTION

According to a first aspect of the present invention, there is provided a nitride semiconductor device comprising a p-type region comprising one or more p-conductivity semiconductor layers of nitride, a n-type region comprising one or more n-conductivity semiconductor layers of nitride and an active layer of a nitride semiconductor which is positioned between said p type region and said n type region, at least one layer of said p type region being a super lattice layer comprising first thin layers of nitride and second thin layers of nitride, said first layers having different composition from those of said second layers and the first and second thin layers being laminated alternately.

The super lattice structure can make the nitride layers improved in crystallinity and then make the nitride layers decreased in resistivity, resulting in smaller resistance of the p-type region and higher power efficiency of the device.

In the present invention, the p-type region means a region comprising one or more nitride semiconductor layers between an active layer and a p-electrode while the n-type region means a region comprising one or more nitride semiconductor layers between the active layer and an n-electrode.

According to a second aspect of the present invention, there is provided a nitride semiconductor device having an active layer made of a nitride semiconductor between the n-type region of one or more nitride semiconductor layers and the p-type region of one or more nitride semiconductor layers, at least one semiconductor layer in the p-type region or the n-type region is a super lattice layer made by laminating first layers and second layers which are made of nitride semiconductor, respectively, and have different constitutions from each other.

The super lattice structure can make the nitride layers improved in crystallinity and then make the nitride layers decreased in resistivity, resulting in smaller resistance of the n-type region and higher power efficiency of the device.

In a preferred embodiment of the first and second nitride semiconductor devices, the super lattice layer is made by laminating first layers which is made of a nitride semiconductor and has a thickness of not more than 100 angstroms and second layers which is made of a nitride semiconductor having different constitutions from the first layer and has a thickness of not more than 100 angstroms.

In order to keep or confine carriers in the active layer, at least one of the first and second layers is preferably made of a nitride semiconductor containing Al, especially $Al_yGa_{1-y}N$ (0<Y≦1).

In a second preferred embodiment of the first and second nitride semiconductor devices, for the super lattice, the first layer is preferably made of a nitride semiconductor represented by the formula $In_xGa_{1-x}N$ (0≦X≦1) and the second layer is preferably made of a nitride semiconductor represented by the formula $Al_yGa_{1-y}N$ (0<Y≦1, X=Y≠0).

According to the second embodiment, all the nitride layers have a good crystallinity, which results in improving output of the nitride semiconductor device (improvement of power efficiency). In LED or LD devices, the forward voltage (hereinafter referred to Vf) and also the threshold current and voltage can be lowered. In order to form a nitride layer having better crystallinity in the first and second semiconductor device, it is further recommendable that first layers of the super lattice structure are made of a nitride semiconductor represented by the formula $In_XGa_{1-X}N$ ($0 \leq X < 1$) and said second layer is made of a nitride semiconductor represented by the formula $Al_YGa_{1-Y}N$ ($0 < Y < 1$).

In the above first and second semiconductor devices, it is preferable that the first layer and the second layer are made of a nitride semiconductor and have a thickness of not more than 70, especially 40 angstroms, respectively, while said first layer and said second layer have a thickness of not less than 10, especially 5 angstroms, respectively. The thickness within the above range makes it easy to form $Al_xGa_{1-y}N$ ($0 < Y \leq 1$), which layer is otherwise difficult to be formed with a good crystallinity. Especially, in case that the super lattice layer can be made as at least one layer of the p-type region between the p-electrode and the active layer and also as at least one layer of the n-type semiconductor region between the n-contact layer for current charging and the active layer, it is recommendable to get better effect that thickness of the first and second layer should be set within the above range.

In the above embodiment of the first and second nitride semiconductor devices, the p-type region is preferably provided with a p-side contact layer having a thickness of not more than 500 angstroms, on which the p-electrode is to be formed. More preferably, the p-side contact layer has a thickness of not more than 300 angstroms and not less than 10 angstroms.

In the second nitride semiconductor device of the present invention, wherein the p-type region is provided with a p-side contact layer on which the p-electrode is to be formed, the super lattice layer is preferably formed between the active layer and the p-side contact layer.

Further, in the second nitride semiconductor device of the present invention, the n-type region may comprise a second buffer layer made of a nitride semiconductor which has a thickness of not less than 0.1 μm via a first buffer layer on the substrate, an n-side contact layer made of a nitride semiconductor doped with an n-type impurity on said second buffer layer, and an n-electrode being formed on the n-side contact layer. This construction makes the n-side contact layer have higher carrier concentration and good crystallinity. In order to make the n-side contact layer have much better crystallinity, it is preferable that the concentration of the impurity in second buffer layer is lower than that in said n-side contact layer. Further, it is preferable that at least one of the first and second buffer layers is a super lattice layer made by laminating nitride semiconductor layers of different constitutions with a thickness of not more than 100 angstroms in order to make a nitride layer formed on the buffer layer and have a good crystallinity.

In the second nitride semiconductor device, wherein the n-type region has a n-side contact layer on which a n-electrode is to be formed, the super lattice layer is preferably formed between the active layer and the n-side contact layer. In the LD device, the layer formed between the active layer and the n-side contact layer or between the active layer and the p-side contact layer may be a cladding layer acting as a carrier keeping layer or a light guide layer, which is preferably made of the super lattice structure. Thereby, the super lattice structure can remarkably decrease the threshold current and voltage. Especially, if the p-cladding layer between the active layer and the p-side contact layer, the p-cladding layer of the super lattice structure is advantageous to lower the threshold current and voltage. In the second nitride semiconductor device of the present invention, it is preferable that at least one of said first layer and said second layer is doped with an impurity which makes the conductivity of the layer n-type or p-type and the impurity concentration doped to the first layer and the second layer to make the conductivity of the layers n-type or p-type, are different from each other. The impurity for making the conductivity of the layer includes n-impurities belonging to IV-A, IV-B, VI-A and VI-B groups and p-impurities belonging to I-A, I-B, II-A, II-B groups (hereinafter referred to n-impurity and p-impurity).

In the second nitride semiconductor device of the present invention, the super lattice layer may be formed as the n-side contact layer on which the n-electrode is to be formed, whereby the resistance of n-side contact layer can be lowered, resulting in further decreasing of the threshold current and voltage in LD devices.

In the LD devices provided with the first or second nitride semiconductor device of the present invention, if the laser device has a super lattice layer in the p-type region, a ridge portion may be formed on the supper lattice layer and on the layer located over said super lattice layer in a manner that the longitudinal direction of the ridge portion coincides with the direction of resonance and the ridge has a predetermined width.

In a preferred first laser diode of the present invention, which comprises an active layer in which laser is emitted between the n-type region including a n-side cladding layer and the p-type region including a p-side cladding layer, the n-side cladding layer may be a super lattice layer made by laminating first layers made of a nitride semiconductor having a thickness of not more than 100 angstroms and second layers made of a nitride semiconductor of a different constitution from the first layer and having a thickness of not more than 100 angstroms, and said p-side cladding layer may be a super lattice layer made by laminating a third layer made of a nitride semiconductor having a thickness of not more than 100 angstroms and a fourth layer made of a nitride semiconductor of a different constitution from the third layer and having a thickness of not more than 100 angstroms. Due to this, during laser emission the threshold current and voltage can be lowered. In this case, the ridge portion may be formed on said p-side cladding layer and on the layer located over said p-side cladding layer in a manner that the longitudinal direction of the ridge coincidences with the direction of resonance and the ridge has a desired width.

According to a third aspect of the present invention, there is provided a third nitride semiconductor device which comprises an active layer made of a nitride semiconductor between a n-type region of one or more nitride semiconductor layers and a p-type region of one or more nitride semiconductor layers, wherein at least one nitride semiconductor layer in the n-type region is a n-side super lattice made by laminating first and second nitride semiconductor layers which have different constitutions and different concentrations of a n-type impurity from each other. Due to this construction, the nitride semiconductor layer made of the super lattice structure makes the electrical resistance thereof smaller and thus the total resistance of the n-type region can be smaller.

According to a fourth aspect of the present invention, there is provided a nitride semiconductor device comprising an active layer made of a nitride semiconductor between the n-type region of one or more nitride semiconductor layers and the p-type region of one or more nitride semiconductor layers, characterized in that at least one nitride semiconductor layer in the p-type region is a p-side super lattice made by laminating third and fourth nitride semiconductor layers which have different constitutions and different concentrations of a p-type impurity from each other. The super lattice structure can make the nitride semiconductor layer comprising the super lattice structure have a lower resistance and then total resistance of the p-type region can be decreased.

Please note that the first and second and the third and fourth of layers does not mean the laminating order in the specification.

According to a fifth aspect of the present invention, there is provided a nitride semiconductor device comprising an active layer made of a nitride semiconductor between the n-type region of one or more nitride semiconductor layers and the p-type semiconductor region of one or more nitride semiconductor layers, characterized in that at least one nitride semiconductor layer in the n-type region is a n-side super lattice made by laminating the first and second nitride semiconductor layers which have different constitutions and different concentrations of a n-type impurity from each other, and at least one nitride semiconductor layer in p-type region is a p-side super lattice made by laminating the third and fourth nitride semiconductor layers which have different constitutions and different concentrations of a p-type impurity from each other. The super lattice structure can make the resistance of the nitride semiconductor comprising super lattice structure smaller and thus total resistance of the p-type region can be decreased.

In a case that the third and fifth semiconductor devices are devices of optoelectronics such as light emitting devices and light receiving devices, the n-side super lattice layer may be formed as at least one of the group consisting of a buffer layer formed on the substrate, a n-side contact layer for n-electrode, n-side cladding layer for confining or keeping carriers and n-side light guide layer for guiding emission from the active layer. On the other hand, in the fourth and fifth semiconductor device, the p-side super lattice layer may be formed as at least one selected from the group consisting of the p-side contact layer, the p-side cladding layer for confining carriers and the p-side wave guide layer for guiding emission from the active layer.

In the third and fifth semiconductor devices of the present invention, for the n-side super lattice layer, the first nitride semiconductor layer having a higher band gap may have a larger or smaller concentration of the n-type impurity than the second nitride semiconductor layer having a lower band gap. The larger impurity concentration of the first layer than that of the second layer makes carrier generate in the first layer having a higher band gap and then the carrier injected into the second layer having a lower band gap to move the carrier through the second layer having a smaller impurity concentration and a larger mobility. Therefore, this construction makes the n-side super lattice layer decreased in electrical resistance.

In a case that the impurity concentration of the first layer is relatively larger than that of the second layer, the first layer of the super lattice layer in the first semiconductor device may decrease the n or p-impurity concentration at a part close to the second layer comparing with that at a part remote from the second layer, which prevents the carrier moving through the second layer from scattering by the impurity at the part close to the second layer, resulting in increase of mobility of the second layer and thus lowering of the resistance of the super lattice layer.

In the embodiment of the third and fifth nitride semiconductor devices, if the n-impurity concentration in the first layer having a higher band gap becomes larger, it is preferable that the n-impurity concentration in the first layer ranges between $1 \times 10^{17}/cm_3$ and $1 \times 10^{20}/cm^3$ and the n-impurity concentration in the second layer is smaller than that of the first layer and not more than $1 \times 10^{19}/cm^3$. The n-impurity concentration in the second layer having a smaller band gap is preferably not more than $1 \times 10^{18}/cm^3$, more preferably not more than $1 \times 10^{17}/cm^3$. From the aspect of increasing the mobility of the second layer, a smaller n-impurity concentration is better and an undoped layer or intentionally not doped layer is most preferable.

If the impurity concentration of the first layer is smaller than that of the second layer, it is preferable that the n-impurity concentration of the second layer is smaller at a part close to the first layer than that at a part remote from the first layer. For example, it is preferable that the n-impurity concentration in the first layer is not more than $1 \times 10^{19}/cm^3$ and the n-impurity in the second layer ranges between $1 \times 10^{17}/cm^3$ and $1 \times 10^{20}/cm^3$. The n-impurity concentration in the first layer having a smaller band gap is preferably not more than $1 \times 10^{18}/cm^3$, more preferably not more than $1 \times 10^{17}/cm^3$. The most preferable first layer is an undoped layer or intentionally not doped layer.

In order to form an n-side super lattice layer having a good crystallinity in the third and fifth semiconductor device, the first nitride semiconductor layer may be made of $Al_YGa_{1-Y}N$ (0<Y<1) capable of forming a relatively higher band gap layer having a good crystallinity and the second nitride semiconductor layer may be made of $In_XGa_{1-X}N$ (0≦X<1) capable of forming a relatively smaller band gap layer having a good crystallinity. The best second layer of the super lattice layer in the third and fifth semiconductor devices, is a GaN layer. This construction is advantageous in manufacturing the super lattice layer because the same atmosphere can be used to form the first layer ($Al_YGa_{1-Y}N$) and the second layer (GaN).

In the third and fifth nitride semiconductor devices, the first nitride semiconductor layer may be made of $Al_XGa_{1-X}N$ (0<X<1) and the second nitride semiconductor layer may be made of $Al_YGa_{1-Y}N$ (0<Y<1, X>Y). In this case, further, the first nitride semiconductor layer or said second nitride semiconductor layer is preferably not doped with a n-type impurity.

In the fourth and fifth semiconductor devices of the present invention, for the p-side super lattice layer, the third nitride semiconductor layer having a higher band gap may have a larger or smaller concentration of the p-type impurity than that of the fourth nitride semiconductor layer having a smaller band gap. The larger impurity concentration of the third layer than that of the fourth layer makes carriers generate in the third layer having a higher band gap, and the carriers injected into the fourth layer having a smaller band gap to move the injected carriers through the fourth layer having a smaller impurity concentration and a larger mobility, resulting in decreasing the super lattice resistance.

Further, in the fourth and fifth semiconductor devices of the present invention, it is preferable that a part of the third nitride semiconductor layer which is close to the fourth nitride semiconductor layer has a lower concentration of the p-type impurity than a part remote or farther from the fourth nitride semiconductor layer, which prevents the carrier moving through the fourth layer from scattering by the impurity at the part close to the fourth layer, resulting in increase of mobility of the fourth layer and thus further lowering of the resistance of the super lattice layer.

In the embodiment of the fourth and fifth nitride semiconductor devices, if the n-impurity concentration in the third layer becomes larger than that in the fourth layer, it is preferable that the n-impurity concentration in the third layer having a larger band gap ranges between $1 \times 10^{18}/cm^3$ and $1 \times 10^{21}/cm3$ and the p-impurity concentration in the fourth layer is smaller than that of the third layer and not more than $1 \times 10^{20}/cm^3$. The p-impurity concentration in the fourth layer having a smaller band gap is preferably not more than $1 \times 10^{19}/cm^3$, more preferably not more than $1 \times 10^{18}/cm^3$. From the aspect of increasing the mobility of the second layer, a smaller n-impurity concentration is better and an undoped layer or intentionally not doped layer is most preferable.

In the fourth and fifth nitride semiconductor, if the impurity concentration of the third layer is smaller than that of the fourth layer, it is preferable that the p-impurity concentration of the fourth layer is smaller at a part close to the third layer than that at a part remote from the third layer. For example, it is preferable that the p-impurity concentration in the first layer is not more than $1 \times 10^{20}/cm^3$ and the n-impurity in the second layer ranges between $1 \times 10^{18}/cm^3$ and $1 \times 10^{21}/cm^3$. The n-impurity concentration in the third layer having a smaller band gap is preferably not more than $1 \times 10^{19}/cm^3$, more preferably not more than $1 \times 10^{18}/cm^3$. The most preferable first layer is an undoped layer or intentionally not doped layer.

In order to form a super lattice layer having a good crystallinity in the fourth and fifth semiconductor device, the third nitride semiconductor layer may be made of $Al_YGa_{1-Y}N$ (0<Y<1) capable of forming a relatively higher band gap layer having a good crystallinity and the fourth nitride semiconductor layer may be made of $In_XGa_{1-X}N$ (0≦X<1). The best fourth layer of the super lattice layer in the third and fifth semiconductor devices, is a GaN layer. This construction is advantageous in manufacturing the super lattice layer because the same atmosphere can be used to form the third layer ($Al_YGa_{1-Y}N$) and the fourth layer (GaN).

In the fourth and fifth nitride semiconductor devices, the third nitride semiconductor layer may be made of $Al_XGa_{1-X}N$ (0<X<1) and the fourth nitride semiconductor layer may be made of $Al_YGa_{1-Y}N$ (0<Y<1, X>Y). In this case, further, the third nitride semiconductor layer or the fourth second nitride semiconductor layer is preferably not doped with a n-type impurity.

In the fifth nitride semiconductor, for the n-side super lattice layer, the first nitride semiconductor layer may be provided with a higher band gap energy and a larger concentration of the n-type impurity than the second nitride semiconductor layer, and for the p-side super lattice layer, the third nitride semiconductor layer may be provided with a higher band gap energy and a larger concentration of the p-type impurity than the fourth nitride semiconductor layer. In this case, it is preferable that the concentration of the n-type impurity in the first nitride semiconductor layer ranges between $1 \times 10^{17}/cm^3$ and $1 \times 10^{20}/cm^3$ and the concentration of the n-type impurity in the second nitride semiconductor layer is not more than $1 \times 10^{19}/cm^3$, and the concentration of the p-type impurity in the third nitride semiconductor layer ranges between $1 \times 10^{18}/cm^3$ and $1 \times 10^{21}/cm^3$ and the concentration of the p-type impurity in the fourth nitride semiconductor layer is not more than $1 \times 10^{20}/cm^3$.

Further, in the fifth nitride semiconductor device, for the n-side super lattice layer, the first nitride semiconductor layer may be provided with a higher band gap energy and a larger concentration of the n-type impurity than said second nitride semiconductor layer, and for the p-side super lattice layer, the third nitride semiconductor layer may be provided with a higher band gap energy and a smaller concentration of the p-type impurity than the fourth nitride semiconductor layer. In this case, it is preferable that the concentration of the n-type impurity in the first nitride semiconductor layer ranges between $1 \times 10^{17}/cm^3$ and $1 \times 10^{20}/cm^3$ and the concentration of the n-type impurity in the second nitride semiconductor layer is not more than $1 \times 10^{19}/cm^3$, and the concentration of the p-type impurity in the third nitride semiconductor layer is not more than $1 \times 10^{20}/cm^3$ and the concentration of the p-type impurity in the fourth nitride semiconductor layer ranges between $1 \times 10^{18}/cm^3$ and $1 \times 10^{21}/cm^3$.

Furthermore, in the fifth nitride semiconductor device, or the n-side super lattice layer, the first nitride semiconductor layer may be designed to have a higher band gap energy and a smaller concentration of the n-type impurity than the second nitride semiconductor layer, and for the p-side super lattice layer, the third nitride semiconductor layer may be designed to have a higher band gap energy and a larger concentration of the p-type impurity than the fourth nitride semiconductor layer. In this case, it is preferable that the concentration of the n-type impurity in the first nitride semiconductor layer is not more than $1 \times 10^{19}/cm^3$ and the concentration of the n-type impurity in the second nitride semiconductor layer ranges between $1 \times 10^{17}/cm^3$ and $1 \times 10^{20}/cm^3$, and the concentration of the p-type impurity in the third nitride semiconductor layer ranges between $1 \times 10^{18}/cm^3$ and $1 \times 10^{21}/cm^3$ and the concentration of the p-type impurity in the fourth nitride semiconductor layer is not more than $1 \times 10^{20}/cm^3$.

Further, in the fifth nitride semiconductor device, for the n-side super lattice layer, the first nitride semiconductor layer may be designed to have a higher band gap energy and a smaller concentration of the n-type impurity than the second nitride semiconductor layer, and for the p-side super lattice layer, the third nitride semiconductor layer may be designed to have a higher band gap energy and a smaller concentration of the p-type impurity than the fourth nitride semiconductor layer. In this case, it is preferable that the concentration of the n-type impurity in the first nitride semiconductor layer is not more than $1 \times 10^{19}/cm^3$ and the concentration of the n-type impurity in the second nitride semiconductor layer ranges between $1 \times 10^{17}/cm^3$ and $1 \times 10^{20}/cm^3$, and the concentration of the p-type impurity in the third nitride semiconductor layer is not more than $1 \times 10^{20}/cm^3$ and the concentration of the p-type impurity in the fourth nitride semiconductor layer ranges between $1 \times 10^{18}/cm^3 \sim 1 \times 10^{21}/cm^3$.

Furthermore, in the fifth nitride semiconductor device, for the n-side super lattice layer, the first nitride semiconductor layer may be made of $Al_YGa_{1-Y}N$ (0<Y<1) and the second nitride semiconductor layer may be made of $In_XGa_{1-X}N$ (0≦X<1), and for the p-side super lattice layer, the third nitride semiconductor layer may be made of $Al_YGa_{1-Y}N$ (0<Y<1) and the fourth nitride semiconductor layer maybe made of $In_XGa_{1-X}N$ (0≦X<1). In this case, it is preferable that the second and fourth nitride semiconductor layers are made of GaN, respectively.

Further, in the fifth nitride semiconductor device, for the n-side super lattice layer, the first nitride semiconductor layer may be made of $Al_XGa_{1-X}N$ (0<X<1) and the second nitride semiconductor layer is made of $Al_YGa_{1-Y}N$ (0<Y<1, X>Y), and for the p-side super lattice layer, the third nitride semiconductor layer may be made of $Al_XGa_{1-X}N$ (0<X<1) and the fourth nitride semiconductor layer may be made of $Al_YGa_{1-Y}N$ (0<Y<1, X>Y).

Furthermore, in the fifth nitride semiconductor device, it is preferable that the first nitride semiconductor layer or the second nitride semiconductor layer is an undoped layer to which a n-type impurity is not doped. It is also preferable that the third nitride semiconductor layer or the fourth nitride semiconductor layer is an undoped layer which is not doped with a p-type impurity.

In the third, fourth and fifth nitride semiconductor device, the active layer preferably includes a InGaN layer. The InGaN layer in the active layer is preferably in a form of a quantum well layer. The active layer may be SQW or MQW.

According to the present invention, there is provided a second nitride semiconductor LD device comprising an active layer between a p-side cladding layer and a n-side cladding layer, and at least one of the p-side and the n-side cladding layers is the n-side super lattice layer or the p-side super lattice layer respectively. The LD device can operate at a lower threshold current. In the second LD device, it is preferable that an optical wave guide layer made of a nitride semiconductor containing In or GaN which has an impurity concentration of not more than $1\times10^{19}/cm^3$, the optical wave guide layer being formed at least either between the p-side cladding layer and the active layer or between the p-side cladding layer and the active layer. In this case, the wave guide can prevent the emission generated from disappearing due to a low absorption rate of the optical wave guide, which causes a LD device capable of waving at a low gain. In this case, in order to further decrease the light absorption rate, it is more preferable that the impurity concentration of the wave guide layer is not more than $1\times10^{18}/cm^3$, especially not more than $1\times10^{17}/cm^3$. The most preferable layer is an undoped one. The optical wave guide layer may be made of the super lattice structure.

Furthermore, it is recommendable that there is provided with a cap layer made of a nitride semiconductor between the optical wave guide layer and the active layer. It is preferable that the cap layer having a higher band gap energy than the well layer in the active layer and also the optical wave guide layer and having a thickness of not more than 0.1 μm is formed between said optical wave guide layer and said active layer. It is more preferable that the cap layer contains an impurity of not less than $1\times10^{18}/cm^3$. The cap layer can make a leak current lowered because of a higher band gap. It is effective that the optical wave guide layer and cap layer are formed in the p-type region or the semiconductor region of p-conductivity side.

The third to the fifth nitride semiconductor devices of the present invention may be preferably formed on a nitride semiconductor substrate. The nitride semiconductor substrate can be prepared by a method of growing a nitride semiconductor layer on an auxiliary substrate made of a material other than nitride semiconductor, forming a protective film on the grown nitride semiconductor layer so as to expose partially the surface thereof, thereafter growing a nitride semiconductor layer to cover the protective film from the exposed nitride semiconductor layer. The nitride semiconductor substrate can make it better the crystallinity of every layers in the third to the fifth nitride semiconductor device. In this case, the auxiliary substrate and the protective film can be removed from the nitride semiconductor substrate before or after the device layers are formed on the nitride semiconductor substrate. The cap layer had better be formed in the p-type region.

In a preferred embodiment of the LD device according to the present invention, wherein p-side cladding layer is a super lattice layer, it is preferable that a ridge portion is formed on the p-side cladding layer and on the layer located over the p-side cladding layer in a manner that the longitudinal direction of the ridge portion coincides with the direction of resonance and the ridge has a predetermined width.

According to a sixth aspect of the present invention, there is provided a nitride semiconductor light emitting device comprising an active layer including a first nitride semiconductor layer containing In between a n-side cladding layer and a p-side cladding layer, characterized in that the n-side cladding layer is a super lattice layer comprising a second nitride semiconductor layer containing Al and has a total thickness of not less than 0.5 μm and an average composition of Al in said n-side cladding layer is set in a way that the product of said average Al composition in % contained in said n-side cladding layer multiplied by the thickness in μm of said n-side cladding layer is not less than 4.4. This causes the optical confinement effect by the n-side cladding layer improved, resulting in a long lifetime and a high responsibility of the LD device due to a lower wave oscillation threshold.

In an embodiment of the LD device formed on the substrate, wherein the n-side cladding layer is usually formed at a part close to the substrate in the n-type region, if the confinement effect of the light is not sufficient, the light leaked through the n-side cladding layer is reflected by the substrate, resulting in disturbing shapes of far and near field pattern such as observation of multi-spots of laser beam. However, the n-side cladding layer in the sixth nitride semiconductor device, makes the light confinement effect improved, which prevent the near and far field patterns from being disturbed, that is, which can make a single laser spot.

In a preferred embodiment of the sixth nitride semiconductor device of the present invention, the n-side cladding layer has a thickness of not less than 0.8 μm and an average Al composition of not less than 5.5%. In a more preferable embodiment, the n-side cladding layer has a thickness of not less than 1.0 μm and an average Al composition of not less than 5%. In a most preferable embodiment, the n-side cladding layer has a thickness of not less than 1.2 μm and an average Al composition of not less than 4.5%.

In the sixth nitride semiconductor device, it is preferable that the p-side cladding layer is a super lattice layer comprising a third nitride semiconductor layer containing Al and has a thickness smaller than said n-side cladding layer. More preferably, the p-side cladding layer has a thickness of less than 1.0 μm and the thickness of the n-side cladding layer and said p-side cladding layer including said active layer is set to range between 200 angstroms and 1.0 μm.

PREFERRED EMBODIMENT OF THE INVENTION

Preferred embodiments of the nitride semiconductor device according to the present invention will now be described below with reference to the accompanying drawings.

Embodiment 1

Figure 1:
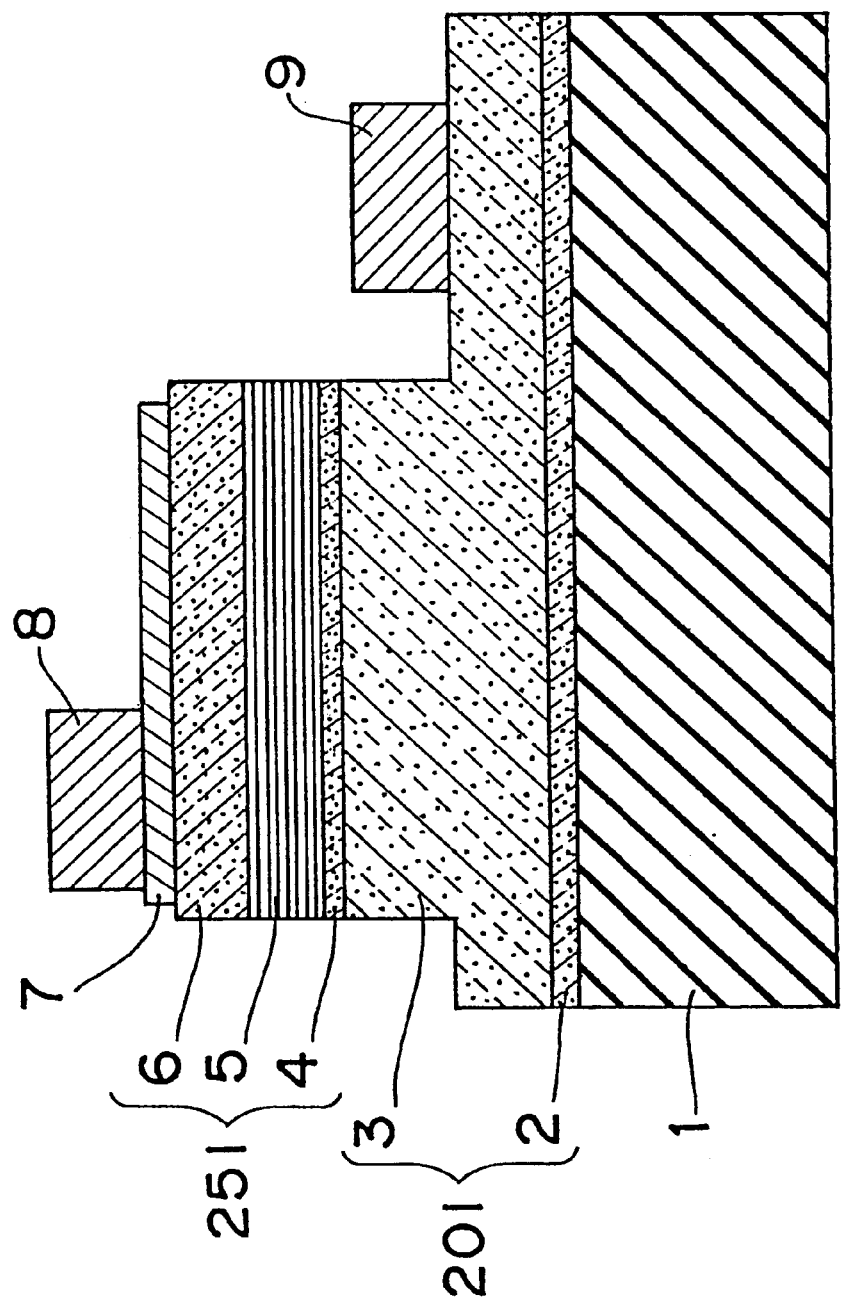
FIG. 1 is a schematic sectional view of the nitride semiconductor device (LED) structure of the first embodiment according to the present invention.

FIG. 1 is a schematic cross sectional view showing the configuration of the nitride semiconductor device according to the first embodiment of the present invention. The nitride semiconductor device is an LED device having such a basic configuration as a buffer layer 2 made of GaN, an n-side contact layer 3 made of Si-doped n-type GaN, an active layer 4 made of InGaN of single quantum well structure, a p-side cladding layer 5 made of a super lattice layer comprising a first layer and a second layer of different constitutions being laminated, and a p-type contact layer 6 made of Mg-doped GaN are laminated successively on a substrate 1 made of sapphire. In the nitride semiconductor device of the first embodiment, nearly entire surface of the p-side contact layer 6 is covered with a planar electrode 7 formed thereon which is provided with a p electrode 8 for the purpose of bonding installed on the surface thereof, while an n electrode 9 is installed on the surface of the n-side contact layer 2 which is exposed by removing a part of nitride semiconductor layer by etching. The planar electrode 7 allows light to transmit.

The nitride semiconductor device of the first embodiment has the p-type cladding layer 5 having a low resistance and comprising a super lattice layer made by laminating the first layer which is made of $Al_YGa_{1-Y}N$ ($0 \leq Y \leq 1$) doped with Mg as a p-type impurity, for example, and has a thickness of 30 angstroms, and a second layer which is made of p-type $Al_YGa_{1-Y}N$ ($0 \leq Y \leq 1$) doped with the same amount of Mg as in the first layer as the p-type impurity and has a thickness of 30 angstroms, and therefore Vf can be made lower. When the super lattice layer is formed on the player side as described above, the super lattice layer is rendered p-type conductivity by doping the first layer and/or the second layer with a p-type impurity such as Mg, Zn, Cd, Be, etc. The first layer and the second layer may be laminated either in the order of 1st, 2nd, 1st and so on, or in the order of 2nd, 1st, 2nd and so on, provided that at least two layers are laminated.

The first layer and the second layer which is made of the nitride semiconductor and constitute the super lattice layer are not limited to the layer made of $In_XGa_{1-X}N$ ($0 \leq X \leq 1$) and the layer made of $Al_YGa_{1-Y}N$ ($0 \leq Y \leq 1$), and may be other layers provided that they are made of nitride semiconductors of different constitutions. The first layer and the second layer may or may not have the same band gap energy.

For example, when the first layer is made of $In_XGa_{1-X}N$ ($0 \leq Y \leq 1$) and the second layer is made of $Al_YGa_{1-Y}N$ ($0 < Y \leq 1$), band gap energy of the second layer becomes higher than that of the first layer, although when the first layer is made of $In_XGa_{1-X}N$ ($0 \leq X \leq 1$) and the second layer is made of $In_ZAl_{1-Z}N$ ($0 < Z \leq 1$), the first layer and the second layer may be of different constitutions but have the same band gap energy. Also when the first layer is made of $Al_YGa_{1-Y}N$ ($0 \leq Y \leq 1$) and the second layer is made of $In_ZAl_{1-Z}N$ ($0 < Z \leq 1$), the first layer and the second layer may be of different constitutions but have the same band gap energy.

That is, according to the present invention, the first layer and the second layer may or may not have the same band gap energy, provided that they constitute a super lattice layer which has a function to be described later. As described above, the super lattice layer referred to herein is a layer made by laminating extremely thin layers of different constitutions, which is free from lattice defects accompanying lattice mismatch, because every layer is very thin, having broad implications including the quantum well structure. Although the super lattice layer does not have inner defects, it usually has a strain accompanying lattice mismatch, and is hence called also a stained layer super lattice. According to the present invention, the first layer and the second layer remain to be nitride semiconductors as long as they include N even when part of N (nitrogen) atoms are substituted with V group elements such as As and P.

According to the present invention, because the thickness of the first layer and the second layer which constitute the super lattice layer reaches the elastic strain limit or greater when it is greater than 100 angstroms, and microscopic cracks or crystal defects are likely to be generated in the film, and therefore the thickness is preferably set to within 100 angstroms. Lower limit of the thickness of the first layer and the second layer is not limited and may be of any value provided that it is monoatomic layer or thicker. According to the first embodiment, the first layer and the second layer are preferably 70 angstroms or thinner to obtain better quality of crystal and, more preferably, further thinner in a range from 10 angstroms to 40 angstroms. According to the present invention, although the thickness may be 10 angstroms or less (for example, monoatomic layer or diatomic layer), setting the thickness within 10 angstroms leads to lamination of too many layers in case a cladding layer having the thickness of 500 angstroms or greater is formed in super lattice structure, for example, resulting in longer forming time and increased labor in the manufacturing process. Thus the first layer and the second layer are preferably set to be thicker than 10 angstroms.

In the case of the nitride semiconductor device of the first embodiment shown in FIG. 1, the p-type cladding layer 5 made of super lattice layer is formed between the active layer 4 and the p-side contact layer 6 which is a current injection layer, and functions as a carrier trapping layer. When a super lattice layer is used as a carrier trapping layer in this way, mean band gap energy of the super lattice layer must be higher than that of the active layer. In a nitride semiconductor device, therefore, a nitride semiconductor which includes Al in such a form as AlN, AlGaN or InAlN having relatively high band gap energy is used as a carrier trapping layer. Among such layers, AlGaN has a tendency to develop cracks during crystal growing process when grown to be thick as a single layer.

In the first embodiment, therefore, a super lattice layer having less cracks with excellent quality of crystal is formed and used as a cladding layer having a high band gap energy, by making at least one of the first layer and the second layer from a nitride semiconductor which includes at least Al, preferably $Al_YGa_{1-Y}N$ ($0<Y\leq1$), and growing the first layer and the second layer alternately with the thickness within the elastic strain limit.

In this case, when a nitride semiconductor layer which does not include Al is grown as the first layer to the thickness within 100 angstroms and the second layer made of a nitride semiconductor which includes Al is grown thereon, the first layer also functions as a buffer layer when growing the second layer so that cracks are less likely to develop in the second layer, making it possible to form a super lattice layer which has less cracks with excellent quality of crystal. Thus according to the first embodiment, it is desirable that the super lattice layer be formed from the first layer (the second layer) made of $In_XGa_{1-X}N$ ($0\leq X\leq1$) and the second layer (the first layer) made of $Al_YGa_{1-Y}N$ ($0\leq Y\leq1$, $X\neq Y=0$).

Also in the nitride semiconductor device of the first embodiment, at least one of the first layer and the second layer which constitute the p-side cladding layer 5, that is the super lattice layer, is preferably doped with a p-type impurity which makes the conductivity of the layer p-type, for the purpose of adjusting the carrier concentration. In case the first layer and the second layer are doped with a p-type impurity, the first layer and the second layer may be doped in different concentrations. This is because, when the first layer and the second layer are doped in different concentrations, carrier concentration in one of the layers becomes substantially higher, thus making it possible to decrease the resistance of the super lattice layer as a whole. Thus according to the present invention, the first layer and the second layer may be doped in different concentrations, or alternatively, only one of the first layer and the second layer may be doped.

Concentrations of the impurity doped in the first layer and the second layer are preferably controlled in a range from $1\times10^{16}/cm^3$ to1 $1\times10^{22}/cm^3$, more preferably from $1\times10^{17}/cm^3$ to $1\times10^{21}/cm^3$, and most preferably from $1\times10^{18}/cm^3$ to $2\times10^2/cm^3$ in the case of p type impurity, although the present invention is not limited to this configuration. This is because, when impurity concentration is lower than $1\times10^{16}/cm^3$, it becomes difficult to obtain the effect of reducing Vf and the threshold voltage and, when impurity concentration is higher than $1\_10^{22}/cm^3$, quality of crystal of the super lattice layer deteriorate. Concentration of n type impurity is also desired to be controlled within a similar range, for the same reason.

The super lattice layer constituted as described above is formed by laminating the first layer and the second layer alternately with the thickness within the elastic strain limit, and therefore lattice defects of the crystal can be reduced and microscopic cracks can be reduced, thus improving the quality of crystal drastically. As a result, the amount of impurity doped can be increased thereby increasing the carrier concentrations in the n-type nitride semiconductor layer and in the p-type nitride semiconductor layer without substantially deteriorating the quality of crystal, thus allowing the carrier to move without being scattered by crystal defects, and therefore it is made possible to reduce the resistivity at least one order of magnitude lower than that of the p-type or n-type nitride semiconductor which does not have super lattice structure.

Thus in the nitride semiconductor device (LED device) of the first embodiment, Vf can be reduced by forming the p-type cladding layer 5, of a semiconductor region 251 of p conductivity side (the region comprising the p-type cladding layer 5 and the p-type contact layer 6 in the first embodiment) where it has been difficult to obtain a nitride semiconductor layer having a low resistance in the prior art, by using the super lattice layer, thereby reducing the resistance of the p-type cladding layer 5. That is, nitride semiconductor is a semiconductor which is difficult to obtain in the form of p-type crystal and, if ever obtained, resistivity is usually at least two orders of magnitude higher compared to n-type nitride semiconductor. Therefore, when a super lattice layer of type p is formed on p-type conductivity side, resistance of the p-type layer constituted from the super lattice layer can be reduced to an extremely low level, resulting in a remarkable decrease in Vf. As a prior art technology to obtain a p-type crystal, such a process has been known where a nitride semiconductor layer doped with a p-type impurity is annealed and hydrogen is removed thereby manufacturing a p-type nitride semiconductor (Japanese Patent No. 2540791). However, the p-type nitride semiconductor thus obtained has resistivity as high as several ohm-centimeters at the lowest. By turning this p-type layer into p-type super lattice layer, better quality of crystal can be obtained. According to the study of the present inventors, resistivity of the p-type layer can be reduced to a level at least one order of magnitude lower than that of the prior art, resulting in a conspicuous effect of decreasing Vf.

According to the first embodiment, a super lattice layer which has good quality of crystal and is free from cracks can be formed by constituting the first layer (the second layer) made from $In_XGa_{1-X}N$ ($0\leq X\leq1$) and the second layer (the first layer) made from $Al_YGa_{1-Y}N$ ($0\leq Y\leq$, $X\neq Y=0$) as described above, and therefore service life of the device can be elongated.

Now the present invention will be compared with examples of the prior art disclosed in literature known to the public, including Japanese Patent Publication filed by the present inventors in the past.

As a technology similar to the present invention, the present inventors proposed the technology disclosed in Japanese Patent Non-examined Patent Publication No. 8-228048. This technology forms a multi-layer film made of AlGaN, GaN, InGaN, etc. as a laser beam reflecting film on the outside of an n-type cladding layer and/or the outside (on the side farther from an active layer) of a p-type cladding layer which interpose the active layer. According to this technology, because the multi-layer film is formed as the light reflecting film, each layer is designed to have a thickness of $\lambda/4n$ (n is a refractive index of the nitride semiconductor and $\lambda$ is a wavelength) and becomes very thick. Thus each layer of the multi-layer film has the thickness not within the elastic strain limit. U.S. Pat. No. 5,146,465 discloses a laser device having such a constitution as an active layer is interposed between mirrors made of $Al_XGa_{1-X}N/Al_YGa_{1-Y}N$. This technology, similarly to that described above, makes AlGaN/AlGaN act as mirrors, and therefore requires each layer to be thick. Particularly it is very difficult to laminate many layers of hard semiconductor such as AlGaN without generating cracks.

According to the first embodiment, unlike the technologies described above, the first and the second layers are set to have such the thickness (preferably within 100 angstroms, namely within the critical film thickness for both layers) so as to constitute a super lattice layer. That is, the present invention utilizes the effect of strained layer super lattice of a nitride semiconductor which constitutes the super lattice layer, thereby to improve the quality of crystal and reduce Vf.

Japanese Non-examined Patent Publication Nos. 5-110138 and 5-110139 disclose a method to obtain a crystal of $Al_YGa_{1-Y}N$ by laminating thin films of AlN and GaN. This technology is to laminate AlN and GaN layers which are several tens of angstroms thick thereby to obtain a mixed crystal of $Al_YGa_{1-Y}N$ having a specified mix proportion, and is different from the technology of this invention. And because the technology does not include an active layer made of InGaN, the super lattice layer is liable to cracks developing therein. Japanese Non-examined Patent Publication Nos. 6-21511 and No. 6-268257 also disclose a light emitting device of double-hetero structure having an active layer of multiple quantum well structure made by laminating GaN and InGaN or InGaN and InGaN. This technology is also different from the present invention which proposes a technology of making a multi-layer structure other than the active layer. Japanese Non-examined Patent Publication No. 2-288371 (U.S. Pat. No. 5,005,057) discloses a structure having a super lattice layer other than the active later. However, the supper lattice disclosed in Japanese Non-examined Patent Publication No. 2-288371 consist of BP layers and GaAlN layers while the supper lattice of present invention consist of nitride semiconductor layers having different constitution each other.

Therefore, this technology is different from the present invention with regard to structure and an effect.

Further in the device of the present invention, the effect of the super lattice layer becomes conspicuous when the active layer is provided with a nitride semiconductor, which includes at least indium, such as InGaN. InGaN active layer has less band gap energy and is most suitable for the active layer of a nitride semiconductor device. Therefore, when super lattice layers comprising $In_XGa_{1-X}N$ and $Al_YGa_{1-Y}N$ are formed to interpose the active layer, difference in the band gap energy and difference in refractive index from those of the active layer can be increased, thereby making the super lattice layer capable of functioning as an excellent light trapping layer when forming a laser device (applied to the nitride semiconductor device of second embodiment). Moreover, because InGaN has quality of crystal of being softer than other nitride semiconductors which include Al such as AlGaN, use of InGaN as the active layer makes the laminated nitride semiconductor layers less liable to cracks. Conversely, use of a nitride semiconductor such as AlGaN as the active layer makes it likely that cracks develop in the entire crystal because the crystal is hard in nature.

According to the first embodiment, it is desirable that the thickness of the p-side contact layer 6 be controlled to within 500 angstroms, more preferably within 300 angstroms and most preferably within 200 angstroms. This is because resistivity can be further decreased by controlling the thickness of the p-type nitride semiconductor which has a high resistivity of several ohm-centimeters or higher within 500 angstroms, thus reducing the threshold current and voltage. It is also made possible to increase the amount of hydrogen removed from the p-type layer, thereby further reducing the resistivity.

As described above in detail, in the nitride semiconductor device (LED device) of the first embodiment, the p-type cladding layer 5 is constituted from the super lattice layer made by laminating the first layer and the second layer, and therefore resistance of the p-type cladding layer 5 can be made extremely low and the forward voltage Vf of the LED device can be reduced.

Although the first embodiment uses the super lattice layer in the p-side cladding layer 5, the present invention is not limited to this configuration and a p-type super lattice layer may also be used in the p-type contact layer 6. That is, the p-type contact layer 6 to which current (positive holes) is injected may also be made as p-type super lattice layer formed by laminating the first layer made of $In_XGa_{1-X}N$ and the second layer made of $Al_YGa_{1-Y}N$. When the p-type contact layer 6 is made as a super lattice layer and the band gap energy of the first layer is less than that of the second layer, it is preferable that the first layer made of $In_XGa_{1-X}N$ or GaN having a low band gap energy be placed on the top and put into contact with the p electrode, so that the contact resistance with the p electrode becomes lower thereby providing better ohmic contact. This is because the first layer which has lower band gap energy has a tendency to provide a nitride semiconductor layer of higher carrier concentration than in the case of the second layer. Also according to the present invention, when a p-type nitride semiconductor layer other than the p-side cladding layer and the p-side contact layer is further formed on the semiconductor region 251 of p conductivity side, the p-type nitride semiconductor layer maybe constituted from a super lattice layer.

Although the first embodiment uses the super lattice layer in the p-side cladding layer 5, the present invention is not limited to the configuration of the semiconductor region 251 of p-type conductivity, and an n-type super lattice layer may also be used in the n-type contact layer 3 of the semiconductor region 201 of n conductivity side. In such a case as the n-type contact layer 3 is used as the super lattice layer, the first layer and/or the second layer can be doped with an n-type impurity such as Si and Ge, for example, thereby forming a super lattice layer having n-type conductivity as the n-type contact layer 3 between the substrate 1 and the active layer 4. In this case, it was verified that making the n-type contact layer 3 in the form of super lattice layer having different impurity concentration, in particular, decreases the resistance in the transverse direction and tends to decrease the threshold voltage and current in a laser diode, for example.

This is supposed to be due to an effect similar to HEMT (High-Electron Mobility Transistor) as described below, in case a super lattice layer, which is made by doping a layer having higher band gap energy with greater amount of n-type impurity, is formed as n-type contact layer. In the super lattice layer made by laminating the first layer (the second layer) which is doped with an n-type impurity and has a greater band gap and the second layer (the first layer) which is undoped (state of being not doped will be called undoped hereinafter) and has less band gap, the layer having higher band gap energy is depleted in the interface between the layer doped with the n-type impurity and the undoped layer, and electrons (two dimensional electron gas) accumulate in the interface around the layer which has lower band gap energy and a thickness of about 100 angstroms. It is supposed that, because the two dimensional electron gas is generated in the layer having lower band gap energy, the electrons move without being scattered by the impurity, and therefore electron mobility in the super lattice layer increases and resistivity decreases.

Also according to the present invention, when an n-side cladding layer is installed on a semiconductor layer 201 of n conductivity side, the n-side cladding layer may be made in super lattice layer. In case an n-type nitride semiconductor layer other than the n-side contact layer and the n-side cladding layer is installed in a semiconductor region 201 of n conductivity side, the n-type nitride semiconductor layer may be made in the form of super lattice layer. However, it is a matter of course that, in case the nitride semiconductor layer comprising the super lattice layer is installed in the semiconductor region 201 of n conductivity side, it is desirable that either the n-type cladding layer acting as a carrier trapping layer or the n-type contact layer 3 to which current (electrons) is injected be made in super lattice structure.

In case a super lattice layer is formed in the semiconductor region 201 of n conductivity side placed between the active layer 4 and the substrate 1 as described above, the first layer and the second layer which constitute the super lattice layer may not be doped with impurity. This is because nitride semiconductor has a nature of becoming n-type even when undoped. It is desirable, however, to dope the first layer and the second layer with n-type impurity such as Si and Ge to make a difference in the impurity concentration as described above, even when forming on the n layer side.

When a super lattice layer is formed in the semiconductor region 201 of n conductivity side, the effect thereof will be an improvement in the quality of crystal similarly to the case of forming the super lattice layer in the semiconductor region 251 of p-type conductivity side. Specifically, in the case of a nitride semiconductor device which has hetero junction, carrier trapping layers of n-type and p-type are usually constituted from AlGaN which has a band gap energy which is higher than the active layer. Crystal of AlGaN is very difficult to grow, and cracks tend to develop in the crystal when a layer having the thickness of 0.5 $\mu$m or greater is grown with a single constitution. However, when a super lattice layer is made by laminating the first layer and the second layer each with a thickness within the elastic strain limit, as in the case of the present invention, the first layer and the second layer can be laminated with good quality of crystal and therefore a cladding layer having good quality of crystal can be grown. Thus because the nitride semiconductor is given good quality of crystal all over the semiconductor region 201 of n conductivity side, mobility can be increased throughout the semiconductor region 201 of n conductivity side and therefore Vf of a device wherein the super lattice layer is used as a cladding layer can be decreased. Further, when the super lattice layer is doped with an impurity such as Si and Ge and the super lattice layer is used as the contact layer, it is supposed that the effect similar to that of HEMT described previously appears markedly, making it possible to decrease the threshold voltage and Vf further.

Also according to the present invention, the super lattice layer may not be doped with the impurity which determines the conductivity types of the first layer and the second layer. The super lattice layer which is not doped with the impurity may be formed as any of the layers between the active layer and the substrate, in case the layer is in the semiconductor region 201 of n conductivity side, and may be formed as any of the layers between the carrier trapping layer (light trapping layer) and the active layer, provided that the layer is in the semiconductor region 251 of p conductivity side.

According to the present invention, as described above, because the super lattice layer is used either as the cladding layer acting as a carrier trapping layer formed in the semiconductor region 201 of n conductivity side or in the semiconductor region 251 of p conductivity side interposing the active layer, or as an optical waveguide layer of the active layer or as a current injection layer provided with an electrode being formed in contact therewith, it is desirable that mean band gap energy of the nitride semiconductor constituting the super lattice layer be controlled to be higher than that of the active layer.

While the region comprising the nitride semiconductor layers placed between the active layer and the p electrode is referred to as the semiconductor region on p conductivity side in this specification, this does not mean that all the nitride semiconductor layers constituting the semiconductor region have the p-type conductivity. Similarly, the region comprising nitride semiconductor layers between the active layer and a GaN substrate 100 is referred to as the semiconductor region of n-side conductivity, this does not mean that all the nitride semiconductor layers constituting the region have the p-type conductivity.

Embodiment 2

Now the second embodiment of the present invention will be described below.

Figure 2:
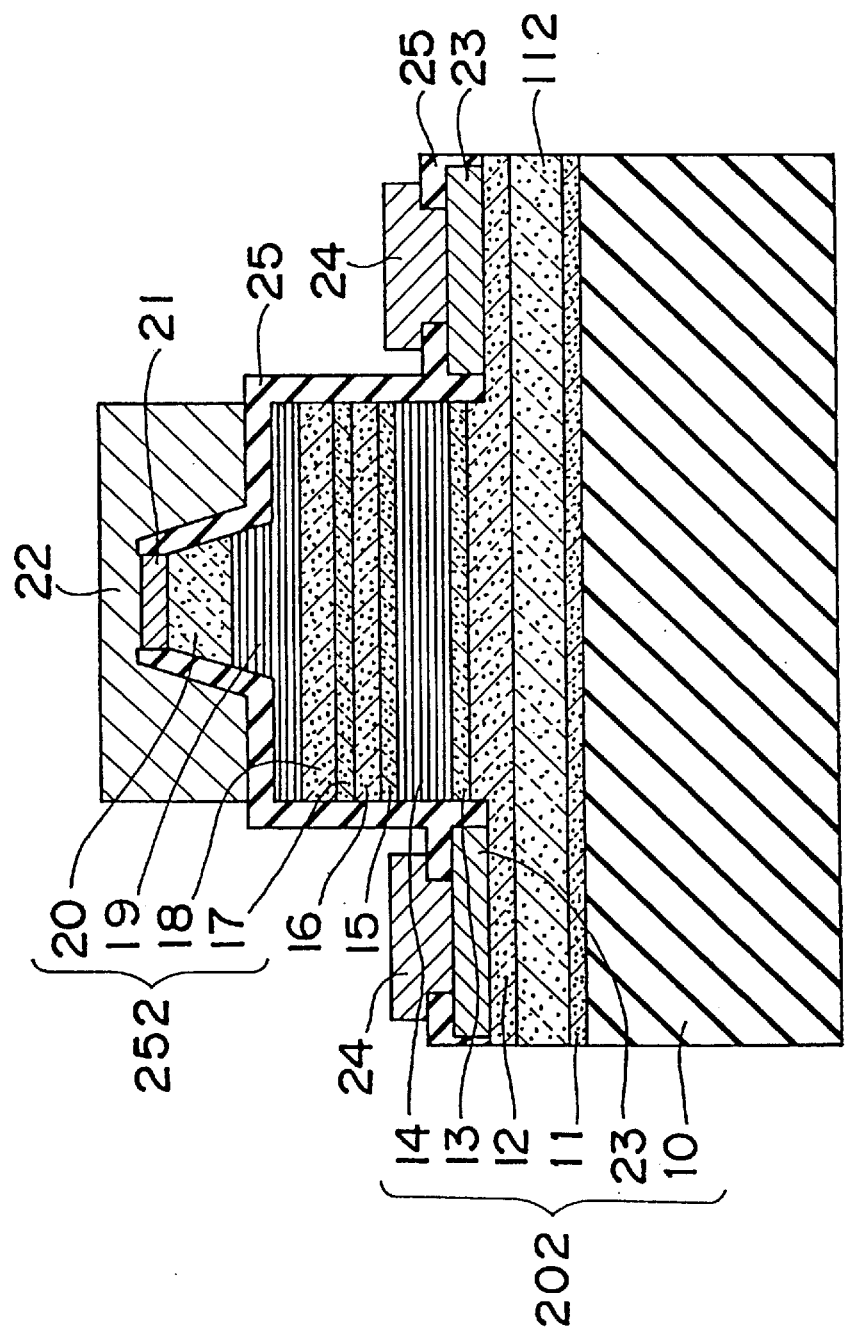
FIG. 2 is a schematic sectional view of the nitride semiconductor device (LD) structure of the second embodiment according to the present invention.

FIG. 2 is a schematic cross sectional view (cross section perpendicular to the direction of propagation of laser light) showing the configuration of a nitride semiconductor device according to the second embodiment of the present invention. The nitride semiconductor device is, for example, a nitride semiconductor laser diode device which has an active layer 16 comprising a nitride semiconductor interposed by a semiconductor region 202 of n conductivity side (consisting of an n-side contact layer 12, a crack preventing layer 13, an n-side cladding layer 14 and an n-side optical waveguide layer 15) and a semiconductor region 252 of p conductivity side (consisting of a cap layer 17, a p-side optical waveguide layer 18, a p-side cladding layer 19 and a p-side contact layer 20) provided on a C plane of a substrate 10 made of sapphire or the like.

In the nitride semiconductor device of the second embodiment, threshold voltage of the nitride semiconductor device which is a laser diode is set to a low level by forming the n-side cladding layer 14 in the semiconductor region 202 of n conductivity side in the form of super lattice layer and forming the p-side cladding layer 19 in the semiconductor region 252 of p conductivity side in the form of super lattice layer. The nitride semiconductor device according to the second embodiment of the present invention will be described in detail below by referring to FIG. 2.

In the nitride semiconductor device of the second embodiment, first the n-side contact layer 12 is formed on the substrate 10 via a buffer layer 11 and a second buffer layer 112, then the crack preventing layer 13, the n-side cladding layer 14 and the n-side optical waveguide layer 15 are laminated on the n-side contact layer 12, thereby to form the semiconductor region 202 of n conductivity side. Formed on the surfaces of the n-side contact layer 12 exposed on both sides of the crack preventing layer 13 are n-side electrodes 23 which make ohmic contact with the n-side contact layer 12, while an n-side pad electrode for the purpose of wire bonding, for example, is formed on the n-side electrode 23. Then the active layer 16 made of a nitride semiconductor is formed on the n-side optical waveguide layer 15, and the cap layer 17, the p-side optical waveguide layer 18, the p-side cladding layer 19 and the p-side contact layer 20 are formed on the active layer 16, thereby to form the semiconductor region 252 of p conductivity side. Further on the p-side contact layer 20, the p-side electrode 21 which makes ohmic contact with the p-side contact layer 20 is formed, and the p-side pad electrode for the purpose of wire bonding, for example, is formed on the p-side electrode 21. Formed on the p-side contact layer 20 and the p-side cladding layer 19 is a ridge which extends long in the direction of resonance, thereby to trap light in the active layer 16 in the transverse direction (direction perpendicular to the direction of propagation) and form a resonator which resonates in the longitudinal direction of the ridge by using a cleavage plane which is at right angles to the ridge, thus making the laser oscillate.

Components of the nitride semiconductor device of the second embodiment will now be described below.

(Substrate 10)

The substrate 10 may be made of, in addition to sapphire having principal plane in C plane, sapphire having principal plane in R plane or A plane, insulating substrate such as spinel ($MgAl_2O_4$), or other semiconductor substrate such as SiC (including 6H, 4H and 3C), ZnS, ZnO, GaAs and GaN.

(Buffer Layer 11)

The buffer layer 11 is formed by growing AlN, GaN, AlGaN, InGaN, etc., for example, at a temperature within 900° C. to a thickness of several tens to several hundreds of angstroms. While the buffer layer 11 is formed for the purpose of relaxing lattice constant mismatch between the substrate and the nitride semiconductor, it may be omitted depending on the method of growing the nitride semiconductor, type of substrate and other conditions.

(Second Buffer Layer 112)

The second buffer layer 112 is a layer made of a single crystal nitride semiconductor which is grown on the buffer layer 11 at a temperature higher than that of the buffer layer, and is formed to be thicker than the buffer layer 11. The second buffer layer 112 is made as a layer which has a concentration of n-type impurity lower than that of the n-side contact layer 12 to be grown next, or as a nitride semiconductor layer which is not doped with an n-type impurity. The second buffer layer 112 maybe constituted as $In_XAl_YGa_{1-X-Y}N$ ($0 \leq X$, $0 \leq Y$, $X+Y \leq 1$), for example, of which composition is not a matter of importance here, but the composition is preferably in the form of $Al_YGa_{1-Y}N$ which is undoped and has a proportion of Al (value of Y) within 0.1, and most preferably undoped GaN. When made in such a composition, the second buffer layer 112 having few defects can be grown and, when the second buffer layer 112 is made in the form of undoped GaN, the second buffer layer 112 having fewest defects can be formed. Also it is further preferable that the n-side contact layer 12 be formed in super lattice structure.

When the second buffer layer 112 having low impurity concentration and few defects is grown before growing the n-side contact layer 12, as described above, the n-side contact layer 12 having a high carrier concentration and few defects can be formed with a relatively larger thickness. That is, while the n-side contact layer 12 having a high carrier concentration needs to be formed by growing a nitride semiconductor of a high n-type impurity concentration, it is difficult to grow a thick nitride semiconductor layer having a high impurity concentration with few defect. Thus when the n-side contact layer 12 is formed without forming the n-side buffer layer 112, not only the n-side contact layer 12 having many defects is formed but also other nitride semiconductor such as active layer comes to be grown on the n-side contact layer having many defects, causing the layer to be formed thereon to include crystal defect extending from the layer below, making it impossible for the layer (active layer or the like) to be formed thereon to grow with few defects. Therefore, the second buffer layer 112 has important roles in growing the n-side contact layer to be formed thereon with few defects as well as in forming the semiconductor layers which constitute the nitride semiconductor device with few defect.

Thickness of the second buffer layer 112 is preferably controlled to be 0 μm or grater, more preferably 0.5 μm or grater, and most preferably in a range from 1 μm to 20 μm. When the second buffer layer 112 is thinner than 0.1 μm, substantial improvement in the quality of crystal of the n-side contact layer 12 cannot be expected. When the second buffer layer 112 is thicker than 20 μm, on the other hand, the second buffer layer 112 itself tends to include much crystal defects resulting in decreased effect of buffer layer. When the second buffer layer 112 is grown to be relatively thick to an extent that does not exceed 20 μm, there is an advantage of improved heat dissipation. That is, when a laser device is made, heat is more easily transmitted in the second buffer layer 112 and therefore life of the laser device is elongated. Moreover, leaking light from the laser light diffuses in the second buffer layer 112, thereby making it easier to obtain laser beam having near elliptical configuration. The second buffer layer 112 may be omitted when an electrically conductive substrate such as GaN, SiC, ZnO or the like is used as the substrate.

(n-side Contact Layer 12)

The n-side contact layer 12 acts as a contact layer whereon a negative electrode is formed, of which thickness is preferably controlled within a range from 0.2 μm to 4 μm. When the thickness is less than 0.2 μm, it becomes difficult to control the etching rate for exposing the layer in a subsequent process of forming the negative electrode. When the thickness is greater than 4 μm, on the other hand, quality of crystal tend to become poorer due to impurity. The n-side contact layer 12 is made of, for example, GaN doped with Si. Doping concentration of n-type impurity in the nitride semiconductor of the n-side contact layer 12 is preferably in a range from $1\times10^{17}/cm^3$ to $1\times10^{21}/cm^3$, and more preferably from $1\times10^{18}/cm^3$ to $1\times10^{19}/cm^3$. When the concentration is lower than $1\times10^{17}/cm^3$, satisfactory ohmic contact with the n electrode material cannot be obtained and therefore threshold current and voltage cannot be decreased in a laser device. When the concentration is higher than $1\times10^{21}/cm^3$, leak current in the device increases and the quality of crystal deteriorate, resulting in a shorter device life. It is desirable to set the impurity concentration in the n-side contact layer 12 higher than that of the n-cladding layer 14 thereby to increase the carrier concentration in the n-side contact layer 12, in order to reduce the ohmic contact resistance with the n electrode 23. When an electrically conductive substrate such as GaN, SiC, ZnO or the like is used as the substrate and the negative electrode is installed on the back of the substrate, the n-side contact layer 12 acts as a buffer layer, not as a contact layer.

At least one of the second buffer layer 11 and the n-side contact layer 12 may also be made in super lattice structure, in which case quality of crystal of the layer are drastically improved and the threshold current can be decreased. Preferably the n-side contact layer 12 which is thinner than the second buffer layer 11 is made in super lattice structure. When the n-side contact layer 12 is made in such a super lattice structure that the first layer and the second layer having different levels of band gap energy are laminated, contact resistance with the n electrode 23 can be decreased and the value of threshold can be decreased by exposing the layer having lower band gap energy thereby to form the n electrode 23. As materials to make the n electrode 23 for providing favorable ohmic contact with the n-type nitride semiconductor, there are metals such as Al, Ti, W, Si, Zn, Sn and In, and alloys thereof.

When the n-side contact layer 12 is made in super lattice structure of different impurity concentration, resistance in the transverse direction can be reduced due to an effect similar to that of HEMT described in conjunction with the first embodiment, thereby making it possible to reduce the threshold voltage and current of the LD device.

(Crack Preventing Layer 13)

The crack preventing layer 13 is made of, for example, $In_{0.1}Ga_{0.9}N$ doped with Si in a concentration of $5\times10^{18}/cm^3$ and has a thickness of, for example, 500 angstroms. The crack preventing layer 13, when formed by growing an n-type nitride semiconductor which includes In, preferably InGaN, is capable of preventing cracks from developing in a nitride semiconductor layer which includes Al to be formed thereon. The crack preventing layer 13 is preferably grown to a thickness in a range from 100 angstroms to 0.5 $\mu$m. When the thickness is less than 100 angstroms, the layer is difficult to function as a crack preventing layer. When the thickness is greater than 0.5 $\mu$m, the crystal tends to be blackened. The crack preventing layer 13 may be omitted in case the n-side contact layer 12 is made in super lattice structure as in the case of the first embodiment, or when the n-side cladding layer 14 to be grown next is made in super lattice structure.

(n-side Cladding Layer 14 Made in n-type Super Lattice Structure)

The n-side cladding layer is made of n-type $Al_{0.2}Ga_{0.8}N$ doped with Si in a concentration of $5\times10^{18}/cm^3$ in super lattice structure made by laminating the first layer 20 angstroms thick and the second layer made of undoped GaN 20 angstroms thick alternately, and has an overall thickness of, for example, 0.5 $\mu$m. The n-side cladding layer 14 functions as a carrier trapping layer and light trapping layer and, when it is made in super lattice structure, one of the layers is preferably made by growing a nitride semiconductor which includes Al, preferably AlGaN. When the layer is grown to a thickness not less than 100 angstroms and within 2 $\mu$m, more preferably in a range from 500 angstroms to 1 $\mu$m, a good carrier trapping layer can be formed. While the n-side cladding layer 14 may be made by growing a single nitride semiconductor, it may also be made in a super lattice layer which enables it to form a carrier trapping layer of good quality of crystal without cracks.

(n-side Optical Waveguide Layer 15)

The n-side optical waveguide layer 15 is made of, for example, n-type GaN doped with Si in a concentration of $5\times10^{18}/cm^3$ and has a thickness of 0.1 $\mu$m. The n-side optical waveguide layer 15 functions as an optical waveguide layer for the active layer and is preferably formed by growing GaN or InGaN to a thickness usually in a range from 100 angstroms to 5 $\mu$m, more preferably in a range from 200 angstroms to 1 $\mu$m. The optical waveguide layer 15 may also be made in super lattice structure. In case the n-side optical waveguide layer 15 and the n-side cladding layer 14 are made in super lattice structure, mean band gap energy of the nitride semiconductor layers which constitute the super lattice layer is set to be higher than that of the active layer. When forming a super lattice layer, at least one of the first layer and the second layer may or may not be doped with an n-type impurity. The n-side optical waveguide layer 15 may also be either a single layer of undoped nitride semiconductor or a super lattice layer made by laminating undoped nitride semiconductors.

(Active Layer 16)

The active layer 16 is made by alternately laminating a quantum well layer which is made of, for example, $In_{0.2}Ga_{0.8}N$ doped with Si in a concentration of $8\times10^{18}/cm^3$ and has a thickness of 25 angstroms and a barrier layer made of $In_{0.05}Ga_{0.95}N$ doped with Si in a concentration of $8\times10^{18}/cm^3$ and has a thickness of 50 angstroms, thereby forming a layer of multiple quantum well structure (MQW) having a specified thickness. In the active layer 16, either both or one of the quantum well layer and the barrier layer may be doped with the impurity. When doped with an n-type impurity, threshold value tends to decrease. When the active layer 16 is made in multiple quantum well structure as described above, it is always formed by laminating the quantum well layer having a lower band gap energy and a barrier layer having a band gap energy lower than that of the quantum well layer, and is therefore distinguished from super lattice layer. Thickness of the quantum well layer is within 100 angstroms, preferably within 70 angstroms and most preferably 50 angstroms. Thickness of the barrier layer is within 150 angstroms, preferably within 100 angstroms and most preferably 70 angstroms. For example, the quantum well structure active layer disclosed by Japanese Non-examined Patent Publication No. 9-148678 (U.S. patent application Ser. No. 08/743,72).

(p-side Cap Layer 17)

The p-side cap layer 17 has band gap energy higher than that of the active layer 16, and is made of, for example, p-type $Al_{0.3}Ga_{0.7}N$ doped with Mg in a concentration of $1\times10^{20}$ $cm^3$ and has a thickness of, for example, 200 angstroms. While the cap layer 17 is preferably used in this way according to the second embodiment, the cap layer is formed with a small thickness and therefore may be of i-type wherein carriers are compensated by doping n-type impurity. Thickness of the p-side cap layer 17 is controlled within 0.1 $\mu$m, more preferably within 500 angstroms, and most preferably within 300 angstroms. When grown to a thickness greater than 0.1 $\mu$m, cracks tend to develop in the p-side cap layer 17 making it difficult to grow a nitride semiconductor layer of good quality of crystal. When the thickness of the p-side cap layer 17 is greater than 0.1 $\mu$m, the carrier cannot pass through the p-side cap layer 17, which acts as an energy barrier, through tunnel effect. When the penetration of carrier by tunnel effect is taken into consideration, the thickness is preferably set to within 500 angstroms and more preferably within 300 angstroms.

The p-side cap layer 17 is preferably formed by using AlGaN having a high proportion of Al in order to make the LD device easier to oscillate, and the LD device becomes easier to oscillate when the AlGaN layer is made thinner. For example, in the case of $Al_YGa_{1-Y}N$ with the value of Y being 0.2 or greater, the thickness is preferably controlled within 500 angstroms. While the lower limit of the p-side cap layer 17 is not specified, it is preferably formed to a thickness not less than 10 angstroms.

(p-side Optical Waveguide Layer 18)

The p-side optical waveguide layer 18 has band gap energy higher than that of the p-side cap layer 17 and is made of, for example, p-type GaN doped with Mg in a concentration of $1\times10^{20}/cm^3$ and has a thickness of 0.1 $\mu$m. The p-side optical waveguide layer 18 functions as an optical waveguide layer for the active layer 16, and is preferably formed by growing GaN, InGaN similarly to the n-side optical waveguide layer 15. This layer functions also as a buffer layer when growing the p-side cladding layer 19, and functions as a favorable optical waveguide layer when grown to a thickness in a range from 100 angstroms to 5 $\mu$m, and more preferably in a range from 200 angstroms to 1 $\mu$m. While the p-side optical waveguide layer is usually rendered p-type conductivity by doping a p-type impurity such as Mg, alternatively it may not be doped with any impurity. And the p-side optical waveguide layer may also be made in super lattice structure. When made in super lattice structure, at least one of the first layer and the second layer may be doped with a p-type impurity, or may not be doped at all.

(p-side Cladding Layer 19 Super Lattice Layer)

The p-side cladding layer 19 is made of p-type $Al_{0.2}Ga_{0.8}N$ doped with Mg in a concentration of $1\times10^{20}/$ cm³ in super lattice structure made by alternately laminating the first layer 20 angstroms thick and the second layer which is made of p-type GaN and is doped with Mg in a concentration of $1 \times 10^{20}$/cm³ having a thickness of 20 angstroms. The p-side cladding layer 19 functions as a carrier trapping layer similarly to the n-side cladding layer 14 and particularly functions as a layer for decreasing the resistivity of the p-type layer. While limits of thickness of the p-side cladding layer 19 are not specified, too, it is preferably formed to a thickness not less than 100 angstroms and not greater than 2 _m, more preferably not less than 500 angstroms and not greater than 1 μm.

(p-side Contact Layer 20)

The p-side contact layer 20 is made of, for example, p-type GaN doped with Mg in a concentration of $2 \times 10^{20}$/cm³ and has a thickness of, for example, 150 angstroms. The p-side contact layer 20 can be made in a constitution of $In_X Al_Y Ga_{1-X-Y}N$ ($0 \leq X$, $0 \leq Y$, $X+Y \leq 1$) of p-type, and the most preferable ohmic contact with the p electrode 21 can be obtained by using GaN doped with Mg as described above. Thickness of the p-type contact layer is preferably controlled to within 500 angstroms, more preferably within 300 angstroms and most preferably within 200 angstroms. This is because resistivity can be further decreased by controlling the thickness of the p-type nitride semiconductor which has a high resistivity of several ohm-centimeters or higher within 500 angstroms, thus reducing the threshold current and voltage. It is also made possible to increase the amount of hydrogen removed from the p-type layer, thereby further reducing the resistivity.

According to the present invention, the p-side contact layer 20 may also be made in super lattice structure. When making a super lattice layer, the first layer and the second layer having different values of band gap energy are laminated in a succession of 1st, 2nd, 1st, 2nd and so on, so that the layer having lower band gap energy is exposed at the last, in which case preferable ohmic contact with the p electrode 21 can be obtained. The p electrode 21 may be made of, for example, Ni, Pd, Ni/Au, etc.

According to the second embodiment, an insulating film 25 made of $SiO_2$ is formed on the surface of nitride semiconductor layer exposed between the p electrode 21 and an n electrode 23 as shown in FIG. 2, while the p pad electrode 22 which is electrically connected to the p electrode 21 via an aperture formed in the insulating film 25 and an n pad electrode 24 connected to the n electrode 23 are formed. The p pad electrode 22 increases the substantial surface of the p pad electrode 22 so that the side of p electrode can be wire-bonded and die-bonded, and the n pad electrode 24 prevents the n electrode 23 from peeling off.

The nitride semiconductor device of the second embodiment has the p-type cladding layer 19 of good quality of crystal which is a super lattice layer made by laminating the first layer and the second layer with a film thickness within the elastic strain limit. With this configuration of the nitride semiconductor device according to the second embodiment, resistance of the p-side cladding layer 19 can be decreased to a level at least one order of magnitude lower than that of a p-type cladding layer which does not have super lattice structure, and therefore threshold voltage and current can be reduced.

Also in the nitride semiconductor device of the second embodiment, a nitride semiconductor having a low band gap energy is formed as the p-side contact layer 20 having a small thickness of 500 angstroms or less in contact with the p-side cladding layer 19 which includes p-type $Al_Y Ga_{1-Y}N$, so that the carrier concentration of the p-side contact layer 20 is substantially increased and favorable ohmic contact with the p electrode can be obtained, thereby making it possible to decrease the threshold current and voltage of the device. Further, because the second buffer layer 112 is installed before growing the n contact layer, the nitride semiconductor layer to be grown on the second buffer layer 112 can be rendered good quality of crystal and a long-life device can be made. When the n-side contact layer which is grown on the second buffer layer 112 is made in super lattice structure, resistance in the transverse direction is reduced thereby making it possible to make a device having low threshold voltage and threshold current.

In case a nitride semiconductor which includes at least indium, such as InGaN, is provided in the active layer 16 in the LD device of the second embodiment 2, it is preferable that a super lattice layer made by alternately laminating $In_X Ga_{1-X}N$ and $Al_Y Ga_{1-Y}N$ is used as layers which interpose the active layer 16 (the n-side cladding layer 14 and the p-side cladding layer 19). When configured in this way, differences in the band gap energy and refractive index between the active layer 16 and the super lattice layer can be increased, so that the super lattice layer can act as an excellent light trapping layer when a laser device is manufactured. Moreover, because InGaN has softer crystal characteristic than other nitride semiconductors which include Al such as AlGaN, cracks are less likely to develop throughout the laminated nitride semiconductor layers when InGaN is used in the active layer. Thus the service life of the LD device can be elongated.

In the case of a semiconductor device of double-hetero structure having the active layer 16 of quantum well structure as in the second embodiment, it is preferable that the p-side cap layer 17 made of a nitride semiconductor which has band gap energy higher than that of the active layer 16 and a thickness within 0.1 μm, preferably the p-side cap layer 17 made of a nitride semiconductor which includes Al is installed in contact with the active layer 16, the p-side optical waveguide layer 18 having a band gap energy lower than that of the p-side cap layer 17 is installed at a position farther than the p-side cap layer 17 from the active layer, and a nitride semiconductor having a band gap energy higher than that of the p-side optical waveguide layer 18, preferably the p-side cladding layer 19 having super lattice structure which includes a nitride semiconductor including Al, is installed at a position farther than the p-side optical waveguide layer 18 from the active layer. Because the p-side cap layer 17 is made with a high band gap energy, electrons injected from the n layer are blocked by the p-side cap layer 17 and trapped, so that the electrons do not overflow the active layer, thus resulting in less leakage current in the device.

While configurations of the nitride semiconductor device according to the second embodiment which are preferable as the configuration of laser device are described above, the present invention is not limited to any particular device configuration and is applicable as long as at least one n-type super lattice layer is provided in the semiconductor region 202 on n conductivity side below the active layer 16, and at least one p-type super lattice layer is provided in the semiconductor region 252 on p conductivity side above the active layer 16. However, it is most preferable for the purpose of reducing the values of Vf and threshold of the device, that the p-type sup per lattice layer is formed in the p-side cladding layer 19, which acts as a carrier trapping layer, when provided in the semiconductor region 252 on p conductivity side, and is formed in the n contact layer 12, which acts as a current injection layer which the n electrode 23 is in contact with, or the n cladding layer 14, which acts as a carrier trapping layer, when provided in the semiconductor region 202 on n conductivity side. It is a matter of course that the configuration similar to that of the device of the second embodiment can be applied to an LED device (except for that a ridge is not necessary for the LED device).

In the nitride semiconductor device of the second embodiment configured as described above, it is preferable that the device be annealed in an atmosphere which does not include H, for example nitrogen atmosphere, at a temperature not lower than 400° C., for example 700° C., after the layers have been formed. This process decreases the resistance of each layer of the p-type nitride semiconductor region further, thereby decreasing the threshold voltage further.

Also in the nitride semiconductor device of the second embodiment, the p electrode 21 made of Ni and Au is formed in the form of stripe on the surface of the p-side contact layer 12, while the n-side contact layer is exposed symmetrically with respect to the p electrode 21 and the n electrode 23 is installed to cover nearly the entire surface of the n-side contact layer. When an insulating substrate is used, such a configuration of providing the n electrode 23 symmetrically on both sides of the p electrode 21 is very advantageous in decreasing the threshold voltage.

According to the second embodiment, a multi-layer dielectric film made of $SiO_2$ and $TiO_2$ may be formed on the cleavage plane (plane of resonator) which is perpendicular to the ridge (stripe-shaped electrode).

According to the present invention, because the super lattice layer is used either as the cladding layer which acts as the carrier trapping layer formed in the n-type region or p-type region interposing the active layer, or as an optical waveguide layer of the active layer or as a current injection layer provided with an electrode being formed in contact therewith, it is preferable to control the mean band gap energy of the nitride semiconductor which constitutes the super lattice layer to be higher than that of the active layer.

Embodiment 3

Figure 3:
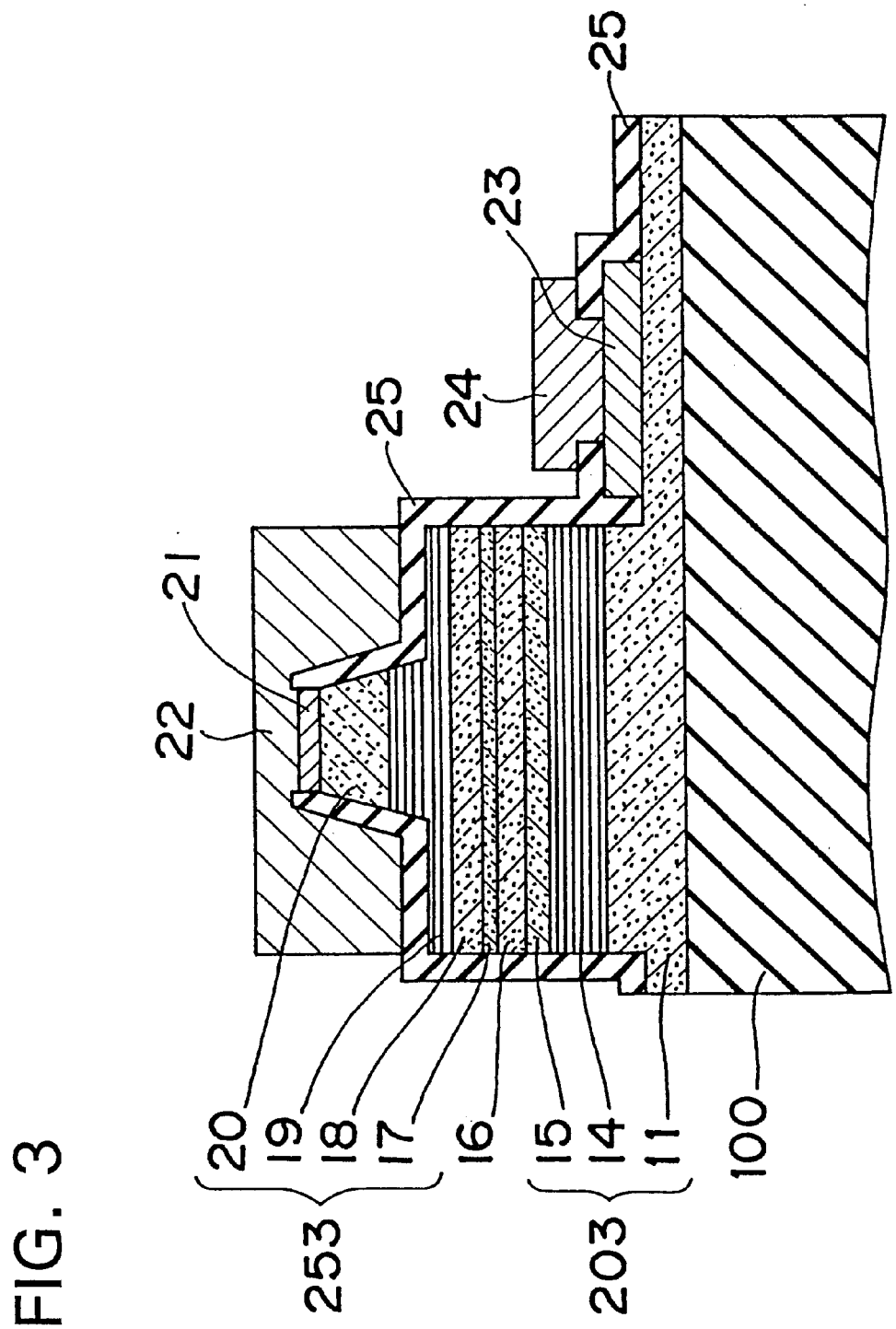
FIG. 3 is a schematic sectional view of the nitride semiconductor device (LD) structure of the third embodiment according to the present invention.

FIG. 3 is a schematic cross sectional view showing the configuration of the nitride semiconductor device according to the third embodiment of the present invention. The nitride semiconductor device of the third embodiment is a laser diode of stripe electrode type using the end face of the active layer as a resonance plane, and FIG. 3 schematically shows the cross section of the device when cut in a direction perpendicular to the direction of propagation of laser light. The third embodiment of the present invention will be described below by referring to FIG. 3.

In FIG. 3, reference numerals refer to the following components.

Figure 8:
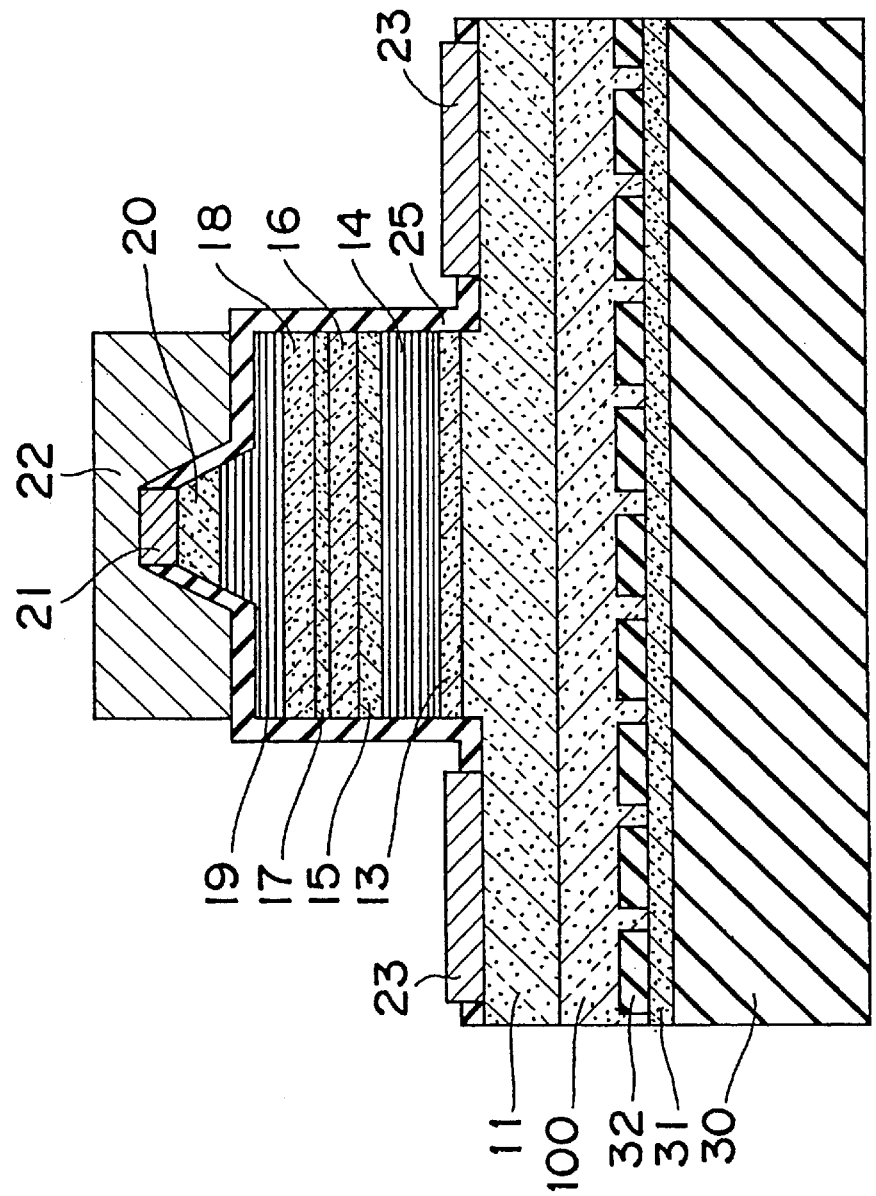
FIG. 8 is a schematic sectional view of the LD in Example 33 of the present invention.

100 denotes a GaN substrate of a thickness not less than 10 $\mu$m which is grown on an auxiliary substrate made of a material other than nitride semiconductor, for example a substrate made of such material as sapphire, spinel, SiC, Si, GaAs and ZnO. The auxiliary substrate may be removed after the GaN substrate 100 is formed as shown in FIG. 3, or may be left to remain thereon and used without removing as in the case of an embodiment to be described later (FIG. 8).

11 denotes a buffer layer made of Si-doped n-type GaN, which also functions as an n-side contact layer in the third embodiment.

14 denotes an n-side cladding layer of super lattice structure made by laminating Si-doped n-type $Al_{0.2}Ga_{0.8}N$ (first nitride semiconductor layer) 40 angstroms thick and undoped GaN layer (second nitride semiconductor layer) 40 angstroms thick, alternately in 100 layers. In the third embodiment, the n-side cladding layer 14 is formed at a position located apart from the active layer.

15 denotes an n-side guide layer made of, for example, undoped GaN which is placed between the n-side cladding layer 14 and the active layer 16 and has a band gap energy lower than that of $Al_{0.2}Ga_{0.8}N$ of the n-side cladding layer 14.

A semiconductor region 203 of n conductivity side is constituted from the n-side buffer layer 11, the n-side cladding layer 14 and the n-side optical waveguide layer 15.

16 denotes an active layer of multi-quantum well structure made by laminating three quantum well layers made of $Al_{0.2}Ga_{0.8}N$ with a thickness of 30 angstroms and two barrier layers made of $In_{0.05}Ga_{0.95}N$ having a band gap energy higher than that of the quantum well layers and thickness of 30 angstroms, alternately, in five layers in all.

17 denotes a p-side cap layer made of, for example, Mg-doped p-type $Al_{0.3}Ga_{0.7}N$ which has a band gap energy higher than the band gap energy of the quantum well layers of the active layer 16 and higher than the band gap energy of the p-side optical waveguide layer 18. The band gap energy of the p-side cap layer 17 is preferably set to be higher than that of the nitride semiconductor layer (fourth nitride semiconductor layer) which has less band gap energy among the p-side cladding layer 19 of the super lattice structure.

18 denotes the p-side guide layer made of, for example, undoped GaN which is placed between the p-side cladding layer 19 and the active layer 16 and has a band gap energy lower than that of $Al_{0.2}Ga_{0.8}N$ of the p-side cladding layer 19.

19 denotes a p-side cladding layer of super lattice structure made by laminating Mg-doped p-type $Al_{0.2}Ga_{0.8}N$ which is 40 angstroms thick and undoped GaN layer 40 angstroms thick, alternately in 100 layers, located apart from the active layer.

20 denotes a p-side contact layer made of, for example, Mg-doped GaN which has a band gap energy lower than that of the $Al_{0.2}Ga_{0.8}N$ of the p-side cladding layer 19.

A semiconductor region 253 of p conductivity side is constituted from the p-side cap layer 17, the p-side optical waveguide layer 18, the p-side cladding layer 19 and the p-side contact layer 20.

As described above, the laser device of the third embodiment of the present invention has such a structure as the nitride semiconductor layers 11 and 14 through 20 are laminated on the GaN substrate 100, wherein stripe ridge is formed on the nitride semiconductor layer located over the p-side cladding layer 19 and the p electrode 21 is formed on substantially the entire surface of the p-side contact layer 20 located on the outermost surface of the ridge. On the surface (top surface) of the exposed n-side buffer layer 11, on the other hand, is formed the n electrode 23. In the third embodiment, the n electrode 23 is formed on the surface of the n-side buffer layer 11, but because the GaN substrate 100 is used as the substrate, such a configuration may also be employed as the portion where the n electrode is to be formed is etched down to the GaN substrate 100 thereby to expose the surface of the GaN substrate 100, then the n electrode is formed on the exposed GaN substrate 100 so that the p electrode and the n electrode are provided on the same side. An insulating film 25 made of, for example, $SiO_2$ is formed on the exposed surface of the nitride semiconductor except for the top of the n electrode 23 and the p electrode 21, while the n pad electrode 22 and the n pad electrode 24 are provided for the purpose of bonding for the connection with the p electrode 21 and the n electrode 23 via the apertures in the insulating film 25 above the n electrode 23 and the p electrode 21. While the region comprising the nitride semiconductor layers placed between the active layer and the p electrode is referred to as the semiconductor region of p conductivity side, this does not mean that all the nitride semiconductor layers constituting the semiconductor region have p-type conductivity. Similarly, the region comprising the nitride semiconductor layers placed between the active layer and a GaN substrate 100 is referred to as the semiconductor region of n-side conductivity, this does not mean that all the nitride semiconductor layers constituting the region have n-type conductivity, as described previously.

The laser device according to the third embodiment of the present invention has the n-side cladding layer 14 of super lattice structure made by laminating the first nitride semiconductor layer having a high band gap energy and the second nitride semiconductor layer having a band gap energy lower than that of the first nitride semiconductor layer, the two layers having different impurity concentrations, provided at positions apart from the active layer 16 in the n-side nitride semiconductor layer located below the active layer 16 shown in FIG. 3. Thickness of the first nitride semiconductor layer and the second nitride semiconductor layer which constitute the super lattice layer is preferably controlled to be within 100 angstroms, more preferably within 70 angstroms and most preferably within a range from 10 to 40 angstroms. When the thickness is greater than 100 angstroms, the first nitride semiconductor layer and the second nitride semiconductor layer become thicker than the elastic strain limit and microscopic cracks or crystal defect tend to develop in the film. While the lower limit of the thickness of the first nitride semiconductor layer and the second nitride semiconductor layer is not specified according to the present invention and may be of any value as long as it is monoatomic layer or thicker, it is preferably 10 angstroms or greater. Further, the first nitride semiconductor layer is preferably made by growing a nitride semiconductor which includes at least Al, preferably $Al_xGa_{1-x}N$ ($0<X\leq1$). While the second nitride semiconductor layer may be anything as long as it is a nitride semiconductor having a band gap energy lower than that of the first nitride semiconductor layer, it is preferably made of a nitride semiconductor of binary mixed crystal or ternary mixed crystal such as $Al_YGa_{1-Y}N$ ($0\leq Y<1$, $X>Y$) and $In_ZGa_{1-Z}N$ ($0\leq Z<1$) which can be grown easily and provide good quality of crystal. According to the present invention, it is more preferable that the first nitride semiconductor be $Al_xGa_{1-x}N$ ($0<X<1$) which does not include In and the second nitride semiconductor be $In_ZGa_{1-Z}N$ ($0\leq Z<1$) which does not include Al, and most preferably the first nitride semiconductor is $Al_xGa_{1-x}N$ ($0<X\leq0.3$) with the mixing proportion of Al (value of Y) being 0.3 or less and the second nitride semiconductor is GaN, for the purpose of obtaining super lattice of excellent quality of crystal.

When the first nitride semiconductor is made by using $Al_xGa_{1-x}N$ ($0<X<1$) and the second nitride semiconductor is made by using GaN, a remarkable advantage in terms of manufacture as described below can be obtained. That is, when forming the $Al_xGa_{1-x}N$ ($0<X<1$) layer and the GaN layer by metal organic vapor phase deposition process (MOVPE: metal organic vapor phase epitaxy), every layer can be grown in the same $H_2$ atmosphere. Therefore, a super lattice layer can be formed by growing the $Al_xGa_{1-x}N$ ($0<X<1$) layer and the GaN layer alternately without changing the atmosphere. This provides a remarkable advantage when manufacturing the super lattice layer which requires several tens to several hundreds of layers to be laminated.

The cladding layer which has the functions of light trapping layer and carrier trapping layer must have a band gap energy higher than that of quantum well structure of the active layer. Although a nitride semiconductor of high mixing proportion of Al can be used to make a nitride semiconductor layer of a relatively high band gap energy, it has been very difficult to grow a crystal of nitride semiconductor of high mixing proportion of Al, because of cracks which are likely to develop in a thick film. When formed in a super lattice layer as in the case of the present invention, however, cracks are made less likely to occur because the crystal is grown to a thickness within the elastic strain limit, even when the AlGaN layer formed as the first nitride semiconductor layer constituting the super lattice layer is made with a somewhat high mixing proportion of Al. With this configuration, in the present invention, a layer having a high mixing proportion of Al can be grown with good quality of crystal, and therefore it is made possible to form a cladding layer having good effects of light trapping and carrier trapping, thereby reducing the threshold voltage in the laser device. The present invention can also be applied to LED devices, in which case it is made possible to decrease Vf (forward voltage) in the LED device.

Further in the laser device according to the third embodiment of the present invention, n-type impurity concentration is set to be different between the first nitride semiconductor layer and the second nitride semiconductor layer of the n-side cladding layer 14. This configuration is the so-called modulation doping. When one layer is made with lower n-type impurity concentration or is preferably undoped with the impurity and the other layer is doped in a higher concentration, this modulation doping is also capable of decreasing the threshold voltage and Vf. This is because the presence of a layer having a low impurity concentration in the super lattice layer increases the mobility in the layer, and coexistence of a layer having a high concentration of impurity makes it possible to form a super lattice layer even when the carrier concentration is high. That is, it is supposed that the coexistence of a layer of low impurity concentration and high mobility and a layer of high impurity concentration and high carrier concentration allows a layer having a high impurity concentration and high mobility to be a cladding layer, thus decreasing the threshold voltage and vf.

When a nitride semiconductor layer having a high band gap energy is doped with an impurity in a high concentration, the modulation doping effect is supposed to generate two dimensional electron gas between a high impurity concentration layer and a low impurity concentration layer, so that the resistivity decreases due to the effect of the two dimensional electron gas. In a super lattice layer made by laminating a nitride semiconductor layer which is doped with an n-type impurity and has a high band gap energy and an undoped nitride semiconductor layer with a low band gap energy, for example, the barrier layer side is depleted in the hetero-junction interface between the layer which is doped with the n impurity and the undoped layer, while electrons (two dimensional electron gas) accumulate in the vicinity of the interface on the side of the layer having lower band gap. Since the two dimensional electron gas is formed on the lower band gap side and therefore the electron movement is not subject to disturbance by the impurity, electron mobility in the super lattice increases and the resistivity decreases. It is also supposed that the modulation doping on p side is caused by the effect of the two dimensional positive hole gas. In the case of p layer, AlGaN has higher resistivity than GaN has. Thus it is supposed that, because the resistivity is decreased by doping AlGaN with p type impurity in a higher concentration, a substantial decrease is caused in the resistivity of the super lattice layer, thereby making it possible to decrease the threshold value when the laser device is made.

When a nitride semiconductor layer having a low band gap energy is doped with an impurity in a high concentration, such an effect as described below is expected to be produced. When the AlGaN layer and the GaN layer are doped with the same amounts of Mg, for example, acceptor level of Mg becomes deeper and the activation ratio becomes lower in the AlGaN layer. In the GaN layer, on the other hand, acceptor level of Mg becomes less deep and the Mg activation ratio becomes higher than in the AlGaN layer. When doped with Mg in a concentration of $1\times10^{20}/cm^3$, for example, carrier concentration of about $1\times10^{18}/cm^3$ is obtained in GaN, while the concentration obtained in AlGaN is only about $1\times10^{17}/cm^3$. Hence in the present invention, a super lattice layer is made from AlGaN and GaN and the GaN layer from which higher carrier concentration can be expected is doped with greater amount of impurity, thereby forming super lattice of a high carrier concentration. Moreover, because tunnel effect causes the carrier to move through the AlGaN layer of a lower impurity concentration due to the super lattice structure, the carrier can move in the AlGaN layer under almost no influence of the impurity, while the AlGaN layer functions also as a cladding layer having a high band gap energy. Therefore, even when the nitride semiconductor layer of lower band gap energy is doped with a greater amount of impurity, very good effect can be obtained in decreasing the threshold voltage of the laser device or LED device. The above description deals with a case of forming the super lattice layer on p-type layer side, although similar effect can be obtained also when a super lattice layer is formed on the n layer side.

When the first nitride semiconductor layer having a higher band gap energy is doped with an n-type impurity in a high concentration, the amount of doping in the first nitride semiconductor layer is preferably controlled within a range from $1\times10^{17}/cm^3$ to $1\times10^{20}/cm^3$, or more preferably within a range from $1\times10^{18}/cm^3$ to $5\times10^{19}/cm^2$. When the impurity concentration is lower than $1\times10^{17}/cm^3$, the difference from the concentration in the second nitride semiconductor layer becomes too small to obtain a layer of high carrier concentration. When the impurity concentration is higher than $1\times10^{20}/cm^3$, on the other hand, leak current in the device itself tends to increase. Meanwhile the n-type impurity concentration in the second nitride semiconductor layer may be at any level as long as it is lower than that of the first nitride semiconductor layer, but it is preferably lower than one tenth of the latter. Most preferably the second nitride semiconductor layer is undoped, in which case a layer of the highest mobility can be obtained. However, because each of the component layers of a super lattice layer is thin, some of the n-type impurity diffuses from the first nitride semiconductor into the second semiconductor layer. Though even in this case, effects of the present invention can be obtained when the n-type impurity concentration in the second nitride semiconductor layer is within $1\times10^{19}/cm^3$. The n-type impurity is selected from among the elements of $IV_B$ group and $VI_B$ group of the periodic table such as Si, Ge, Se, S and O, and preferably selected from among Si, Ge and S. The effect is the same also in case the first nitride semiconductor layer having a higher band gap energy is doped with less amount of n-type impurity and the second nitride semiconductor layer having a lower band gap energy is doped with greater amount of N-type impurity.

The laser device according to the third embodiment of the present invention has the p-side cladding layer 19 of super lattice structure made by laminating a third nitride semiconductor layer having a high band gap energy and a fourth nitride semiconductor layer having a band gap energy lower than that of the third nitride semiconductor layer, the two layers having different impurity concentrations, provided at positions apart from the active layer 16 in the p-side nitride semiconductor layer located above the active layer 16 shown in FIG. 3. Thickness of the third nitride semiconductor layer and the fourth nitride semiconductor layer which constitute the super lattice layer are preferably controlled to be within 100 angstroms, more preferably within 70 angstroms and most preferably within a range from 10 to 40 angstroms, as in the case of the n-side cladding layer 14. Similarly, the third nitride semiconductor layer is preferably made by growing a nitride semiconductor which includes at least Al, preferably $Al_XGa_{1-X}N$ ($0<X\leq1$). The fourth nitride semiconductor is preferably made of a nitride semiconductor of binary mixed crystal or ternary mixed crystal such as $Al_YGa_{1-Y}N$ ($0\leq Y<1$, $X>Y$) or $In_ZGa_{1-Z}N$ ($0\leq Z\leq1$)

When the p-type cladding layer 19 is made in super lattice structure, the super lattice structure has the same effect on the laser device as that of the n cladding layer 14, and also has such an effect as follows in addition to the case of forming on the n layer side. That is, the p-type nitride semiconductor has resistivity which is usually at least two orders of magnitude higher compared to n-type nitride semiconductor. Therefore, when a super lattice layer is formed on the p layer side, remarkable effect of reducing the threshold voltage is obtained. Nitride semiconductor is known to be a semiconductor which is difficult to obtain in the form of p-type crystal. Such a process has been known where a nitride semiconductor layer doped with a p-type impurity is annealed and then hydrogen is removed thereby manufacturing a p-type crystal (Japanese Patent No. 2540791). However, the p-type nitride semiconductor thus obtained has resistivity as high as several ohm-centimeters at the lowest. By turning this p-type layer into a super lattice layer, better quality of crystal can be obtained and the resistivity can be reduced at least one order of magnitude lower than that of the prior art, thereby making it possible to decrease the threshold voltage.

In the third embodiment, the third nitride semiconductor layer and the fourth nitride semiconductor layer of the p-type cladding layer 19 are set to have different concentrations of p-type impurity, so that one layer has a high impurity concentration and the other layer has a lower impurity concentration. Similarly to the case of the n-side cladding layer 14, threshold voltage and Vf can be decreased by doping the third nitride semiconductor layer which has a high band gap energy with the p-type impurity in a higher concentration and doping the fourth nitride semiconductor layer which has a low band gap energy with the p-type impurity in a lower concentration.

A configuration reverse to the above is also possible: the third nitride semiconductor layer which has high band gap energy is doped with the p-type impurity in a lower concentration and the fourth nitride semiconductor layer which has low band gap energy is doped with the p-type impurity in a higher concentration. The reason is as described previously.

The amount of doping in the third nitride semiconductor layer is preferably controlled within a range from $1\times10^{18}/$ cm³ to $1\times10^{21}$/cm³, or more preferably within a range from $1\times10^{19}$/cm³ to $5\times10^{20}$/cm³. When the impurity concentration is lower than $1\times10^{18}$/cm³, the difference from the concentration in the fourth nitride semiconductor layer becomes too small to obtain a layer of high carrier concentration. When the impurity concentration is higher than $1\times10^{21}$/cm³, on the other hand, quality of crystal tend to deteriorate. Meanwhile the p-type impurity concentration in the fourth nitride semiconductor layer may be at any level as long as it is lower than that of the third nitride semiconductor layer, but it is preferably lower than one tenth of the latter. Most preferably the fourth nitride semiconductor layer is undoped, in order to obtain the highest mobility. In practice, however, because the film is thin, some of the p-type impurity diffuses from the third nitride semiconductor. In order to obtain good effect in the present invention, the concentration is preferably within $1\times10^{20}$/cm³. The p-type impurity is selected from among the elements of IIA group and IIB group of the periodic table such as Mg, Zn, Ca and Be, and preferably selected from among Mg and Ca. The above applies also to such a case as the third nitride semiconductor layer having higher band gap energy is doped with less amount of p-type impurity and the fourth nitride semiconductor layer having lower band gap energy is doped with greater amount of p-type impurity.

In the nitride semiconductor layer constituting the super lattice layer, the layer doped with the impurity in a higher concentration is preferably doped so that such a distribution of impurity concentration is obtained, that the impurity concentration is high in the middle portion of the semiconductor layer in the direction of thickness (located far from the second nitride semiconductor layer or the fourth nitride semiconductor layer) and is low (or undoped) in the portions near the ends (portions adjacent to the second nitride semiconductor layer and the fourth nitride semiconductor layer). When the super lattice layer is formed from the AlGaN layer doped with Si as n-type impurity and the undoped GaN layer, the AlGaN layer releases electrons as donor into the conductive band because it is doped with Si, the electrons fall in the conductive band of the GaN which has a low potential. Because the GaN crystal is not doped with the donor impurity, carrier disturbance due to an impurity does not occur. Thus the electrons can move easily in the GaN crystal, namely high electron mobility is obtained. This is similar to the effect of the two dimensional electron gas described previously, thus increasing the mobility of the electrons substantially in the transverse direction and decreasing the resistivity. In the AlGaN layer having a high band gap energy, the effect is further enhanced when the central region relatively apart from the GaN layer is doped with the n-type impurity in a high concentration. That is, among the electrons that move in GaN, electrons passing through a portion near the AlGaN are more or less subject to disturbance by the n-type impurity ions (Si in this case) which are present in a portion of the AlGaN layer adjacent to the GaN layer. However, when a portion of the AlGaN layer adjacent to the GaN layer is undoped as described above, electrons passing through the portion near the AlGaN layer become less subject to the disturbance of Si, and therefore mobility in the undoped GaN layer is further improved. Similar effect is obtained also when super lattice is formed from the third nitride semiconductor layer of the p layer side and the fourth nitride semiconductor layer, although the action is different somewhat, and it is preferable that the third nitride semiconductor layer having a high band gap energy be doped with the p-type impurity in a higher concentration at the middle portion thereof and doped in a lower concentration or undoped at all at portions which are adjacent to the fourth nitride semiconductor layer. Although the impurity concentration distribution may also be realized in the nitride semiconductor layer having a low band gap energy doped with the n-type impurity in a higher concentration, a super lattice layer made by doping the nitride semiconductor layer of a lower band gap energy has less effect.

While the configurations where the n-side cladding layer 14 and the p-side cladding layer 19 are made in super lattice layer structure have been described above, according to the present invention, the n-side buffer layer 11 acting as a contact layer, the n-side optical waveguide layer 15, p-side cap layer 17, the p-side optical waveguide layer 18, p-side contact layer 20, or the like may also be formed in super lattice structure. That is, any layer, whether it makes contact with the activation or not, may be formed in super lattice structure. When the n-side buffer layer 11 whereon the n electrode is formed is formed in super lattice structure, in particular, the effect similar to that of HEMT can be easily obtained.

Further in the laser device according to the third embodiment of the present invention, the n-side optical waveguide layer 15 in which the impurity (n-type impurity in this case) concentration is controlled within $1\times10^{19}$/cm³ is formed between the n-side cladding layer 14 made of super lattice layer and the active layer 16, as shown in FIG. 3. Even when the n-side optical waveguide layer 15 is undoped, there is a possibility that the n-type impurity from other layers diffuses into this layer, although the effect of the present invention will not be lost provided that the concentration of the doped impurity is within $1\times10^{19}$/cm³, in which case the n-side optical waveguide layer 15 functions as an optical waveguide layer. However, according to the present invention, impurity concentration in the n-side optical waveguide layer 15 is preferably within $1\times10^{18}$/cm³, more preferably within $1\times10^{17}$/cm³, and most preferably the n-side optical waveguide layer 15 is undoped. It is also preferable that the n-side optical waveguide layer 15 be formed from a nitride semiconductor which includes In or from GaN.

Also in the laser device according to the third embodiment, the p-side optical waveguide layer 18 in which the impurity (p-type impurity in this case) concentration is controlled within $1\times10^{19}$/cm³ is formed between the p-side cladding layer 19 made of super lattice layer and the active layer 16. According to the present invention, impurity concentration in the p-side optical waveguide layer 18 may be within $1\times10^{19}$/cm³, but is preferably controlled within $1\times10^{18}$/cm³ and most preferably the p-side optical waveguide layer 18 is undoped. While a nitride semiconductor shows n-type conductivity when undoped, conductivity of the p-side optical waveguide layer 18 may be either n-type or p-type according to the present invention and is referred to as p-side optical waveguide layer regardless of the conductivity type in this specification. In practice, there is a possibility that the p-type impurity from other layers diffuses into the p-side optical waveguide layer 18. It is preferable that the p-side optical waveguide layer be also formed from a nitride semiconductor which includes In or from GaN.

The reason why it is preferable that an undoped nitride semiconductor be interposed between the active layer and the cladding layer is as follows. A nitride semiconductor is designed to have the active layer emit light of wavelength usually in a range from 360 to 520 nm, more particularly from 380 to 450 nm. An undoped nitride semiconductor has lower absorptance for light of the wavelength region described above, than nitride semiconductors doped with n-type impurity or p-type impurity. Therefore, when an undoped nitride semiconductor is interposed between a light emitting active layer and a cladding layer which acts as a light trapping layer, light emitted by the active layer is subject to less attenuation and it is made possible to make a laser device which oscillates with a low gain while decreasing the threshold voltage. This effect can be achieved when the impurity concentration in the optical waveguide layer is within $1 \times 10^{19}/cm^3$.

Thus a preferred embodiment of the present invention is a light emitting device which is located apart from an active layer and has a cladding layer of super lattice structure that has been modulation-doped with an impurity, and a guide layer which is doped with an impurity in a low concentration or preferably undoped, interposed between the cladding layer and the active layer.

Further preferred embodiment is the light emitting device of the third embodiment wherein a quantum well layer of active layer and the p-side cap layer 17 made of a nitride semiconductor of thickness 0.1 μm or less having a band gap energy higher than the band gap energy of the interface of the p-side guide layer 18 is formed between the p-side guide layer 18 and the active layer 16, with the impurity concentration in the p-side cap layer being controlled at $1 \times 10^{18}/cm^3$ or higher. Thickness of the p-type cap layer 17 is controlled within 0.1 μm, more preferably within 500 angstroms, and most preferably within 300 angstroms. When grown to be thicker than 0.1 μm, cracks tend to develop in the p-type cap layer 17 thus making it difficult to grow a nitride semiconductor layer of good quality of crystal. When a thin layer having a high band gap energy is formed to a thickness within 0.1 μm adjacent to the active layer, leak current in the light emitting device can be decreased. This causes the electrons injected from the n layer side to accumulate in the active layer due to the energy barrier of the cap layer, resulting in increased probability of recombination of electrons and positive holes, thereby making it possible to increase the output power of the device. It is necessary to control the impurity concentration in the cap layer at $1 \times 10^{18}/cm^3$ or higher. That is, the cap layer has a relatively high proportion of mixed Al, and a layer having a high proportion of mixed Al tends to have high resistance. Therefore, unless the layer is doped with an impurity to increase the carrier concentration and reduce the resistivity, the layer becomes similar to i layer of high resistance, thus forming p-i-n structure with poor current-voltage characteristics. The cap layer provided on the p side may also be formed on the n side. When formed on the n side, doping of the n-type impurity is not necessary.

In the laser device of the third embodiment constituted as described above, because the n-side cladding layer 14 and the p-side cladding layer 19 are made in super lattice structure, electric resistance and the threshold voltage of the n-side cladding layer 14 and the p-side cladding layer 19 can be reduced and the laser can be oscillated for a long period of time.

In the laser device of the third embodiment, reduction of the threshold voltage is attempted with various means as described above, in addition to the constitution of the n-side cladding layer 14 and the p-side cladding layer 19 in super lattice structure.

Although the n-side cladding layer 14 and the p-side cladding layer 19 are made in super lattice structure in the third embodiment, the present invention is not limited to this configuration and either one of the n-side cladding layer 14 and the p-side cladding layer 19 may be made in super lattice structure. With such a configuration, too, the threshold voltage can be reduced compared to the prior art.

Although the n-side cladding layer 14 and the p-side cladding layer 19 are made in super lattice structure in the third embodiment, the present invention is not limited to this configuration and it suffices that any one or more of the p-side and n-side nitride semiconductor layers other than the n-side cladding layer 14 and the p-side cladding layer 19 may be made in super lattice structure. With such a configuration, too, the threshold voltage can be reduced compared to the prior art.

Although the n-side cladding layer 14 and the p-side cladding layer 19 are made in super lattice structure in the laser device of the third embodiment, the present invention is not limited to this configuration and can be applied to other nitride semiconductor devices such as light emitting diode (LED), as a matter of course. With such a configuration, Vf (forward voltage) can be reduced in the case of a light emitting diode.

As described above, because the laser device of the third embodiment has the cladding layer made in super lattice layer made by modulation doping of an impurity, the threshold voltage can be decreased and oscillation can be continued for a long period of time. Also the laser device can be set to a high characteristic temperature which makes it possible to make a good laser device. The characteristic temperature is the threshold current density as a function of temperature, which is proportional to $\exp(T/T_0)$, where T is the operating temperature (K) and $T_0$ is the characteristic temperature (K). In the laser device, higher value of $T_0$ allows lower threshold current density even at a high temperature, resulting in stable operation. In the laser device of embodiment 27 to be described later, for example, $T_0$ is as high as 150K or over. This value indicates excellent temperature characteristic of the LD. Thus when the laser device of the present invention is used as a writing light source and/or reading light source, a capacity not obtained with the prior art can be achieved, providing a great value of industrial utilization Embodiment 4

Figure 9:
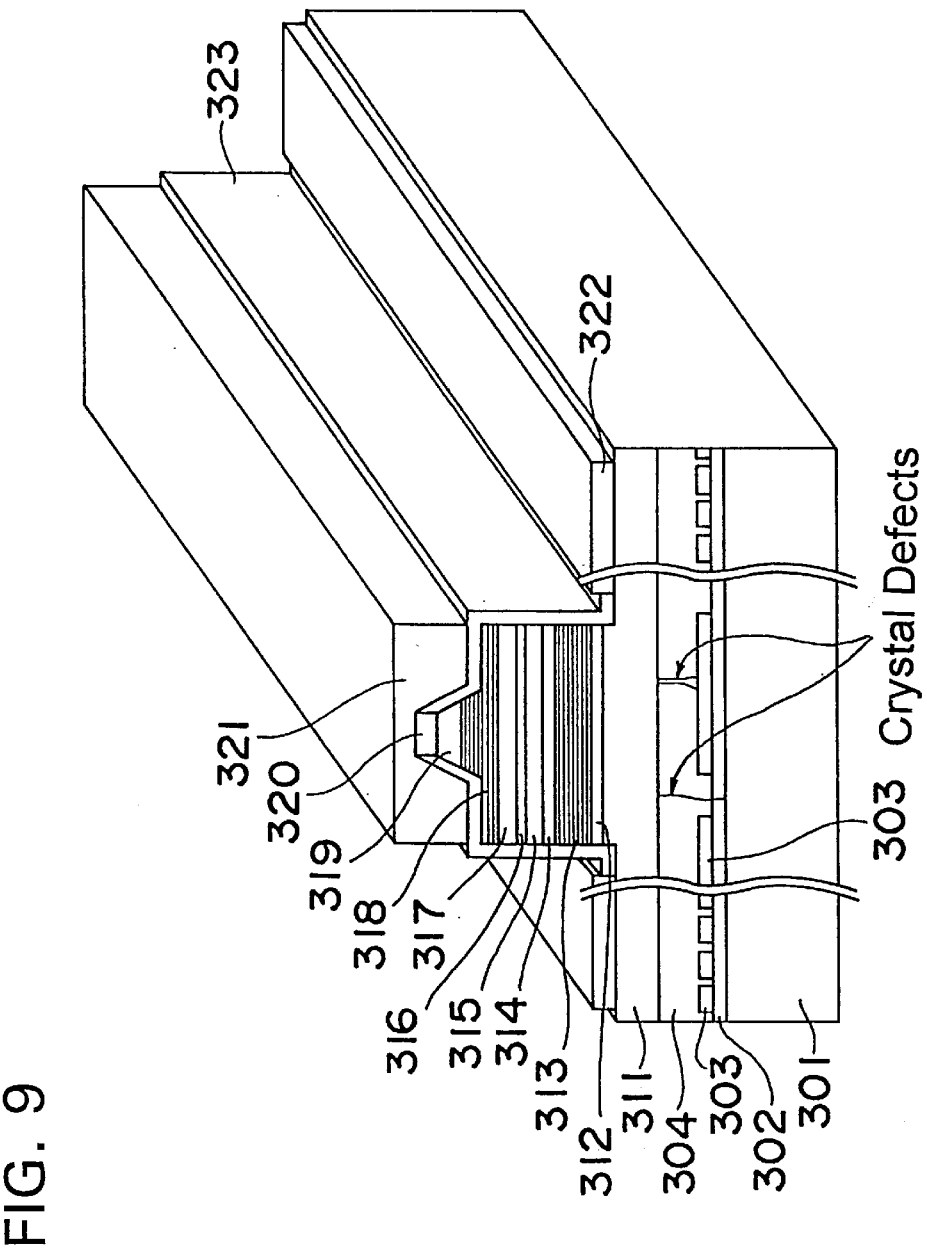
FIG. 9 is a schematic view of the nitride semiconductor device (LD) structure of the fourth embodiment according to the present invention.

FIG. 9 is a schematic perspective view showing the shape of the laser device according to the fourth embodiment of the present invention. FIG. 9 also shows the cross section of the device when cut in a direction perpendicular to the ridge stripe. The fourth embodiment of the present invention will be described below by referring to FIG. 9.

Each layer of the laser device according to the fourth embodiment is formed in a manner as described below.

(Underlying Layer 302)

The underlying layer 302 is, for example, made of GaN and has a thickness of 4 μm. The underlying layer 302 is formed via a 200-angstrom-thick buffer layer (not shown) consisting of GaN on an auxiliary substrate 301 made of, for example, sapphire. The underlying layer 302 forms partially a protective film on the surface and is used for the layer on which the nitride semiconductor substrate is to be grown selectively. The underlying layer 302 is made of GaN or $Al_xGa_{1-x}N$ and in the case of including Al, $Al_xGa_{1-x}N$ ($0 \leq X \leq 0.5$) having a Al mixed crystal ratio exceeds 0.5, cracking easily occurs in the crystal itself, rather than the crystal defects, resulting in difficulty of the crystal growing itself. The under lying layer 302 is desirably grown to a larger thickness than that of the buffer layer and adjusted to not more than 10 μm. The auxiliary substrate 301 may be made of SiC, ZnO, spinel, GaAs and the like, as well as sapphire, which are known to be used for growing the nitride semiconductors and are different from nitride semiconductors.

(Protective Film 303)

For a protective film 303, 1-μm-thick $SiO_2$ film having a sufficient length in the resonating direction is patterned to form 10-μm-wide stripe windows with a periodicity of 2 μm on the underlying layer 302. The examples of the protective film may include stripes, dots or checks. The protective film 303 may preferably have a larger area than the windows (the exposed parts of the underlying layer 302 on which the $SiO_2$ is not formed), so as to grow a nitride semiconductor substrate 304 with less crystal defects. The materials of the protective film 303 may include oxides such as silicon oxide ($SiO_x$), silicon nitride ($Si_xNi_y$), titanium oxide ($TiO_x$) and zirconium oxide ($ZrO_x$), nitrides, or multi-layer film thereof, as well as metals having a melting point higher than 1200° C. These materials can stand at high temperatures ranging between 600° C. and 1100° C. at which nitride semiconductors can be grown and nitride semiconductors do not grow or are difficult to grow on the surface of the materials.

(Nitride Semiconductor Substrate 304)

For a nitride semiconductor substrate 304, for example, undoped GaN having a thickness of, for example, 20 μm is grown on the protective film 303 using MOVPE method. The nitride semiconductor substrate 304 may be grown using Halide Vapor Phase Epitaxy (HVPE) method as well as using MOVPE method in this way. The nitride semiconductor substrate may be most preferably obtained by growing GaN without In or Al. It is most desirable to use TMG as well as organic gallium compounds such as triethylgallium (TEG) as a gas for growth and to use ammonia or hydrazine as nitrogen sources. Donor impurities such as Si and Ge may be doped to the GaN substrate so as to adjust the carrier density to the suitable range. In the case that the auxiliary substrate 301, the underlying layer 302, and the protective film 303 are eliminated, the nitride semiconductor substrate functions as a contact layer and therefore, donor impurities may be desirably doped to the nitride semiconductor substrate.

(n-side Buffer Layer 311=which also Functions as a Contact Layer)

The n-side buffer layer 311 is obtained, for example, by forming a 5 μm-thick GaN doped with Si to $3\times10^{18}/cm^3$ on the nitride semiconductor substrate 304. The buffer layer 311 functions as a contact layer for forming a n-electrode in the case of the fabrication of the light emitting device having a structure as shown in FIG. 9. In the case that the auxiliary substrate 301 to the protective film 303 are eliminated and the electrode is formed on the nitride semiconductor substrate 304, the n-side buffer layer can be omitted. The n-side buffer layer 311 is one which is grown at high temperature and is different from the buffer layer which is formed by growing GaN, AlN and the like to a thickness of 0.5 μm or less directly on the substrate of the material such as sapphire, SiC and spinel and which is different from the nitride semiconductor at a low temperature of 900° C. or less.

(Crack-preventing Layer 312)

The crack-preventing layer 312 is formed by, for example, growing $In_{0.06}Ga_{0.84}N$ to a thickness of 0.15 μm on the n-side buffer layer 311.

(n-side Cladding Layer 313=Super Lattice Layer)

The n-side cladding layer 313 is composed of a super lattice layer which is obtained by laminating alternately the 25-angstrom-thick first layer consisting of n-type $Al_{0.6}Ga_{0.84}N$ doped with Si to $1\times10^{18}/cm^3$ and the 25-angstrom-thick second layer consisting of undoped GaN, and has a total thickness of, for example, 1.2 μm. The n-side cladding layer 313 composed of a super lattice layer has an average Al composition of 8.0% and the product of that and the film thickness equals 9.6. In the case that then-side cladding layer 313 is composed of a super lattice layer obtained by laminating the nitride semiconductor layers which have different band gap energy from each other, more impurities may be doped to one layer, that is, modulation-doping may be performed, so as to lower the threshold value. The composition and thickness of the n-side cladding layer 313 (a super lattice layer) will be described in detail below.

(n-side Light Waveguide Layer 314)

The n-side light waveguide layer 314 is made of undoped GaN and has a thickness of, for example, 0.1 μm. The n-side light waveguide layer functions as a light waveguide layer for the active layer. The n-side light waveguide layer is desirably formed by growing GaN or InGaN to a thickness, usually ranging between 100 angstroms and 5 μm, preferably ranging between 200 angstroms and 1 μm.

(Active Layer 315)

The active layer 315 is made by alternately laminating a quantum well layer which is made of undoped $In_{0.2}Ga_{0.8}N$ and has a thickness of 40 angstroms and a barrier layer made of undoped $In_{0.01}Ga_{0.99}N$ and has a thickness of 100 angstroms, thereby forming a layer of multiple quantum well structure having a total thickness of, for example, 440 angstroms. The active layer 315 maybe undoped as in the present embodiment or may be doped with donor impurities and/or p-type impurities. In this case, either both or one of the quantum well layer and the barrier layer may be doped with the impurity.

(p-side Cap Layer 316)

The p-side cap layer 316 has band gap energy higher than that of the p-side light waveguide layer 317 which is formed thereon, and is made of p-type $Al_{0.3}Ga_{0.7}N$ doped with Mg in a concentration of $1\times10^{20}/cm^3$ and has a thickness of, for example, 300 angstroms. The p-type cap layer 316 has a thickness of 0.1 μm or less so as to enhance the laser of the device. The lower limit of the film thickness is not specified, but the p-side cap layer 316 may desirably have a thickness of 10 angstroms or more.

(p-side Light Waveguide Layer 317)

The p-side light waveguide layer 317 has band gap energy lower than that of the p-side cap layer 316, and is made of, for example, undoped GaN and has a thickness of 0.1 μm. The p-side light waveguide layer functions as a light waveguide layer for the active layer and is desirably made of GaN or InGaN like the n-type light waveguide layer 314.

(p-side Cladding Layer 318)

The p-side cladding layer 318 has a super lattice structure made by alternately laminating the third layer which is made of p-type $Al_{0.16}Ga_{0.84}N$ doped with Mg to $1\times10^{20}/cm^3$ and has a thickness of 25 angstroms and the fourth layer which is made of undoped GaN and has a thickness of 25 angstroms. The p-side cladding layer 318 has an average Al composition of 8% and the product of the value and the film thickness equals 4.8. In the case that the p-side cladding layer 318 is composed of a super lattice layer obtained by laminating the nitride semiconductor layers at least one of which includes a nitride semiconductor layer containing Al and which have different band gap energy from each other, more impurities may be doped to any one layer, that is, modulation-doping may be performed, so as to lower the threshold value. The composition and thickness of the p-side cladding layer 318 (a super lattice layer) will be described in detail below.

Now, the thickness of the core part (waveguide part) which is sandwiched between the cladding layers will be described below. The core part is the area including the n-side light waveguide layer 314, active layer 315, p-side cap layer 316 and the p-side light waveguide layer 317, that is, the nitride semiconductor layers including the active layer which are sandwiched between the n-side cladding layer and the p-side cladding layer and the area which waveguides the emitting from the active layer. In the case of the nitride semiconductor laser device, as mentioned above, FFP is not a single beam because the emission leaking via the cladding layer can be wave-guided within the n-side contact layer, resulting in multi-mode. Otherwise, the emission is resonated within the core part, resulting in multi-mode. According to the present invention, the n-side cladding layer has a large thickness and a large average Al composition in order to obtain the difference between the refractive indices and to trap the emission from the core part within the cladding layer. However, if the multi-mode occurs within the core part, FFP is disturbed. Therefore, in order that the multi-mode does not occur within the core part, the thickness of the core part is desirably adjusted, with respect to the n-side cladding layer. The thickness is desirably adjusted to the range from 200 angstrom to 1.0 $\mu$m, preferably from 500 angstroms to 0.8 $\mu$m, most preferably from 0.1 $\mu$m to 0.5 $\mu$m, in order that the multi-mode does not occur within the core part. If the thickness is below 200 angstroms, the emission leaks from the core part to increase the threshold value. If the thickness is above 1.0 $\mu$m, the multi-mode is likely to occur.

(p-side Contact Layer 319)

The p-side contact layer 319 is made of, for example, p-type GaN doped with Mg to $2 \times 10^{20}/cm^3$ and has a thickness of, for example, 150 angstrom. The p-side contact layer 319 can be made in a constitution of p-type $In_XAl_YGa_{1-X-Y}N(0 \leq X, 0 \leq Y, X+Y \leq 1)$, as well as p-type GaN as mentioned above, and the preferable ohmic contact with the p electrode 321 can be obtained by using GaN doped with Mg.

In the embodiment 4, the wafer on which each nitride semiconductor layer is formed is preferably annealed at 700° C. within the nitrogen atmosphere in the reactor, so as to decrease the resistance of the layer doped with the p-type impurity.

In the laser device of the embodiment 4, the p-side contact layer 318 which is a top layer, and the p-side cladding layer are etched with the RIE apparatus to form a ridge geometry having a stripe width of 4 $\mu$m, as shown in FIG. 9. When the ridge stripe is formed, the ridge stripe is formed above the position of the surface of the nitride semiconductor substrate 304 where the crystal defects do not appear. In FIG. 9, the crystal defects appear in the central part of the protective film 303 in the form of stripe and in the central part of the window in the form of stripe. Thus, when the stripe is formed at the point where almost no crystal defects are present, the crystal is prevented from developing to the active layer, with the result that the laser device can has a long lifetime and the reliability thereof can be enhanced.

Further, a mask is formed on the ridge surface and the etching is performed with RIE to expose the surface of the n-side buffer layer 311 on both sides of the ridge. On the exposed surface of the n-side buffer layer 311, the n electrode 322 made of Ti and Al is formed, respectively.

And on the outermost surface of the ridge of the p-side contact layer 319, the p electrode 320 made of Ni and Au is formed in the form of stripe. As shown in FIG. 9, the insulating film 323 made of $SiO_2$ is formed on the surface of the nitride semiconductor layer which is exposed between the p electrode 320 and the n electrode 322. The p-pad electrode 321 which is electrically connected to the p electrode 320 is formed via the insulating film 323.

The sapphire substrate of the wafer on which the n electrode and p electrode are formed in a manner as mentioned above is polished to a thickness of 70 $\mu$m and cleaved into bars from the substrate, perpendicularly with respect to the stripe-shaped electrode to fabricate a resonator in which the cleaving facet functions as a reflective plane. A multi-layer dielectric film made of $SiO_2$ and $TiO_2$ may be formed on the reflective plane.

The laser device of the fourth embodiment is fabricated as described above.

The laser device of the embodiment 4 fabricated as descibed above has as a light trapping layer the n-side cladding layer 313 and the p-side cladding layer 318 of a super lattice structure which have smaller refractive indices than the well layer of the active layer and include nitride semiconductor, respectively. In the embodiment 4, the supper lattice layer means the multi-layer structure obtained by laminating nitride semiconductor layers which have a thickness of not more than 100 angstroms respectively and have a different composition from each other. The thickness of the layer which is laminated is preferably not more than 70 angstroms, and more preferably not more than 40 angstroms. To be concrete, for example, the super lattice layer may be made by laminating the layer made of $Al_XGa_{1-X}N(0<X<1)$ and the other nitride semiconductor layer which has a different composition from the layer made of $Al_XGa_{1-X}N$, and by laminating the layer of the ternary mixed crystal and the layer of the ternary mixed crystal or the layer of the ternary mixed crystal and the layer of binary mixed crystal such as $Al_XGa_{1-X}N/GaN$, $Al_XGa_{1-X}N/Al_YGa_{1-Y}N(0<Y<1, Y<X)$, $Al_XGa_{1-X}N/In_ZGa_{1-Z}N(0<Z<1)$ and so on. Thereamong, the most preferable super lattice layer is made of $Al_XGa_{1-X}N$ and GaN.

Next, the total thickness of the n-side cladding layer 313 and the thickness and the composition of each layer which constitute the super lattice layer according to the embodiment 4 will be described.

First, in these specifications, the Al average composition of the super lattice layer means that calculated as described below. For example, when the super lattice layer is made by laminating a 25-angstrom-thick $Al_{0.5}Ga_{0.5}N$ and a 25-angstrom-thick GaN in 200 pairs (1.0 $\mu$m), the thickness of one pair is 50 angstroms and the mixing proportion of Al of the layer containing Al is 0.5. Using the value 0.25 obtained by multiplying the mixing ratio of Al of the layer containing Al, 0.5, by the film thickness ratio (25/50), the Al average composition of the super lattice layer is 25%.

When the super lattice layer is made by laminating the layers having a different thickness, that is, by laminating a 40-angstrom-thick $Al_{0.5}Ga_{0.5}N$ and a 20-angstrom-thick GaN, the weighed mean of the film thickness is calculated to be 0.5 (40/60)=0.33, and therefore, the Al average composition is 33.3. That is, the mixing ratio of Al of the nitride semiconductor layer containing Al multiplied by the ratio of said nitride semiconductor layer to one pair of the super lattice layers equals the Al average composition in the present invention. When both layers contain Al, the Al average composition can be obtained in the same manner. For example, the super lattice layer is made by laminating a 20-angstrom-thick $Al_{0.1}Ga_{0.8}N$ and a 30-angstrom-thick $Al_{0.2}Ga_{0.8}N$, 0.1 (20/50)+0.2 (30/50)=0.16, that is, the Al average composition is 16%. The example mentioned above refers to AlGaN/GaN and AlGaN/AlGaN and the same calculation method can be applied to the case of AlGaN/InGaN. And, the Al average composition of the n-side cladding layer can be detected with an instrument for analysis such as SIMS (secondary ion mass spectrometer) and Auger electron spectrometer.

In the embodiment 4, the composition and the film thickness of each layer which constitute the super lattice layer of the n-side cladding layer 313 is set on the basis of the Al average composition as calculated using the above-mentioned calculating method. The laser device according to the embodiment 4 is characterized in that the total thickness of the n-side cladding layer 313 is not less than 0.5 $\mu$m and the Al average composition in % of the n-side cladding layer 313 is set to be such that the product of the Al average composition (%) multiplied by the total thickness of the n-side cladding layer ($\mu$m) is not less than 4.4. In other words, in the embodiment 4, the thickness and the Al average composition of each layer constituting the super lattice layer are set to be such that the total thickness of the n-side cladding layer 313 is not less than 0.5 $\mu$m and the product of said thickness multiplied by the Al average composition in % as calculated in the above-mentioned way is not less than 4.4.

When the total thickness of the n-side cladding layer 313 is less than 0.5 $\mu$m and the product of said total thickness ($\mu$m) multiplied by the Al average composition (%) is less than 4.4, the light trapping effect of the n-side cladding layer is insufficient and the resonance occurs again in the n-side contact layer, with the result that the FFP is disturbed and the threshold value tends to increase. The product of the Al average composition multiplied by the total thickness of the n-side cladding layer 313 is preferably not less than 5.0, more preferably not less than 5.4, most preferably not less than 7.0.

According to the present invention, because of the n-side cladding layer 313 composed of a super lattice layer, even if the mixing ratio of Al is increased, the cracks can be difficult to develop in the cladding layer. Therefore, the upper limit of the total thickness of the n-side cladding layer 313 is not specified from the viewpoint of crystalinity (from the viewpoint in which the cracks are prevented from occurring), and however, it is desirable to control the thickness to be not more than 5 $\mu$m so as to decrease the laminating times of the nitride semiconductor layers which constitute the super lattice layer.

To be concrete, for example, the total thickness of said n-side cladding layer is set to be not less than 0.8 $\mu$m and the Al average composition which is contained in said n-side cladding layer is set to be not less than 5.5%. In this case, the product is not less than 4.4. Preferably, the total thickness of said n-side cladding layer is set to be not less than 1.0 $\mu$m and the Al average composition which is contained in said n-side cladding layer is set to be not less than 5.0%. In this case, the product is not less than 5.0. More preferably, the total thickness of said n-side cladding layer is set to be not less than 1.2 $\mu$m and the Al average composition which is contained in said n-side cladding layer is set to be not less than 4.5%. In this case, the product is not less than 5.4. The examples mentioned above described concretely the relation between the thickness of the n-side cladding layer and the Al average composition of the n-side cladding layer made in super lattice structure. It is known that when the mixing ratio of Al in $Al_xGa_{1-x}N$ is increased, the band gap energy increases and the refractive index decreases. Therefore, it is ideal and industrially convenient that the $Al_xGa_{1-x}N$ layer having a large mixing ratio of Al of, for example, not less than 0.5 is grown in a single layer of, for example, a few $\mu$m, however, the $Al_xGa_{1-x}N$ layer is difficult to be grown thickly. If the $Al_xGa_{1-x}N$, particularly having a mixing ratio of Al of not less than 0.5, is intended to be grown in a single layer, the cracks should develop in the crystal in the thickness of, for example, not less than 0.1 $\mu$m. Thus, the $Al_xGa_{1-x}N$ layer having a mixing ratio of Al of not less than 0.5 is difficult to be grown in a single layer having a thickness of, for example, a few $\mu$m.

However, according to the present invention, a thin film made of $Al_xGa_{1-x}N$ is used to constitute a super lattice layer and the thickness of the single film is not more than the critical film thickness of $Al_xGa_{1-x}N$, therefore, the cracks being to develop. Therefore, when the cladding layer is composed of a super lattice layer, the layer having a high mixing ratio of Al and a large thickness can be grown. In the present invention, since the relation between the specific mixing ratio of Al and the thickness of the cladding layer could be found, the combination thereof enables the light not to leak from the n-side cladding layer to the substrate side.

When the n-side cladding layer is constituted as mentioned above to trap the emission from the active layer, the -side cladding layer may have the same constitution as that of the n-side cladding layer. When the p-side cladding layer 318 is constituted in the same manner as the n-side cladding layer 313, the thickness of the p-side cladding layer is desirably smaller than that of the n-side cladding layer. Because, when the mixing ratio of Al or the thickness of the p-side cladding layer is large, the resistance of the AlGaN layer tends to increase with the result that the threshold value tends to increase. Therefore, even if the p-side cladding layer is constituted of a super lattice layer including the nitride semiconductor layer containing Al and the product of the thickness multiplied by the Al average composition is not less than 4.4, the thickness is desirably no more than 1.0 $\mu$m. The lower limit is not specified but is desirably not less than 50 angstroms in order to function as a cladding layer. In the case of the super lattice layer, the Al average composition is desirably not more than 50%. Since the p-side cladding layer is shaped into a ridge and the electrode is installed thereon, the leakage of the light can be almost neglected and it is not necessary for the p-side cladding layer to have the same constitution as that of the n-side cladding layer 313, but the p-side cladding layer may have the same constitution as that of the n-side cladding layer. That is, the p-side cladding layer has a super lattice structure including the nitride semiconductor layer containing at least Al and has a total thickness of not more than 1.0 $\mu$m. Moreover, the Al average composition in % contained in the p-side cladding layer may be set to be such that the product of the total thickness ($\mu$m) of the p-side cladding layer multiplied by the Al average composition (%) is not less than 4.4.

When the p-side cladding layer is composed of a super lattice layer including the nitride semiconductor layer containing Al (in this case, the leakage of light is not concerned and the case in which the cladding layer functions only as a carrier trapping layer is included), the total thickness of the n-side cladding layer is desirably larger than that of the p-side cladding layer. The p-side cladding layer is composed of a super lattice layer made by laminating the nitride semiconductor layers in the same way as the n-side cladding layer, for example, by laminating the $Al_xGa_{1-x}N$ (0<X<1) layer and the other nitride semiconductor layer which has a different composition from said $Al_xGa_{1-x}N$ layer, or by laminating the layer made of ternary mixed crystal and the layer made of ternary mixed crystal or the layer made of ternary mixed crystal ant the layer made of binary mixed crystal such as $Al_xGa_{1-x}N/GaN$, $Al_xGa_{1-x}N/Al_yGa_{1-y}N$ ($0<Y<1$, $Y<X$), $Al_xGa_{1-x}N/In_zGa_{1-z}N$ ($0<Z<1$) and so on. Thereamong, the most preferable super lattice layer is made of $Al_xGa_{1-x}N$ and GaN.

The present invention will be described in detail in the following examples.

EXAMPLES

The invention will be described in detail in the following examples.

Example 1

According to Example 1 of the invention, nitride semiconductor devices (LD devices), as shown in FIGS. 1 and 2, can be fabricated. The nitride semiconductor devices were fabricated as follows.

First, a C-plane sapphire substrate 10 was set in the reactor and the inside atmosphere of the reactor was fully replaced with hydrogen. The temperature of the substrate was increased to 1050° C. with hydrogen flown in order to clean the substrate.

Subsequently, the temperature was decreased to 510° C. A first buffer layer 11 consisting of GaN was grown to a film thickness of about 200 angstrom using hydrogen as a carrier gas, ammonia and TMG (trimethylgallium) as a source of GaN.

After growing the buffer layer, only TMG was stopped and the temperature was increased to 1050° C. At 1050° C. in the same way using ammonia and TMG (trimethylgallium) as a source of GaN, a 5 μm-thick second buffer layer 112 consisting of undoped GaN having a carrier density of $1\times10^{18}/cm^3$ was grown.

Subsequently, a 1 μm-thick n-side contact layer 12 consisting of n-type GaN doped with Si to $1\ 10^{19}/cm^3$ was grown, using TMG and ammonia and silane gas ($SiH_4$) as a source of impurity at 1050° C.

Next, the temperature was increased to 800° C. A 500-angstrom-thick crack-preventing layer consisting $In_{0.1}Ga_{0.9}N$ doped with Si to $5\times10^{18}/cm^3$ was grown, using TMG, TMI (trimethylindium) and ammonia as source gases and silane gas as a source of impurity.

Then, the temperature was increased to 1050° C. and a 20-angstrom-thick first layer consisting of n-type $Al_{0.2}Ga_{0.8}N$ doped with Si to $5\times10^{18}/cm^3$ was grown, using TMA, TMG, ammonia and silane gas. Subsequently, TMA and silane were stopped and a 20-angstrom-thick second layer consisting of undoped GaN was grown. Then, each of these operations was repeated 100 times and a n-side cladding layer 14 of superlattices having a total thickness of 0.4 μm was grown.

Subsequently, a 0.1 μm-thick n-side light guide layer 15 consisting of n-type GaN doped with Si to $5\times10^{18}/cm^3$ was grown at 1050° C.

Next, an active layer 16 was grown using TMG, TMI, ammonia and silane. For the active layer 16, first, a 25-angstrom-thick well layer 25 consisting of $In_{0.02}Ga_{0.99}N$ doped with Si to $8\times10^{18}/cm^3$ was grown at 800° C. Next, at the same temperature, a 50-angstrom-thick barrier layer consisting of $In_{0.01}Ga_{0.99}N$ doped with Si to $8\times10^{18}/cm^3$ was grown, only by changing the molar ratio of TMI. This operation was repeated twice. Finally, the well layer was laminated and a multi-quantum-well-structure active layer 16 was grown with a total thickness of 175 angstroms.

Next, the temperature was increased to 1050° C. A 300-angstrom-thick p-side cap layer 17 consisting of p-type $Al_{0.3}Ga_{0.7}N$ doped with Mg to $1\times10^{20}/cm^3$ was grown which had a greater band gap energy than the active layer, using TMG, TMA and ammonia as a source of AlGaN and Cp2Mg (cyclopentadienyl magnesium) as a source of impurity.

Subsequently, a 0.1 μm-thick p-side light guide layer 18 consisting of p-type GaN doped with Mg to $1\times10^{20}/cm^3$ was grown which had a smaller band gap energy than the p-side cap layer 17 at 1050° C.

Subsequently, a 20-angstrom-thick first layer consisting of p-type $Al_{0.2}Ga_{0.8}N$ doped with Mg to $1\times10^{20}/cm^3$ was grown, using TMA, TMG, ammonia and Cp2Mg at 1050° C. Subsequently, TMG was stopped and a 20-angstrom-thick second layer consisting of p-type GaN doped with Mg to $1\times10^{20}/cm^3$ was grown. Each of these operations was repeated 100 times and a p-side cladding layer 19 of superlattices with a total thickness of 0.4 μm was formed.

Finally, a 150-angstrom-thick p-side contact layer 20 consisting of p-GaN doped with Mg to $2\times10^{20}/cm^3$ was grown on the p-side cladding layer 19 at 1050° C.

After the reaction was completed, the temperature was decreased to room temperature. Additionally, the annealing was performed to the wafer at 700° C. in nitrogen atmosphere within the reactor, so as to make the p-type layer less resistive. The annealing method disclosed in U.S. Pat. No. 5,306,662 is employed in this Example.

After annealing, the wafer was removed from the reactor. As shown in FIG. 2, the top p-side contact layer 20 and the p-side cladding layer 19 were etched with RIE apparatus to make them a ridge geometry having a stripe width of 4 μm.

Next, a mask was formed on the surface of the ridge. As shown in FIG. 2, the surfaces of the n-side contact layer were exposed symmetrically respect to the stripe ridge.

Next, a p-electrode 21 consisting of Ni and Au was formed on the almost whole top surface of the stripe ridge of the p-side contact layer 20, while a n-electrode 23 consisting of Ti and Al was formed on the almost whole surface of the stripe-geometry n-side contact layer.

Next, as shown in FIG. 2, an insulating film 25 was formed on the surface of the nitride semiconductor layer exposed between p-electrode 21 and n electrode 23. A p-pad electrode 22 and an n-pad electrode 24 were formed which are electrically connected to the p-electrode via the insulating film 25.

The wafer on which the n-electrode and p-electrode were formed in the above-mentioned manner was transferred to the polishing machine. The sapphire substrate on whose side the nitride semiconductor was not formed was lapped with a diamond abrasive to a substrate thickness of 50 μm. After lapping, the surface of the substrate was further polished by 1 μm with a finer abrasive, resulting in the mirror facet.

After polishing the substrate, the polished facet was scribed and cleaved into bars perpendicularly respect to the stripe-geometry electrode to fabricate a facet of a resonator on the cleaving facet. A dielectric multi-layer film consisting $SiO_2$ and $TiO_2$ was formed on the facet of the resonator and finally, the bar was cut parallel to the p-electrode, resulting in laser chips. Next, the chips were set face-up (in the state that the substrate was faced to the heat sink) onto the heat sink and each electrode was connected by wire-bonding. The laser oscillation was tried at room temperature. The continuous emission at an emission wavelength of 405 nm was observed at the threshold current density of 2.9 $kA/cm^2$ and the threshold voltage of 4.4V at room temperature. The lifetime was 50 hours or longer.

Comparative Example 1

With the same procedure as in Example 1, the second buffer layer was not grown, the 5 μm-thick n-side contact layer 12 only consisting of n-type GaN doped with Si to $1\times10^{19}/cm^3$ was grown, the 0.4 μm-thick n-side cladding layer only consisting of n-type $Al_{0.2}Ga_{0.8}N$ doped with Si to $1\times10^{19}/cm^3$ was grown, the 0.4 μm-thick p-side cladding layer 19 only consisting of p-type $Al_{0.2}Ga_{0.8}N$ doped with Mg to $1\times10^{20}/cm^3$ was grown, and the 0.2 μm-thick p-side contact layer 20 only consisting of p-type GaN doped with Mg to $2\times10^{20}/cm^3$ was grown, so as to obtain laser devices. The basic construction was as shown in FIG. 1.

TABLE 1

| Substrate | 10 sapphire | |
|---|---|---|
| Buffer layer | 11 GaN | 200 Å |
| n-side contact layer | 12 Si doped n-type GaN<br>Si: $1 \times 10^{19}/cm^3$ | 5 μm |
| Crack preventing layer | 13 Si doped n-type $In_{0.1}Ga_{0.9}N$<br>Si: $5 \times 10^{18}/cm^3$ | 500 Å |
| n-side cladding layer | 14 Si doped n-type $Al_{0.2}{}^{Ga}{}_{0.8}N$<br>Si: $5 \times 10^{18}$ $cm^3$ | 0.5 μm |
| n-side optical waveguide layer | 15 Si doped n-type GaN<br>Si: $5 \times 10^{18}/cm^3$ | 0.1 μm |
| Active layer (MQW) (total thickness 175Å) | 16 Si doped $In_{0.2}Ga_{0.8}N$<br>Si doped $In_{0.01}Ga_{0.95}N$<br>Si: $8 \times 10^{18}cm^3$ | 25 Å<br>50 Å |
| Cap layer | 17 Mg doped p-type $Al_{0.01}Ga_{0.9}N$<br>Mg : $1 \times 10^{20}cm^3$ | 300 Å |
| p-side optical waveguide layer | 18 Mg doped p-type GaN<br>Mg: $1 \times 10^{20}cm^3$ | 0.1 μm |
| p-side cladding layer | 19 Mg doped p-type $Al_{0.2}Ga_{0.8}N$<br>Mg: $1 \times 10^{20}cm^3$ | 0.5 μm |
| p-side contact layer | 20 Mg doped p-type GaN<br>Mg: $2 \times 10^{20}cm^3$ | 0.2 μm |

For the laser devices of Comparative Example 1 constructed in this way, the continuous emission was obtained at the threshold current density of 7 kA/cm². However, the threshold voltage was 8.0V or higher and the emission was observed for few minutes.

Example 2

With the same procedure as in Example 1, for the n-side contact layer 12, a 30-angstrom-thick first layer consisting of n-type $Al_{0.05}Ga_{0.95}N$ doped with Si to $2\times10^{19}/cm^3$ was grown and subsequently, a 30-angstrom-thick second layer consisting of undoped GaN was grown and these procedures were repeated, resulting in superlattices having a total thickness of 1.2 μm. The other constructions of the laser devices were the same as in Example 1. The threshold current density was 2.7 kA/cm², the threshold voltage was 4.2V and the lifetime was 60 hours or longer.

Example 3

The laser devices were fabricated which had the same constructions as in Example 2, except for the n-side contact layer 12 composed of superlattices whose second layers consisted of GaN doped with Si to $1\times10^{18}/cm^3$. The laser devices had almost similar properties to those of Example 2.

Example 4

The laser devices were fabricated which had the same constructions as in Example 1, except that the 4-thick second buffer layer 112 consisting of GaN doped with Si to $1\times10^{17}/cm^3$ was grown. The threshold current density was 2.9 kA/cm², the threshold voltage was 4.5V and the lifetime was 50 hours or longer.

Example 5

With the same procedure as in Example 1, for the n-side contact layer 12, a 60-angstrom-thick first layer consisting of n-type $Al_{0.2}Ga_{0.8}N$ doped with Si to $2\times10^{19}/cm^3$ was grown and subsequently, a 40-angstrom-thick second layer consisting of GaN doped with Si to $1\times10^{19}/cm^3$ of Si was grown and these procedures were repeated, resulting in superlattices having a total thickness of 2 μm. And the 0.4 μm-thick n-side cladding layer 14 consisting of only n-type $Al_{0.2}Ga_{0.8}N$ doped with Si to $1\times10^{19}/cm^3$ was grown. The other constructions of the laser devices were the same as those in Example 1. The threshold current density was 3.2 kA/cm², the threshold voltage was 4.8V and the lifetime was 30 hours or longer.

Example 6

With the same procedure as in Example 1, the following procedures (1) and (2) were changed.

(1) After the growth of the buffer layer 11, only TMG was stopped and the temperature was increased to 1050° C. At1050° C., the 60-angstrom-thick first layer consisting of n-type $A_{0.2}Ga_{0.8}N$ doped with Si to $1\times10^{19}/cm^3$ was grown using TMA, TMG, ammonia and silane as material gases and subsequently, silane and TMA were stopped and the 60-angstrom-thick second layer consisting of undoped GaN was grown. The superlattices were constructed in a manner of the first layer+the second layer+the first layer+the second layer+ . . . Five-hundreds first layers and five-hundred second layers were laminated by turns. The n-side contact layer 12 of superlattices having a total thickness of 5 μm was formed.

(2) Next, the 500-angstrom thick-crack preventing layer 13 consisting of $In_{0.1}Ga_{0.9}N$ doped with Si to $5\times10^{18}/cm^3$ was grown in the same manner as in Example 1.

And at 1050° C. the 0.5 μm-thick n-side cladding layer 14 consisting of n-type $Al_{0.2}Ga_{0.8}N$ doped with Si to $5\times10^{18}/cm^3$ was grown using TMA, TMG, ammonia and silane.

The constructions above the n-side cladding layer were the same as those of the laser devices in Example 1. The laser devices of this example had the basic constructions as described in Table 1, except that the n-side contact layer 12 and p-side cladding layer 19 were composed of superlattices and the p-side contact layer 20 had a thickness of 150 angstrom like Example 1. The continuous emission at a wavelength of 405 nm was observed at the threshold current density of 3.2 kA/cm² and the threshold voltage of 4.8V. The lifetime was 30 hours or longer.

Figure 5:
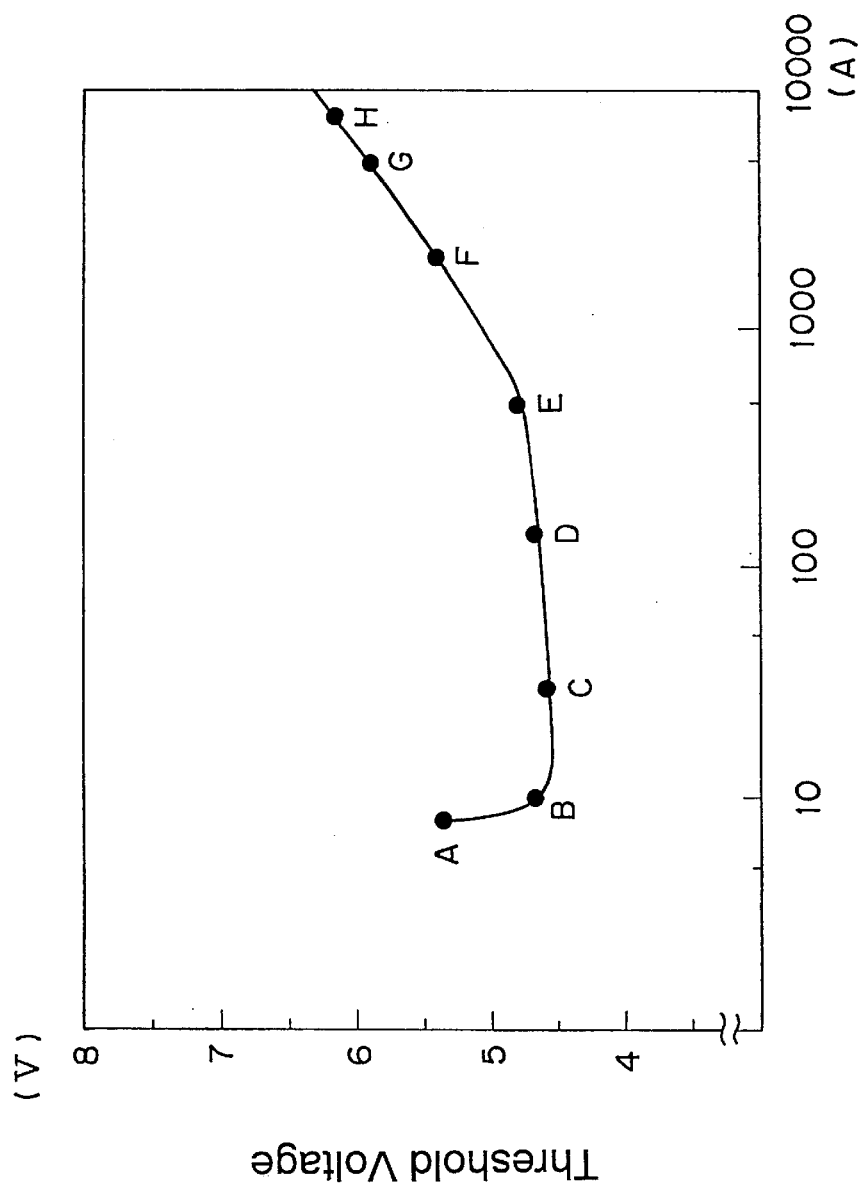
FIG. 5 is a graph showing the relation between the thickness of the p-side contact layer and the threshold voltage in Example 1 of the present invention.

Further, in the case that the film thickness of the p-side contact layer of LDs according to Example 6 is changed gradually, the relation between the film thickness of the p-side contact layer and the threshold voltage of the LDs is shown in FIG. 5. The figure shows the threshold voltages in the case the p-side contact layer has a thickness of less than 10 angstrom (A), 10 angstrom (B), C (30 angstrom), 150 angstrom (D: this example), 500 angstrom (E), 0.2 μm (F), 0.5 μm (G) and 0.8 μm (H), in order from the left. As shown in this drawing, the threshold voltage tends to increase gradually when the film thickness of the p-side contact layer is over 500 angstrom. The p-side contact layer 20 preferably has a thickness of 500 angstrom or less, more preferably 300 angstrom or less. When the film thickness is 10 angstrom or less (almost one atom layer or two atom layer), the surface of the p-side cladding layer 19 which is under the p-side contact layer is exposed and therefore, the contact resistance of the p-electrode is bad, resulting in that the threshold voltage tends to increase. However, since LDs of the present invention had a superlattice layer, the threshold voltage was much lower than that of the comparative examples.

Comparative Example 2

The laser devices having the construction as described in Table 1 were fabricated, except that n-side cladding layer 14 was formed which was a multi-layer film having a total thickness of 0.6 μm, by growing the 180-angstrom-thick first layer consisting n-type $Al_{0.2}Ga_{0.8}N$ doped with Si to $1\times10^{19}/cm^2$ and subsequently, growing the 120-angstrom-thick second layer consisting of undoped GaN. That is, the thickness of the first layer and second layer was increased and LDs were fabricated. The continuous emission was observed at the threshold current density of 6.5 kA/cm² and the threshold voltage was 7.5 V. The emission was observed for few minutes.

Example 7

The laser devices having the same construction as in Example 6 were fabricated, except that the p-side cladding layer 19 had a superlattice structure with a total thickness of 0.5 μm obtained by laminating the 60-angstrom-thick first layers consisting of $A_{0.2}Ga_{0.8}N$ doped with Mg to $1\times10^{20}/cm^3$ and the 40-angstrom-thick second layers consisting of p-type GaN doped with Mg to $1\times10^{20}/cm^3$. That is, the thickness of the superlattice layer constructing the p-side cladding layer 19 of Example 7 was changed and the other constructions were the same as in Example 7. The threshold voltage increased a little, as compared with that in Example 6. The lifetime was 20 hours or longer.

Example 8

The laser devices having the same construction as in Example 7 were fabricated, except that the n-side cladding layer 19 had a superlattice structure with a total thickness of 0.5 μm obtained by laminating the 60-angstrom-thick first layers consisting of $Al_{0.2}Ga_{0.8}N$ doped with Si to $1\times10^{19}/cm^3$ and the 40-angstrom-thick second layers consisting of n-type GaN doped with Si to $1\times10^{19}/cm^3$. That is, the laser devices had superlattices as the n-side cladding layer, in addition to the n-side contact layer and p-side cladding layer having a superlattice structure in Example 6. The present laser devices had similar properties to those of Example 6.

Example 9

With the same procedures as in Example 1, the second buffer layer 112 was not grown and the 5 μm-thick n-side contact layer consisting of n-type GaN doped with Si to $1\times10^{19}/cm^3$ was grown directly on the first buffer layer 11. The other constructions were the same as those in Example 1. That is, the laser devises had the basic constructions as described in Table 1, except that the n-side cladding layer 14 had a superlattice structure with a total thickness of 0.4 μm obtained by laminating the 20-angstrom-thick first layers consisting of n type $Al_{0.2}Ga_{0.8}N$ doped with Si to $1\times10^{19}/cm^3$ and the 20-angstrom-thick second layers consisting of undoped GaN. Further, the p-side cladding layer had a superlattice structure with a total thickness of 0.4 μm obtained by laminating the 20-angstrom-thick first layers consisting of p-type $Al_{0.2}Ga_{0.8}N$ doped with Mg to $1\times10^{19}/cm^3$ and the 20-angstrom-thick second layers consisting of p-type GaN doped with Mg to $1\times10^{20}/cm^3$. Additionally, the p-side contact layer 20 consisted of p-type GaN doped with Mg to $2\times10^{20}/cm^3$ and had a thickness of 15 angstrom. The continuous emission at a wavelength of 405 nm was observed at the threshold current density of 3.3 kA/cm² and the threshold voltage was 5.0V. The lifetime was 30 hours or longer.

Example 10

The laser devices were fabricated in the same manner as in Example 9, except that the second layer which constructed the superlattices of the n-side cladding layer 14 consisted of GaN doped with Si to $1\times10^{17}/cm^3$. That is, the laser devices were fabricated in the same manner as in Example 9, except that the layers having a larger band gap energy were doped with Si to more amount. The present laser devises had similar properties to those of Example 9.

Example 11

The laser devices were fabricated in the same manner as in Example 9, except that the second layer which constructed the n-side cladding layer 14 consisted of n-type $In_{0.01}Ga_{0.99}N$ doped with Si to $1\times10^{19}/cm^3$. That is, the laser devices were fabricated in the same manner as in Example 9, except that the second layer which composed the superlattices of then-side cladding layer 14 consisted of InGaN and had the same impurity density as the first layer. The present laser devises had similar properties to those of Example 9.

Example 12

With the same procedures as in Example 9, the n-side cladding layer had a superlattice structure with a total thickness of 0.5 μ composed of the 60-angstrom-thick first layers consisting $Al_{0.2}Ga_{0.8}N$ doped with Si to $1\times10^{19}/cm^3$ and the 40-angstrom-thick second layers consisting of GaN doped with Si to $1\times10^{19}/cm^3$. Further, the p-side cladding layer 19 had a superlattice structure with a total thickness of 0.5 μ composed of the 60-angstrom-thick first layers consisting $Al_{0.2}Ga_{0.8}N$ doped with Mg to $1\times10^{20}/cm^3$ and the 40-angstrom-thick second layers consisting of GaN doped with Mg to $1\times10^{20}/cm^3$. That is, the laser devices were fabricated in the same manner as in Example 9, except that the doped amounts in the first layers and the second layers composing the n-side cladding layer 14 were equal to each other, the thickness of them was changed, and the thickness of the first layers and the second layers composing the p-side cladding layer 19 was changed. The continuous emission at a wavelength of 405 nm was observed at the threshold current density of 3.4 kA/cm² and the threshold voltage was 5.2V. The lifetime was 20 hours or longer.

Example 13

The laser devices having the same constructions as those in Example 11 were fabricated, except that the second layer composing the n-side cladding layer 14 consisted of GaN doped with Si to $1\times10^{17}/cm^3$. The present laser devices had the similar properties to those in Example 11.

Example 14

The laser devices having the same constructions as those in Example 11 were fabricated, except that the second layer composing the n-side cladding layer 14 consisted of undoped GaN. The present laser devices had the similar properties to those in Example 11.

Example 15

The laser devices were fabricated in the same manner as in Example 9, except that the 0.4 μm-thick n-side cladding layer 14 consisting of only n-type Al0.2Ga0.8N doped with Si to $1\times10^{19}/cm^3$ was grown. That is, the present laser devices had the basic constructions as described in table 1, except that the p-side cladding layer 19 had a superlattice structure with a total thickness of 0.4 μm composed of the 20-angstrom-thick first layers consisting of p-type Al0.2Ga0.8N doped with Mg to $1\times10^{20}/cm^3$ and the 20-angstrom-thick second layers consisting of p-type GaN doped with Mg to $1 \times 10^{19}/cm^3$ and further, the p-side contact layer 20 had a thickness of 150 angstroms and consisted of p-type GaN doped with Mg to $2 \times 10^{20}/cm^3$ like Example 1. The continuous emission at a wavelength of 405 nm was observed at the threshold current density of 3.4 kA/cm². The threshold voltage was 5.1V and the lifetime was 20 hours or longer.

Example 16

The laser devices were fabricated in the same manner as in Example 15, except that the p-side cladding layer 19 had a superlattice structure with a total thickness of 0.5 μm obtained by laminating the 60-angstrom-thick first layers ($Al_{0.2}Ga_{0.8}N$) and the 40-angstrom-thick second layers (GaN). The threshold voltage tended to rise a little. The lifetime was 20 hours or longer.

Example 17

The laser devices were fabricated in the same manner as in Example 9, except that the 0.4 μm-thick p-side cladding layer 19 consisting of only p-type $Al_{0.2}Ga_{0.8}N$ doped with Mg to $1 \times 10^{20}/cm^3$ was grown. That is, the present laser devices had the basic constructions as described in table 1, except that the n-side cladding layer 14 had a superlattice structure with a total thickness of 0.4 μm composed of the 20-angstrom-thick first layers consisting of p-type $A_{0.2}Ga_{0.8}N$ doped with Si to $1 \times 10^{19}/cm^3$ and the 20-angstrom-thick second layers consisting of undoped GaN and further, the p-side contact layer 20 had a thickness of 150 angstrom and consisted of p-type GaN doped with Mg to $2 \times 10^{20}/cm^3$ like Example 1. The continuous emission at a wavelength of 405 nm was observed at the threshold current density of 3.5 kA/cm². The threshold voltage was 5.4V and the lifetime was 20 hours or longer.

Example 18

The laser devices were fabricated in the same manner as in Example 17, except that the n-side cladding layer 14 had a superlattice structure with a total thickness of 0.49 μm obtained by laminating the 70-angstrom-thick first layers consisting of $Al_{0.2}Ga_{0.8}N$ and the 40-angstrom-thick second layers consisting of $In_{0.01}ga_{0.99}N$ doped with Si to $1 \times 10^{19}/cm^3$. The threshold voltage tended to rise a little, compared with that in Example 16. The lifetime was 10 hours or longer.

Example 19

The laser devices were fabricated in the same manner as in Example 17, except that the n-side cladding layer 14 had a superlattice structure with a total thickness of 0.5 μm obtained by laminating the 60-angstrom-thick first layers consisting of $Al_{0.2}Ga_{0.8}N$ and the 40-angstrom-thick second layers consisting of undoped GaN. The threshold voltage tended to rise a little, compared with that in Example 17. The lifetime was 10 hours or longer.

Example 20

With the same procedures as in Example 9, the n-side light waveguide layer 15 had a superlattice structure with a total thickness of 800 angstrom obtained by laminating the 20-angstrom-thick first layers consisting of undoped GaN and the 20-angstrom-thick second layers consisting of undoped $In_{0.1}Ga_{0.9}N$. In addition, the p-side light waveguide layer 18 also had a superlattice structure with a total thickness of 800 angstrom obtained by laminating the 20-angstrom-thick first layers consisting of undoped GaN and the 20-angstrom-thick second layers consisting of undoped $In_{0.1}Ga_{0.9}N$. That is, the present laser devices had the basic constructions as described in table 1, except that the n-side cladding layer 14, the n-side light waveguide layer 15, the p-side light waveguide layer 18 and the p-side cladding layer 19 had a superlattice structure respectively and further, the p-side contact layer 20 had a thickness of 150 angstrom and consisted of p-type GaN doped with Mg to $2 \times 10^{20}/cm^3$ like Example 1. The continuous emission at a wavelength of 405 nm was observed at the threshold current density of 2.9 kA/cm². The threshold voltage was 4.4V and the lifetime was 60 hours or longer.

Example 21

The present example will be described on the basis of LED devices as shown in FIG. 1. With the same procedures as in Example 1, a 200-angstrom-thick buffer layer 2 consisting of GaN was grown on a sapphire substrate 1, and subsequently, a 5 μm-thick contact layer consisting of n-type GaN doped with Si to $1 \times 10^{19}/cm^3$ was grown. Next, a 30-angstrom-thick active layer 4 having a single quantum well structure and consisting of In0.4Ga0.6N was grown. (p-side Superlattice Layer)

Next, with the same procedures as in Example 1, a 20-angstrom-thick first layer consisting of p-type $Al_{0.2}Ga_{0.8}N$ doped with Mg to $1 \times 10^{20}/cm^3$ was grown, and subsequently, a 20-angstrom-thick second layer consisting of p-type GaN doped with Mg to $1 \times 10^{19}/cm^3$. And then, a p-side cladding layer 5 having a superlattice structure with a total thickness of 0.4 μm was grown. The thickness of the p-side cladding layer 4 is not limited to particular value and preferably within the range of 100 angstrom to 2 μm, more preferably 500 angstrom to 1 μm.

Next, a 0.5 μm-thick p-type GaN layer doped with Mg to $1 \times 10^{20}/cm^3$ was grown on the p-side cladding layer 5. After the growth, the wafer was removed out of the reactor and the annealing was performed in the same manner as in Example 1. Then, the etching was performed from the side of the p-side contact layer 6 to expose the surface of the n-side contact layer 3 on which a n-electrode 9 was to be formed. A 200-angstrom-thick p-electrode consisting of Ni—Au was formed on the almost whole surface of the top p-side contact layer 6. A p-pad electrode consisting of Au was formed on the whole surface electrode 7. A n-side electrode 9 consisting of Ti—Al was formed on the exposed surface of the n-contact layer.

The wafer on which the electrodes were formed in the above-mentioned way were cut into chips which were 350 by 350 μm square to obtain LED devices. The green-emission at a wavelength of 520 nm was observed at If of 20 mA and Vf was 3.2V. On the contrary, LED devices having a p-side cladding layer 5 consisting of only Mg-doped $Al_{0.2}Ga_{0.8}N$ showed Vf of 3.4V. Moreover, The withstand static voltage of the present example was two times better.

Example 22

The LEDs were fabricated in the same manner as in Example 21, except that the p-side cladding layer 5 had superlattices with a total thickness of 0.25 μm obtained by laminating twenty-five 50-angstrom-thick first layers and twenty-five 50-angstrom-thick second layers consisting GaN doped with Mg to $1 \times 10^{20}/cm^3$. The LEDs had similar properties to those in Example 21.

Example 23

The LEDs were fabricated in the same manner as in Example 21, except that the p-side cladding layer 5 had superlattices with a total thickness of 0.25 μm obtained by laminating 100-angstrom-thick first layers and 70-angstrom-thick second. Vf was 3.4V, but The withstand static voltage was superior to that of the conventional devices by 20%.

Example 24

With the same procedures as in Example 21, for growing the n-side contact layer 3, the 60-angstrom-thick first layer consisting of n-type $Al_{0.2}G_{0.8}N$ doped with Si to $2\times10^{19}/cm^3$ was grown and the 40-angstrom-thick second layer consisting of undoped GaN was grown, and five-hundred first layers and five-hundred second layers were laminated by turns to obtain superlattices with a total thickness of 5 μm. The LEDs were fabricated in which other constructions were the same as those in Example 12. Vf decreased to 3.1V at If of 20 mA. The withstand static voltage was 2.5 times better than that of the conventional LEDs.

Example 25

The LEDs were fabricated in the same manner as in Example 23, except that the p-side cladding layer 5 was composed of superlattices with a total thickness of 0.3 m obtained by laminating twenty-five 60-angstrom-thick first layers ($Al_{0.2}Ga_{0.8}N$) and twenty-five 40-angstrom-thick second layers, by turns. Vf was 3.2V and The withstand static voltage was two times better than that of the conventional LEDs.

Example 26

First, a 300 μm-thick GaN layer doped with Si to $5\times10^{18}/cm^3$ was grown on a sapphire substrate using MOVPE method or HVPE method, and then the sapphire substrate was removed to fabricate a Si-doped GaN substrate 101 having a thickness of 300 μm. The GaN substrate 101 was obtained by growing a nitride semiconductor layer to a thickness of 100 μm or more on a substrate which is not a nitride semiconductor and by removing the substrate. The GaN substrate may be made of undoped GaN or n-type impurity -doped GaN. In the case of doping a n-type impurity, the impurity was usually doped within the range of $1\times10^{17}/cm^3$ to $1\times10^{19}/cm^3$ to obtain a GaN substrate having a few defect.

After the fabrication of the GaN substrate 101, the temperature was adjusted to 1050° C. and a 3 μm-thick third buffer layer 113 consisting of n-type GaN doped with Si to $3\times10^{18}/cm^3$ was grown. The third buffer layer corresponds to the n-side contact layer 14 as shown in FIGS. 1 and 2. However, an electrode is not on the buffer layer and thus, the third buffer layer 3 is not referred to a contact layer. The first layer may be grown at a low temperature in the same manner as in Example 1 between the GaN substrate 101 and the third buffer layer 113 and if the first layer is grown, the thickness may be preferably 300 angstrom or less.

The 500-angstrom-thick crack-preventing layer 13 consisting of $In_{0.1}Ga_{0.9}N$ doped with Si to $5\times10^{18}/cm^3$ of Si was grown on the third buffer layer 113 in the same manner as in example 1.

Next, a n-side cladding layer was grown which was composed of superlattices with a total thickness of 0.4 μm obtained by laminating 20-angstrom-thick first layers consisting of n-type $Al_{0.2}Ga_{0.8}N$ doped with Si to $5\times10^{18}/cm^3$ and 20-angstrom-thick second layers consisting of GaN doped with Si to $5\times10^{18}/cm^3$ by turns 100 times.

Next, a 0.1 μm-thick n-side light waveguide layer 15 consisting of n-type GaN doped with Si to $5\times10^{18}/cm^3$ was grown in the same manner as in Example 1.

Next, a 25-angstrom-thick well layer consisting of undoped $In_{0.2}Ga_{0.8}N$ was grown and a 50-angstrom-thick barrier layer consisting of undoped GaN was grown. They were grown by turns, respectively two times. And finally, a well layer was grown on the top, with the result that an active layer 16 having a multi-quantum-well-structure (MQW) with a total thickness of 175 angstroms was grown.

Next, in the same manner as in Example 1, a p-side cap layer 17 consisting of p-type $Al_{0.3}Ga_{0.7}N$ doped with Mg to $1\times10^{20}/cm^3$ was grown to a thickness of 300 angstroms and a p-side light waveguide layer 18 consisting of p-type GaN doped with Mg to $1\times10^{20}/cm^3$ was grown to a thickness of 0.1 μm.

Next, in the same manner as in Example 1, a p-side cladding layer 19 was formed which was composed of superlattices with a total thickness of 0.4 μm obtained by laminating 20-angstrom-thick first layers consisting of p-type $Al_{0.2}Ga_{0.8}N$ doped with Mg to $1\times10^{20}/cm^3$ of Mg and 20-angstrom-thick second layers consisting of p-type GaN doped with Mg to $1\times10^{20}/cm^3$. And finally, a 150-angstrom-thick p-side contact layer 20 consisting of p-type GaN doped with Mg to $2\times10^{20}/cm^3$ was grown on the p-side cladding layer 19.

After the reaction was completed, the annealing at 700° C. was performed. Then, in the same manner as in Example 1, the top p-side contact layer 20 and p-side cladding layer were etched into a ridge-geometry with a stripe width of 4 μm with the RIE apparatus.

Next, in the same manner as in Example 1, a p-electrode 21 consisting Ni and Au was formed on the almost whole surface of the stripe ridge of the p-side contact layer 20 and a n-electrode 23 consisting of Ti and Al was formed on the almost back surface of the GaN substrate 101.

Figure 6:
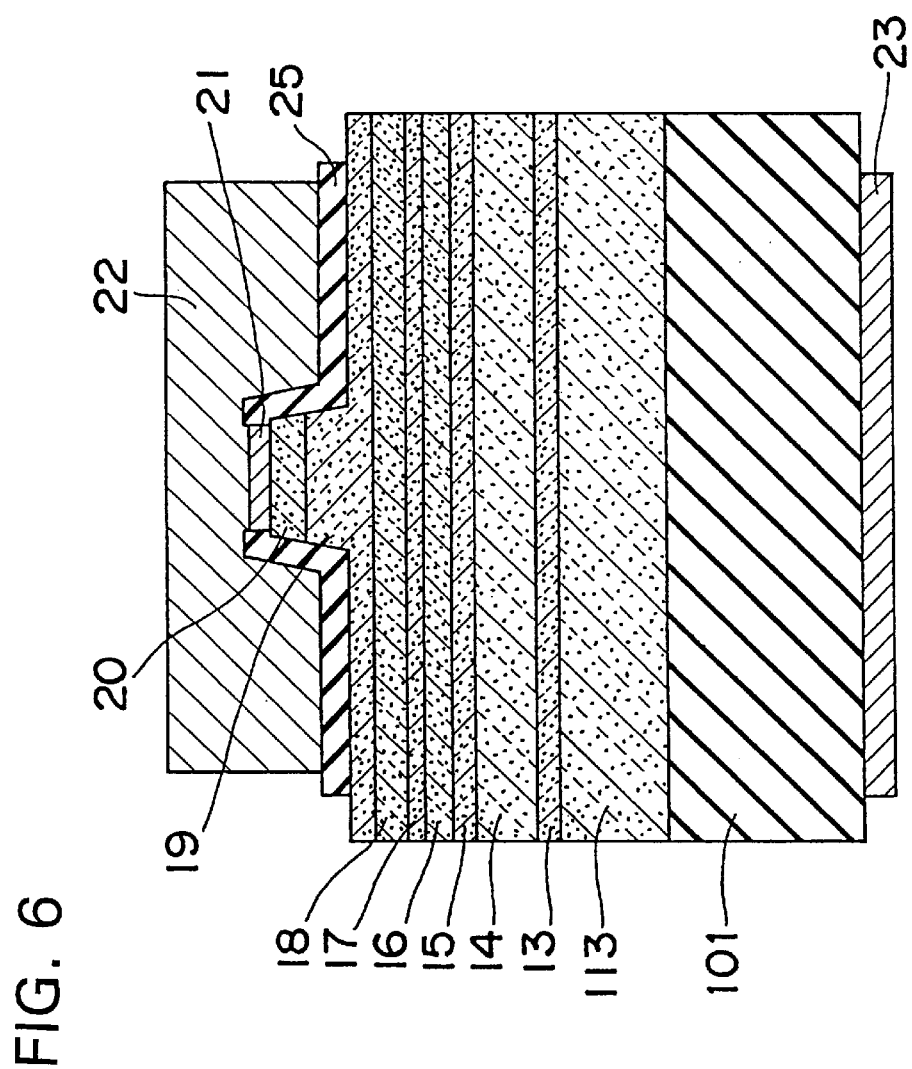
FIG. 6 is a schematic sectional view of the LD in Example 26 of the present invention.

Next, as shown in FIG. 6, an insulating layer 25 was formed on the p-side cladding layer 19 except for the p-electrode 21 and a p-pad electrode was formed which connected to the p-electrode 21 electrically via the insulating layer 25.

After formation of the electrode, the GaN substrate 101 was cleaved into bars perpendicularly respect to the p-electrode 21 to fabricate facets of a resonator on the cleaved facet. The cleaved facet of the GaN substrate was M plane. A dielectric multi-layer film consisting $SiO_2$ and $TiO_2$ was formed on the cleaved facet and finally, the bar was cut parallel to the p-electrode, resulting in laser chips as shown in FIG. 6. Next, the chips were set face-up (in the state that the substrate was faced to the heat sink) onto the heat sink and the p-pad electrode 22 was connected by wire-bonding. The laser was tried at room temperature. The continuous emission at a wavelength of 405 nm was observed at the threshold current density of 2.5 $kA/cm^2$ and the threshold voltage of 40V at room temperature. The lifetime was 500 hours or longer. This results from usage of GaN substrate to reduce the number of threading dislocations.

Figure 4:
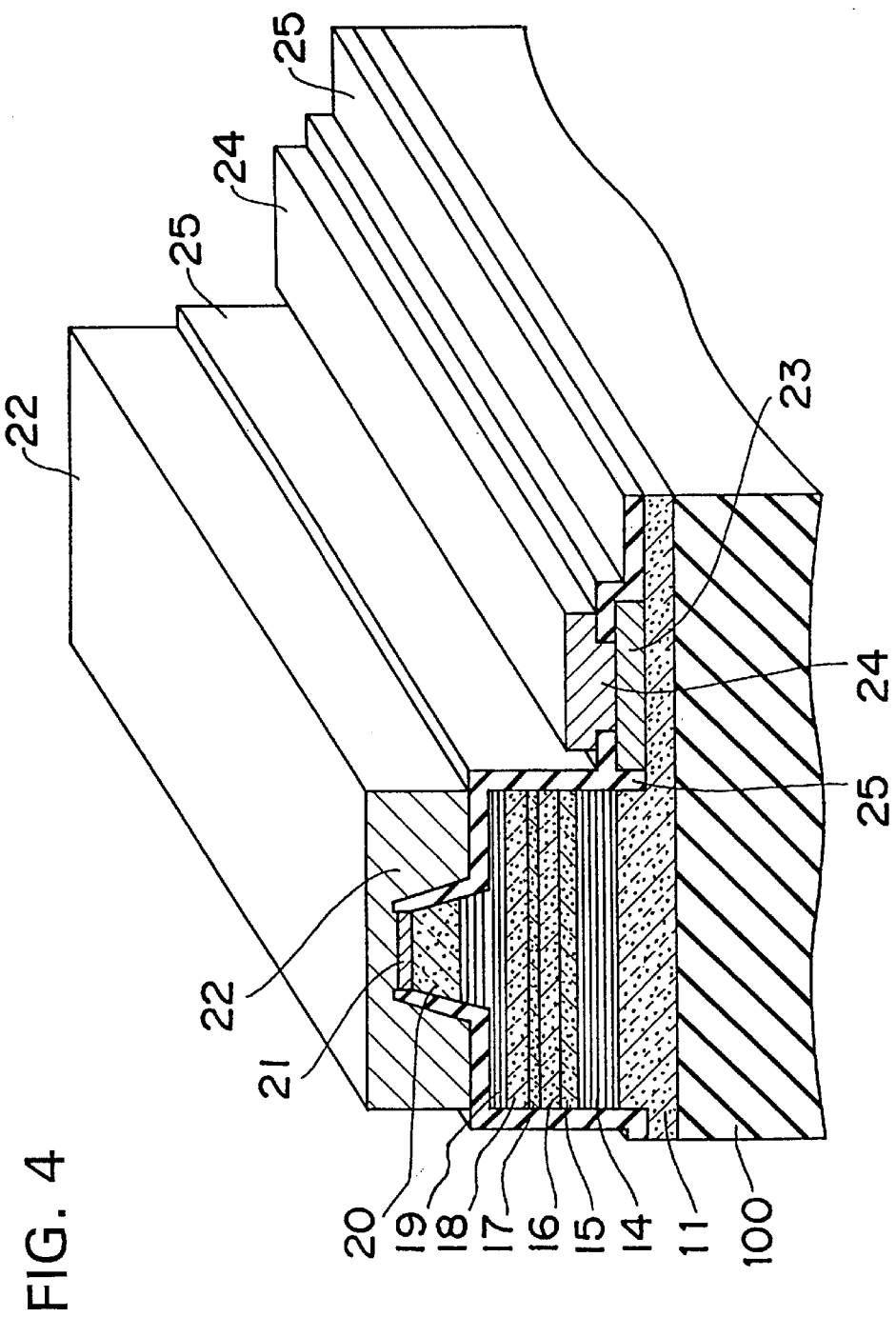
FIG. 4 is a perspective view of the LD shown in FIG. 5.

The examples of the present invention will be described, optionally in connection with the following drawings. FIG. 4 is a perspective view showing the shape of the laser devices as shown in FIG. 3.

Example 27

A GaN substrate 100 was prepared by growing a single crystal consisting of GaN to a thickness of 50 μm on a buffer layer consisting of GaN on a C-plane sapphire substrate. The GaN substrate 100 was set within the reactor and the temperature was increased to 1050° C. And using hydrogen as a carrier gas, ammonia and TMG (trimethylgallium) as a source of GaN and silane gas as a source of impurity, a 4 μm-thick n-side buffer layer 11 consisting of GaN doped with Si to $1 \times 10^{18}/cm^3$ was grown on the GaN substrate 100. The buffer layer also acts as a contact layer for forming the n-electrode when light emitting devices having a structure as shown in FIG. 3 are fabricated. Further, the n-side buffer layer is that is grown at a high temperature and is distinguished from a buffer layer having a thickness of 0.5 μm or less which is grown at a low temperature of 900° C. or less directly on the substrate made of the material, such as sapphire, SiC and spinel, which is different from nitride semiconductors.

(n-side Cladding Layer 14=Superlattice Layer)

Subsequently, at 1050° C., a 40-angstrom-thick first layer consisting of n-type $Al_{0.2}Ga_{0.8}N$ doped with Si to $1 \times 10^{19}/cm^3$ was grown using TMA (trimethylammonium), TMG, ammonia and silane gas. And then, silane gas and TMA were stopped and a 40-angstrom-thick second layer consisting of undoped GaN was grown. A superlattice layer was constructed in a manner of the first layer+the second layer+the first layer+the second layer+ . . . One-hundred first layers and one-hundred second layers were laminated by turns. Thus, the n-side cladding layer 14 composed of superlattices having a total thickness of 0.8 μm was grown.

(n-side Light Waveguide Layer 15)

Subsequently, silane gas was stopped and at 1050° C., a 0.1 μm-thick n-side light waveguide layer 15 consisting of undoped GaN was grown. The n-side light waveguide layer acts as a light waveguide layer of an active layer and preferably, consists of GaN or InGaN and has a thickness of 100 angstroms to 5 μm more preferably of 200 angstroms to 1 μm. This n-side light waveguide layer may be composed of undoped superlattices. In the case of the superlattice layer, the band gap energy is larger than that of the active layer and smaller than that of the n-cladding layer consisting of $Al_{0.2}Ga_{0.8}N$.

(Active Layer 16)

Next, an active layer 16 was grown using TMG, TMI and ammonia as a source of InGaN. For the active layer 16, the temperature was maintained at 800° C. and a 25-angstrom-thick well layer consisting of undoped $In_{0.2}Ga_{0.8}N$ was grown. Next, at the same temperature, the molar ratio of TMI was changed and a 50-angstrom-thick barrier layer consisting of $In_{0.01}Ga_{0.95}N$ was grown. These operations were repeated two times. And finally, an well layer was laminated, with the result that an active layer having a multi-quantum-well (MQW) structure with a total thickness of 175 angstroms was grown. The active layer may be undoped like in the present example, or doped with donor impurities and/or p-type impurities. Both of the well layer and the barrier layer may be doped with impurities or either of them may be doped.

(p-side Cap Layer 17)

Next, the temperature was increased to 1050° C. and a 300-angstrom-thick p-side cap layer consisting of p-type $Al_{0.3}Ga_{0.7}N$ doped with Mg to $1 \times 10^{20}/cm^3$ and having a larger band gap energy than the p-side light waveguide layer was grown using TMG, TMA, ammonia and Cp2Mg (cyclopentadienyl magnesium). The p-side cap layer has a thickness of 0.1 μm or less and the lower limit is not specified, but the thickness is preferably 10 angstroms or more.

(p-side Light Waveguide Layer 18)

Subsequently, Cp2Mg and TMA were stopped and at 1050° C., a 0.1 μm-thick p-side light waveguide layer 18 consisting of undoped GaN and having a smaller band gap energy than the p-side cap layer was grown. The layer acts as a light waveguide layer of the active layer and preferably consists of GaN or InGaN, like the n-side light waveguide layer 15. And the p-side light waveguide layer maybe a superlattice layer consisting of a undoped nitride semiconductor or a nitride semiconductor doped with an impurity. In the case of the superlattice layer, the band gap energy is larger than that of the well layer of the active layer and is smaller than that of the p-side cladding layer consisting of $Al_{0.2}Ga_{0.8}N$.

(p-side Cladding Layer)

Subsequently, at 1050° C., a 40-angstrom-thick third layer consisting of p-type $Al_{0.2}Ga_{0.8}N$ doped with Mg to $1 \times 10^{20}/cm^3$ was grown. Then, only TMA was stopped and a 40-angstrom-thick fourth layer consisting of undoped GaN was grown. These operations were repeated, respectively 100 times to grow a p-side cladding layer 19 composed of superlattices with a total thickness of 0.8 μm.

(p-side Contact Layer 20)

Finally, at 1050° C., a 150-angstrom-thick p-side contact layer 20 consisting of p-type GaN doped with Mg to $2 \times 10^{20}/cm^3$ was grown on the p-side cladding layer 19. The p-side contact layer 20 may consist of p-type $In_xAl_yGa_{1-x-y}N$ ($0 \leq X$, $0Y$, $X+Y \leq 1$), preferably GaN doped with Mg to $2 \times 10^{20}/cm^3$ to obtain the most preferable ohmic contact to the p-electrode 21. The p-side contact layer 20 was close to the p-side cladding layer 19 having a superlattice structure including p-type $Al_yGa_{1-y}N$ and consists of a nitride semiconductor having a small band gap energy and the thickness of the p-side contact layer 20 was as thin as 500 angstroms or less. Therefore, the carrier density of the p-side contact layer 20 was high and a good ohmic contact between the p-side contact layer and the p-electrode was achieved, with the result that the threshold current and voltage of the devices decreased.

The wafer on which the nitride semiconductors were grown in the above-mentioned manner was annealed at 700° C. within the nitrogen atmosphere in the reactor to make the layers doped with p-type impurities less resistive. The annealing method disclosed by U.S. Pat. No. 5,306,662 is employed in this Example.

After annealing, the wafer was removed out of the reactor and as shown in FIG. 3, the top p-side contact layer 20 and p-side cladding layer 19 were etched with RIE apparatus into a ridge geometry with a stripe width of 4 μm. Thus, since the layers above the active layer were made to have a stripe ridge geometry, the emission from the active layer was focused under the stripe ridge and the threshold value decreased. Particularly, the layers above the p-side cladding layer 19 composed of superlattice layers are preferably made to have a ridge geometry.

Next, a mask was formed on the surface of the ridge and the etching was performed with a RIE apparatus until the n-side buffer layer was exposed. The exposed n-side buffer layer 11 also acts as a contact layer for forming a n-electrode 23. In FIG. 3, the n-side buffer layer 11 is shown as a contact layer. However, the etching can be performed until the GaN substrate 100 is exposed and the exposed GaN substrate 100 can be a contact layer.

Next, a stripe p-electrode 21 consisting of Ni and Au was formed on the top surface of the ridge of the p-side contact layer 20. The materials for the p-electrode 21 to obtain preferable ohmic contact to the p-side contact layer may include Ni, Pt, Pd, Ni/Au, Pt/Au, Pd/Au and so on.

On the other hand, a stripe n-electrode 23 consisting of Ti and Au was formed on the exposed surface of n-side buffer layer 11. The materials for the n-electrode 23 to obtain preferable ohmic contact to the GaN substrate 100 may include metals such as Al, Ti, W, Cu, Zn, Sn, In and the like or alloys thereof.

Next, as shown in FIG. 3, an insulating layer 25 was formed on the surface of the exposed nitride semiconductors between the p-electrode and n-electrode 23. And a p-pad electrode 22 and n-pad electrode were formed which were connected to the p-electrode 21 electrically via the insulating layer 25. The p-pad electrode 22 enlarges the substantial surface area of the p-electrode 21 to enable the wire-bonding or die-bonding of the p-electrode. On the other hand, the n-pad electrode 24 prevents the n-electrode 23 from coming off.

The wafer on which the n-electrode and p-electrode were formed in the above-mentioned manner was is transferred to the polishing machine. The sapphire substrate on whose side the nitride semiconductor was not formed was lapped with an diamond abrasive to a substrate thickness of 70 $\mu$m. After lapping, the surface of the substrate was further polished by 1 $\mu$m with a finer abrasive, resulting in the mirror facet and the whole surface was metallized with Au/Sn.

Then, the Au/Sn side was scribed and cleaved into bars perpendicularly respect to the strip electrode to fabricate a resonator on the cleaved facet. A dielectric multi-layer film consisting $SiO_2$ and $TiO_2$ was formed on the plane of the resonator and finally, the bar was cut parallel to the p-electrode, resulting in laser chips. Next, the chips were set face-up (in the state that the substrate was faced to the heat sink) onto the heat sink and each electrode was connected by wire-bonding. The laser was tried at room temperature. The continuous emission at a wavelength of 405 nm was observed at the threshold current density of 2.0 kA/cm$^2$ and the threshold voltage of 4.0V at room temperature. The lifetime was 100 hours or longer.

Example 28

Figure 7:
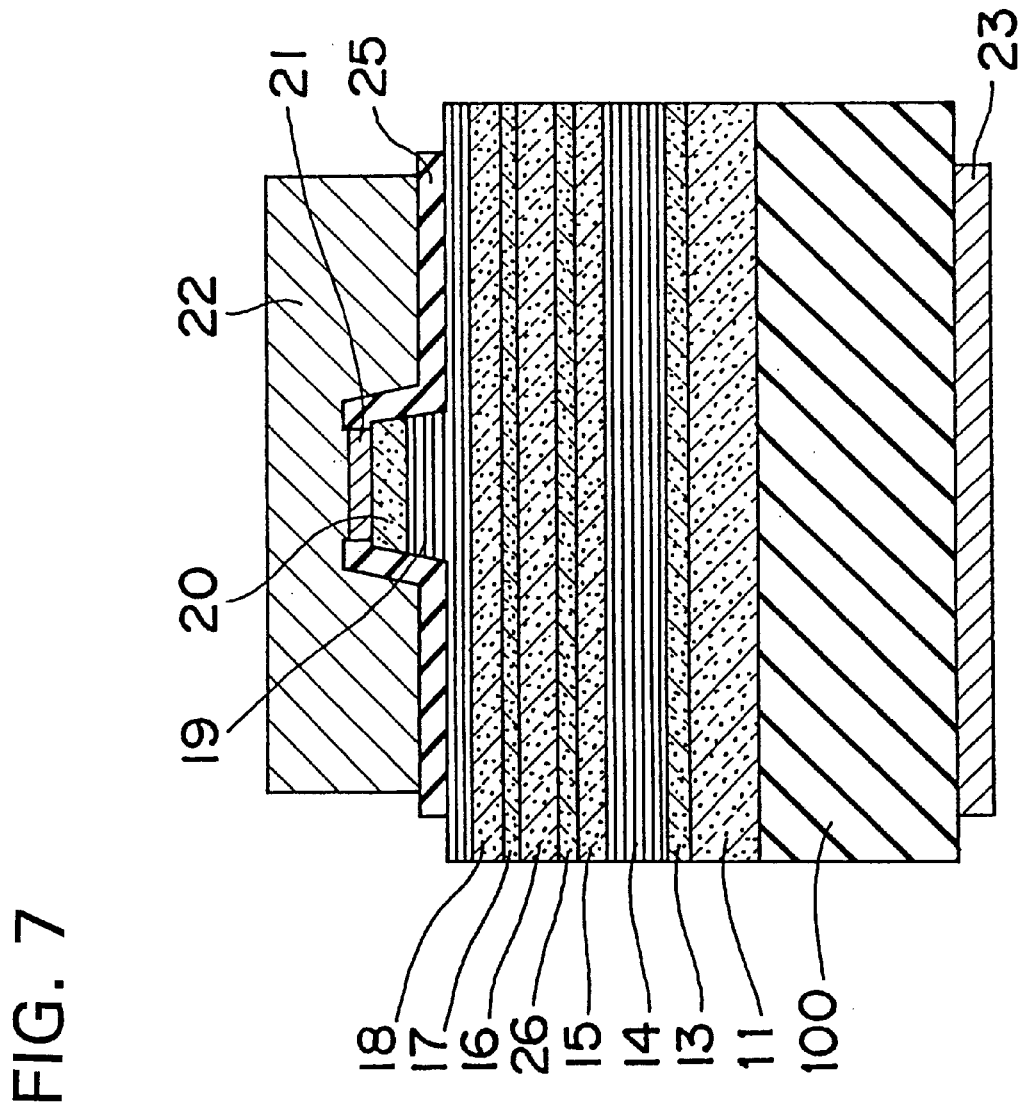
FIG. 7 is a schematic sectional view of the LD in Example 28 of the present invention.

FIG. 7 is a sectional view showing the structure of the laser devices according to another example of the present invention. In this drawing, the devices which are cut in the perpendicular direction to the propagating direction of the emission are shown, like in FIG. 3. Example 28 will be described with reference to FIG. 7. In FIG. 7, identical reference numerals have been used to designate identical elements that are common to FIG. 3 and FIG. 4.

A 150-angstrom-thick single crystal consisting of GaN doped with Si to $5\times10^{18}/cm^3$ was grown via the buffer layer consisting of GaN on the C-plane sapphire substrate, so as to obtain a GaN substrate 100. A n-side buffer layer 11 was grown on the GaN substrate in the same manner as in Example 27.

(Crack Preventing Layer 13)

After the growth of the n-side buffer layer 11, the temperature was adjusted to 800° C. and a 500-angstrom-thick crack preventing layer consisting of $In_{0.1}Ga_{0.9}N$ doped with Si to $5\times10^{18}/cm^3$ was grown using TMG, TMI and ammonia as a source of InGaN and silane gas as a source of Si. The crack preventing layer 13 can be obtained by growing a nitride semiconductor containing In, preferably InGaN, and can prevent cracks in the nitride semiconductor layers containing Al. The crack preventing layer may preferably have a thickness ranging 100 angstroms and 0.5 $\mu$m. If the crack preventing layer has a thickness less than 100 angstroms, the layer is hard to prevent cracks. If the layer has a thickness more than 0.5 $\mu$m, the crystal itself tends to change into black.

After the growth of the crack preventing layer 13, a n-side cladding layer 14 composed of modulation-doped superlattices 14 and an undoped n-side light waveguide layer 15 were grown in the same manner as in Example 27.

(n-side Cap Layer 20)

Subsequently, a 300-angstrom-thick n-side cap layer 20 consisting of n-type $Al_{0.3}Ga_{0.7}N$ doped with Si to $5\times10^{18}/cm^3$ and having a larger band gap energy than the n-side light waveguide layer 15 was grown using TMG, TMA, ammonia and silane gas.

After this, with the same procedures as those in Example 27, a p-side cap layer 17, an undoped p-side light waveguide layer 18, a p-side cladding layer 19 composed modulation-doped superlattices and a p-side contact layer 20 were grown.

After the growth of nitride semiconductor layers, annealing was performed in the same manner to make the p-type impurities doped layers less resistive. After annealing, as shown in FIG. 7, the top p-side contact layer 20 and p-side cladding layer were etched into a ridge geometry with a stripe width of 4 $\mu$m.

After forming a ridge, a stripe p-electrode 21 consisting of Ni/Au was formed on the top surface of the ridge of the p-side contact layer 20. An insulating layer 25 consisting of $SiO_2$ was formed on the surface of the top nitride semiconductor layer except for the p-electrode 21. A p-pad electrode 22 was formed which was connected electrically to the p-electrode 21 via the insulating layer 25.

The wafer on which the p-electrode was formed in the above-mentioned manner was transferred to the polishing machine. The sapphire substrate was removed by polishing to expose the surface of the GaN substrate 100. An n-electrode 23 consisting of Ti/Al was formed on the almost whole surface of the exposed GaN substrate.

After forming the electrodes, the GaN substrate was cleaved with respect to M-plane (which corresponds to a side plane of a hexagonal column in the case that the nitride semiconductor is represented according to a hexagonal system). The dielectric multilayers consisting of $SiO_2$ and $TiO_2$ were formed on the cleaved facet. The bar was cut parallel to the p-electrode into the laser chips. For these chips, a continuous emission at room temperature was observed. These devices had similar properties to those according to Example 27.

Example 29

With the same procedures as in Example 27, after growing the n-side buffer layer 11, a crack-preventing layer 13 was grown in the same manner as in Example 28. Next, a 0.4-$\mu$m-thick n-side cladding layer 14 composed of a single layer consisting of $Al_{0.3}Ga_{0.7}N$ doped with Si to $1\times10^{19}/cm^3$ was grown on the crack preventing layer. The other constructions were the same as those in Example 27. For the fabricated laser devices, the laser was observed at room temperature and the lifetime was a little shorter than that of the laser devices in Example 27.

Example 30

The laser devices were fabricated in the same manner as in Example 27 except that the p-side cladding layer 19 was formed by growing a 0.4-$\mu$m-thick single layer consisting of $Al_{0.3}Ga_{0.7}N$ doped with Mg to $1\times10^{20}/cm^3$. The laser was observed at room temperature and the lifetime was a little shorter than that of the laser devices in Example 27.

Example 31

With the same procedures as in Example 27, instead of the n-side cladding layer 14 having a superlattice structure, a 0.4-$\mu$m-thick n-side cladding layer 14 consisting of $Al_{0.2}Ga_{0.8}N$ doped with Si to $1\times10^{18}/cm^3$ was grown. And instead of the p-side cladding layer having a superlattice structure, a 0.4-μm-thick p-side cladding layer consisting of $Al_{0.2}Ga0.8N$ doped with Mg to $1\times10^{20}/cm^3$ was grown. The n-side light waveguide layer 15 was composed of superlattices with a total thickness of 0.12 μm obtained by laminating 30-angstrom-thick layers consisting of GaN doped with Si to $1\times10^{17}/cm^3$ and 30-angstrom-thick layers consisting of undoped $In_{0.01}Ga_{0.99}N$. The p-side light waveguide layer 18 was composed of superlattices with a total thickness of 0.12 μm obtained by laminating 30-angstrom-thick layers consisting of undoped $In_{0.01}Ga_{0.99}N$ and 30-angstrom-thick layers consisting of GaN doped with Mg to $1\times10^{17}/cm^3$ of Mg. The other constructions of the fabricated laser devices were the same as those in Example 27. The laser was observed at room temperature and the lifetime was a little shorter than that of the laser devices in Example 27.

Example 32

With the same procedures as in Example 27, the n-side buffer layer 11 was composed of superlattices with a total thickness of 1.2 μm obtained by laminating 30-angstrom-thick undoped GaN layers and 30-angstrom-thick layers consisting of $Al_{0.05}Ga_{0.95}N$ doped with Si to $1\times10^{19}/cm^3$. The layers above the n-side cladding layer were grown in the same manner as in Example 27 and the laser devices were fabricated. When the n-electrode was formed, the surface exposed by etching was positioned somewhere of the superlattices with a total thickness 1.2 μm and the n-electrode was formed on the exposed superlattice layer. A continuous emission was observed and the threshold value was a little lower than that of the laser devices in Example 27. The lifetime was 1000 hours or longer.

Example 33

FIG. 8 is a sectional view showing the structure of the laser devices according to another example of the present invention. In this drawing, identical reference numerals have been used to designate identical layers that are common to other drawings. Example 33 will be described with reference to FIG. 8.

With the same procedures as in Example 27, a 200-angstrom-thick GaN buffer layer (not shown) was grown on a (0001) C-plane sapphire substrate 30 with 2-inch Φ, at 500° C. and then, a 5 μm-thick undoped GaN layer 31 was grown at 1050° C. The thickness is not limited to 5 μm and may be preferably over the thickness of the buffer layer and 10 μm or less. The material of the substrate may include sapphire, SiC, ZnO, spinel, or other materials which are different from nitride semiconductors and are known for growing nitride semiconductors such as GaAs.

Next, after growing the undoped GaN layer 31, the wafer was removed out of the reactor. A striped photomask was formed on the surface of the GaN layer 31 and with a CVD apparatus, 0.1-μm-thick $SiO_2$ protective film 32 was patterned to form 20-μm-wide stripe windows with a periodicity of 5 μm. FIG. 8 is a sectional view showing the partial structure of the wafer when cut perpendicularly to the longitudinal direction of the stripes. The examples of the mask pattern may include stripes, dots or checks and the exposed parts of the undoped GaN layer 31, that is, the parts on which the mask was not formed (windows) may preferably have a smaller area than the mask, so as to grow a GaN substrate 100 with less crystal defects. The materials of the mask may include oxides such as silicon oxide ($SiO_x$), silicon nitride ($Si_xNi_y$), titanium oxide ($TiO_x$) and zirconium oxide ($ZrO_x$), nitrides, or multi-layer film thereof, as well as metals having a melting point higher than 1200° C. These materials can stand at high temperatures ranging between 600° C. and 1100° C. at which nitride semiconductors can be grown and nitride semiconductors do not grow or are difficult to grow on the surface of the materials.

After forming the protective film 32, the wafer was set in the reactor again and a 10-μm-thick undoped GaN layer to be a GaN substrate 100 was grown at 1050° C. The preferable thickness of the GaN layer depends on the thickness and the size of the protective film 32 and the GaN had a thickness enough to grow laterally (perpendicularly to the thickness direction) above the mask, so as to cover the surface of the protective film 32. In the case that the GaN substrate 100 was grown in a manner that a GaN layer was laterally grown on the surface of the protective film 32 on which nitride semiconductor were difficult to grow, initially, the GaN layer did not grow on the protective film 32 and grew selectively on the undoped GaN layer 31 in the window regions. In the case that the GaN layer was continued to grow, the GaN layer grew laterally and covered the protective film 32 and the GaN layers grown from the neighboring windows linked with each other, resulting in that the GaN layer was grown on the protective film 32. That is, the GaN layer was laterally grown on the GaN layer 31 via the protective film 32. Crystal defects in the GaN layer 31 grown on the sapphire substrate 30 and the number of crystal defects in the GaN substrates 100 grown on the protective film 32 were important. That is, extremely large number of crystal defects were caused in the nitride semiconductor layers grown on an auxiliary substrate due to the lattice mismatch between the auxiliary substrate and the nitride semiconductors and the crystal defects threaded through the nitride semiconductors grown sequentially upward to the surface. On the other hand, in Example 33, The GaN substrate 100 grown laterally on the protective film 32 was not directly on an auxiliary substrate and was obtained in a manner that the GaN layer grown from the neighboring windows linked to each other during growing laterally on the protective film 32. Therefore, the number of crystal defects decreased extremely, compared with that in the semiconductor layers grown on an auxiliary substrate. Thus, a mask was partially formed on the nitride semiconductor layer grown on an auxiliary substrate and a GaN layer was grown laterally on the mask, resulting in a GaN substrate having much less crystal defects than the GaN substrate according to Example 27. Actually, the number of the crystal defects in the undoped GaN layer was $10^{10}/cm^2$ or more, while the number of crystal defects in the GaN substrate according to Example 33 was $10^6/cm^2$ or less.

After forming a GaN substrate 100 in the above-mentioned manner, a 5-μm-thick n-side buffer layer, besides acting as a contact layer 11, consisting of GaN doped with Si to $1\times10^{18}/cm^3$ was grown on the GaN substrate in the same manner as in Example 27. And then, a 500-angstrom-thick crack preventing layer 13 consisting of $In_{0.1}Ga_{0.9}N$ doped with Si to $5\times10^{18}/cm^3$ was grown. The crack preventing layer 13 can be omitted.

(n-side Cladding Layer 14 Composed of Superlattices Having a Highly Doped Center Part)

Next, a 20-angstrom-thick undoped GaN layer was grown using TMG and ammonia gas at 1050° C. to form a second nitride the same temperature, adding TMA, a 5-angstrom-thick undoped $Al_{0.1}Ga_{0.9}N$ layer was grown and subsequently, adding silane gas, a 20-angstrom-thick $Al_{0.1}Ga_{0.9}N$ layer doped with Si to $1\times10^{19}/cm^3$ was grown, then, stopping Si, a 5-angstrom-thick undoped $Al_{0.1}Ga_{0.9}N$ layer being grown to form a 30-μm-thick first nitride semiconductor layer having a large band gap energy. Thereafter, in the same manner, the second nitride semiconductor layers and the first nitride semiconductor layers were formed by turns repeatedly. In Example 33, one-hundred-twenty second layers and one-hundred-twenty first layers were laminated by turns to form a n-side cladding layer 14 of superlattices with a thickness of 6 $\mu$m.

Next, a n-side light waveguide layer 15, an active layer 16, a p-side cap layer 17, and a p-side light waveguide layer were grown sequentially in the same manner as in Example 27.

(p-side Cladding Layer 19 Composed of Superlattices having a Highly Doped Center Part)

Next, a 20-angstrom-thick undoped GaN layer was grown using TMG and ammonia gas at 1050° C. to form a fourth nitride semiconductor layer having a small band gap energy. Next, at the same temperature, adding TMA, a 5-angstrom-thick undoped $Al_{0.1}Ga_{0.9}N$ layer was grown and subsequently, adding Cp2Mg, a 20-angstrom-thick $Al_{0.1}Ga_{0.9}N$ layer doped with Mg to $1\times10^{20}/cm^3$ was grown, then, stopping Cp2Mg, a 5-angstrom-thick undoped $Al_{0.1}Ga_{0.9}N$ layer being grown to form a 30-$\mu$m-thick third nitride semiconductor layer having a large band gap energy. Thereafter, in the same manner, the fourth nitride semiconductor layers and the third nitride semiconductor layers were formed by turns repeatedly. In Example 33, one-hundred-twenty fourth layers and one-hundred-twenty third layers were laminated by turns to form a n-side cladding layer 19 of superlattices with a thickness of 6 $\mu$m.

And finally, a p-side contact layer 20 was grown in the same manner as in Example 27 and then, the wafer was removed out of the reactor. The annealing was performed and the layers above the p-side cladding layer were etched into a stripe ridge geometry.

Next, as shown in FIG. 8, etching was performed symmetrically with respect to the ridge to expose the surface of the n-side buffer layer on which a n-electrode was to be formed and a n-electrode was formed. On the other hand, a stripe p-electrode was also formed on the top surface of the ridge of the p-side contact layer 20. Thereafter, in the same manner as in Example 27, laser devices were fabricated. The threshold current density and voltage decreased by 10%, compared to those in Example 27. The continuous emission at a wavelength of 405 nm was observed for 2000 hours or more. This was mainly because the enhancement of the crystal quality in the nitride semiconductors due to the GaN substrate 100 having less crystal defects. In FIG. 8, in the case of the GaN substrate 100 having a thickness of, for example, 80 $\mu$m or more, the layers between an auxiliary substrate 30 and the protective film 32 can be omitted.

Example 34

With the same procedures as in Example 33, the n-side cladding layer was composed of superlattices with a total thickness of 0.6 $\mu$m obtained by laminating 20-angstrom-thick undoped GaN layers and 20-angstrom-thick $Al_{0.1}Ga_{0.9}N$ layers doped with Si to $1\times10^{19}/cm^3$ instead of superlattices having a highly doped center part.

On the other hand, the p-side cladding layer 19 was composed of superlattices with a total thickness of 0.6 $\mu$m obtained by laminating 20-angstrom-thick undoped GaN layers and 20-angstrom-thick $Al_{0.1}Ga_{0.9}N$ layers doped with Mg to $1\times10^{20}/cm^3$ instead of superlattices having a highly doped center part. The other constructions were the same as those in Example 33. For the fabricated laser devices, the threshold value decreased a little and the lifetime was similarly 2000 hours or longer, compared to those of Example 33.

Example 35

With the same procedures as in Example 33, the n-side cladding layer 14 was composed of superlattices with a total thickness of 0.6 $\mu$m obtained by laminating 25-angstrom-thick GaN layers doped with Si to $1\times10^{19}/cm^3$ and 25-angstrom-thick undoped $Al_{0.1}Ga_{0.9}N$ layers respectively by turns. On the other hand, the p-side cladding layer 19 was composed of superlattices with a total thickness of 0.6 $\mu$m obtained by laminating 25-angstrom-thick GaN layers doped with Mg to $1\times10^{20}/cm^3$ and 25-angstrom-thick undoped $Al_{0.1}Ga_{0.9}N$ layers respectively by turns. The other constructions were the same as those in Example 33. The fabricated laser devices had similar properties and lifetime to those of Example 33.

Example 36

With the same procedures as in Example 33, the n-side cladding layer 14 was composed of superlattices with a total thickness of 0.6 $\mu$m obtained by laminating 25-angstrom-thick GaN layers doped with Si to $1\times10^{19}/cm^3$ and 25-angstrom-thick $Al_{0.1}Ga_{0.9}N$ layers doped with Si to $1\times10^{17}/cm^3$ respectively by turns. On the other hand, the p-side cladding layer 19 was composed of superlattices with a total thickness of 0.6 $\mu$m obtained by laminating 25-angstrom-thick GaN layers doped with Mg to $1\times10^{20}/cm^3$ and 25-angstrom-thick $Al_{0.1}Ga_{0.9}N$ layers doped with Mg to $1\times10^{18}/cm^3$ respectively by turns. The other constructions were the same as those in Example 33. The fabricated laser devices had similar properties and lifetime to those of Example 33.

Example 37

With the same procedures as in Example 33, the n-side cladding layer was composed of a 0.6 $\mu$m-thick $Al_{0.1}Ga_{0.9}N$ layer doped with Si to $1\times10^{19}/cm^3$, instead of superlattices. On the other hand, the p-side cladding layer 19 was composed of superlattices with a total thickness of 0.6 $\mu$m obtained by laminating 25-angstrom-thick GaN layers doped with Mg to $1\times10^{20}/cm^3$ and 25-angstrom-thick $Al_{0.1}Ga_{0.9}N$ layers doped with Mg to $1\times10^{18}/cm^3 cm^3$ respectively by turns. The other constructions were the same as those in Example 33. For the fabricated laser devices, the threshold values increased a little and the lifetime was similarly 1000 hours or longer, compared to those of Example 33.

Example 38

With the same procedures as in Example 33, the n-side cladding layer and p-side cladding layer were modulation-doped superlattices (in which the center part was not highly doped and the impurity density was almost even within the layer). And the n-side buffer layer 11 was composed of superlattices with a total thickness of 2 $\mu$m obtained by laminating 50-angstrom-thick $Al_{0.05}Ga_{0.95}N$ layers doped with Si to $1\times10^{19}/cm^3$ and 50-angstrom-thick undoped GaN layers respectively by turns. The other constructions were the same as those in Example 33. For the fabricated laser devices, the threshold values decreased a little and the lifetime was 3000 hours or longer, compared to those of Example 33.

Example 39

With the same procedures as in Example 33, the n-side cladding layer 14 was composed of superlattices with a total thickness of 0.6 $\mu$m obtained by laminating 20-angstromthick undoped GaN layers and 20-angstrom-thick $Al_{0.1}Ga_{0.9}N$ layers doped with Si to $1\times10^{19}/cm^3$ respectively by turns. The n-side light waveguide layer 15 was composed of superlattices with a total thickness of 0.1 μm obtained by laminating 25-angstrom-thick GaN layers doped with Si to $1\times10^{19}/cm^3$ and 25-angstrom-thick undoped $Al_{0.05}Ga_{0.95}N$ layers respectively by turns.

On the other hand, the p-side light waveguide layer was composed of superlattices with a total thickness of 0.1 μm obtained by laminating 25-angstrom-thick GaN layers doped with Mg to $1\times10^{19}/cm^3$ and 25-angstrom-thick undoped $Al_{0.05}Ga_{0.95}N$ layers respectively by turns. Next, the p-side cladding layer was composed of superlattices with a total thickness of 0.6 μm obtained by laminating 20-angstrom-thick undoped GaN and 20-angstrom-thick $Al_{0.1}Ga_{0.9}N$ layers doped with Mg to $1\times10^{20}/cm^3$ respectively by turns. The other constructions were the same as those in Example 33. For the fabricated laser devices, the threshold values decreased a little and the lifetime was 3000 hours or longer, compared to those of Example 33.

Example 40

Example 40 provides laser devices fabricated using a GaN substrate like Example 33.

That is, the laser devices according to Example 40 were fabricated by forming the following semiconductor layers on the GaN substrate 100 which was formed in the same manner as in Example.

First, a 2-μm-thick n-side contact layer (n-side second nitride semiconductor layer) consisting of n-type GaN doped Si to $1\times10^{18}/cm^3$ or more was grown on the GaN substrate 100. This layer may be composed of superlattices consisting of undoped GaN and Si doped $Al_xGa_{1-x}N$ $(0<X\leq0.4)$.

Next, after growing the n-side contact layer, at 800° C., using TMG, TMI, ammonia and silane gas in the nitrogen atmosphere, a 500-angstrom-thick crack preventing layer consisting of $In_{0.1}Ga_{0.9}N$ doped with Si to $5\times10^{18}/cm^3$ was grown. The crack-preventing layer consisted of n-type nitride semiconductor containing In, preferably InGaN, so as to prevent the crack from threading the nitride semiconductor layers containing Al to be grown thereafter. The thickness of the crack preventing layer may preferably range between 1000 angstroms and 0.5 μm. If the thickness is thinner than 100 angstroms, the crack preventing layer is difficult to prevent cracks. If the thickness is thicker than 0.5 μm. the crystal itself tends to turn into black.

Subsequently, at 1050° C., using TMA, TMG, ammonia and silane gas, a 40-angstrom-thick n-type $Al_{0.2}Ga_{0.8}N$ layer doped with Si to $1\times10^{19}/cm^3$ and a 40-angstrom-thick undoped GaN layer were grown. One-hundred of these layers were laminated respectively by turns to grow a n-side cladding layer of superlattices with a total thickness of 0.8 μm.

Subsequently, a 0.1 μm thick n-side light waveguide layer consisting of undoped $Al_{0.05}Ga_{0.95}N$ was grown. This layer acts as a light waveguide layer to guide the waves of light emitted from the active layer and may be undoped dr doped with n-type impurity. This layer may be composed of superlattices consisting of GaN and AlGaN.

Next, a 400-angstrom-thick active layer consisting of undoped $In_{0.01}Ga_{0.99}N$ was grown.

Next, a 300-angstrom-thick p-side cap layer consisting of p-type $Al_{0.2}Ga_{0.8}N$ doped with Mg to $1\times10^{19}/cm^3$ and having a larger band gap energy than the p-side light waveguide layer to be formed thereafter was grown.

Next, a 0.1 μm-thick n-side light waveguide layer consisting of $Al_{0.01}Ga_{0.99}N$ and having a smaller band gap energy than the p-side cap layer was grown. This layer acted as a waveguide for the active layer. The layer may be composed of superlattices consisting of nitride semiconductors. In the case that the p-side light waveguide layer is composed of superlattices, the band gap energy of the barrier layer having a larger band gap energy should larger than that of the active layer and smaller than that of the p-side cladding layer.

Subsequently, a p-side cladding layer composed of superlattices with a total thickness of 0.8 μm obtained by laminating 40-angstrom-thick p-type $Al_{0.2}Ga_{0.8}N$ layers doped with Mg to $1\times10^{19}/cm^3$ and 40-angstrom-thick undoped GaN layers respectively by turns was grown.

Finally, a 150-angstrom-thick p-side contact layer consisting of p-type GaN doped with Mg to $1\times10^{20}/cm^3$ was grown on the p-side cladding layer. Particularly, in the case of laser devices, the p-side contact layer consisting of nitride semiconductors having a small band gap energy is in contact with the p-side cladding layer of superlattices containing AlGaN and has a thickness of as thin as 500 angstroms or less. Therefore, the carrier density in the p-side contact layer is high and a good ohmic contact to the p-electrode is obtained, with the result that the threshold current and voltage tends to decrease.

The wafer on which nitride semiconductors were grown in the above-mentioned manner was annealed at a given temperature to make the p-type impurity doped layers less resistive and removed out of the reactor. The top p-side contact layer and the p-side cladding layer were etched into a ridge geometry with a stripe width of 4 μm. Thus, the layers above the active layer had a stripe ridge geometry and the emission from the active layer focused under the stripe ridge, with the result that the threshold values decreased. Particularly, the layers above the p-side cladding layer of superlattices may preferably have a ridge geometry. The annealing method disclosed by U.S. Pat. No. 5,306,662 is employed in this Example.

Next, a mask was formed on the surface of the ridge and the etching was performed with a RIE apparatus to expose the surface of the n-side contact layer, a stripe n-electrode consisting of Ti and Al being formed. On the other hand, a stripe p-electrode consisting of Ni and Au was formed on the top surface of the ridge of the p-side contact layer. Examples of electrode materials to obtain a good ohmic contact to the p-type GaN layer may include Ni, Pt, Pd, Ni/Au, Pt/Au, Pd/Au and so on. Examples of electrode materials to obtain a good ohmic contact to the n-type GaN may include metals such as Al, Ti, W, Cu, Zn, Sn or In and alloys thereof.

Next, insulating layers consisting of $SiO_2$ were formed on the exposed surfaces of the nitride semiconductor layers between the p-electrode and the n-electrode and a p-pad electrode was formed which was connected with the p-electrode electrically via the insulating layers. The p-electrode enlarged substantially the surface area of the p-electrode to enable wire-bonding and die-bonding of the p-electrode side.

The wafer on which the n-electrode and p-electrode were formed in the above-mentioned manner is transferred to the polishing machine. The sapphire substrate on whose side the nitride semiconductors were not formed was lapped with a diamond abrasive to a substrate thickness of 70 μm. After lapping, the surface of the substrate was further polished by 1 μm with a finer abrasive, resulting in the mirror facet and the whole surface was metallized with Au/Sn.

Then, the Au/Sn side was scribed and cleaved into bars perpendicularly with respect to the stripe electrode to fabricate a facet of a resonator on the cleaved facet. A dielectric multi-layer film consisting $SiO_2$ and $TiO_2$ was formed on the facet of the resonator and finally, the bar was cut parallel to the p-electrode, resulting in laser chips. Next, the chips were set face-up (in the state that the substrate was faced to the heat sink) onto the heat sink and each electrode was connected by wire-bonding. The laser oscillation was tried at room temperature. The continuous emission at a wavelength of 368 nm was observed at the threshold current density of 2.0 $kA/cm^2$ and the threshold voltage of 4.0V at room temperature. The lifetime was 1000 hours or longer.

Example 41

The laser device in Example 41 and the following examples was fabricated on the basis of the embodiment 4. The Example 41 will be described in connection with FIG. 9.

(Underlying Layer 302)

The auxiliary substrate 301 made of sapphire with 20-inch Φ and a C-plane was set in the MOVPE reactor and the temperature was set to be 500° C. A 200-angstrom-thick buffer layer (not shown) made of GaN was grown using trimethylgallium (TMG) and ammonia (NH3). After the growth of the buffer layer, the temperature was increased to 1050° C. and a 4-μm-thick underlying layer 302 made of the same GaN was grown.

(Protective Film 303)

After the growth of the underlying layer 302, the wafer was removed out of the reactor and a stripe-shaped photomask was formed on the surface of the underlying layer. A 1-μm-thick protective film 303 made of $SiO_2$ was patterned to form 10-μm-wide stripe windows with a periodicity of 2 μm on the underlying layer 302 with a CVD apparatus.

(Nitride Semiconductor Substrate 304)

After the growth of the protective film 303, the wafer was set again in the MOVPE reactor and the temperature was set to be 1050° C. A 20-μm-thick nitride semiconductor substrate made of undoped GaN was grown using TMG and ammonia. On the surface of the resulting nitride semiconductor substrate, the crystal defects developed parallel to the stripe-shaped protective film in the stripe center part of the protective film and in the stripe center part of the window. However, when the ridge of the laser device was formed later, the ridge stripe was formed not to be on the crystal defects, so as to prevent the developing of the crystal defects into the active layer and enhance the reliability of the device.

(n-side Buffer Layer 311 which also Functions as a n-side Contact Layer)

Next, a 5-μm-thick n-side buffer layer made of GaN doped with Si to $3\times10^{18}/cm^3$ was grown on the second nitride semiconductor layer 4 using ammonia and TMG, and silane gas as an impurity gas.

(Crack Preventing Layer 312)

Next, a 0.15-μm-thick crack preventing layer 312 made of $In_{0.16}Ga_{0.84}N$ was grown using TMG, TMI (trimethylindium) and ammonia at 800° C.

(n-side Cladding Layer 313=a Super Lattice Layer)

Subsequently, a 25-angstrom-thick first layer made of n-type $Al_{0.16}Ga_{0.84}N$ doped with Si to $1\times10^{18}/cm^3$ was grown using TMA, TMG, ammonia and silane gas at 1050° C. Successively, the silane gas and TMA was stopped and a 25-angstrom-thick second layer made of undoped GaN was grown. The first layer and the second layer may be laminated in the order of 1st, 2nd, 1st and so on, to constitute a super lattice layer, resulting in the n-side cladding layer 313 having a super lattice structure and a total thickness of 1.2 μm. The n-side cladding layer made in a super lattice structure had an Al average composition of 8.0% and the product thereof multiplied by the thickness was 9.6.

(n-side Light Waveguide Layer 314)

Subsequently, the silane gas was stopped and a 0.1-μm-thick n-side light waveguide layer made of undoped GaN was grown at 1050° C.

(Active Layer 315)

Next, the active layer 314 was grown using TMG, TMI and ammonia. For the active layer, the temperature was maintained at 800° C. and a 40-angstrom-thick quantum well layer made of undoped $In_{0.2}Ga_{0.8}N$ was grown. Successively, only the ratio of TMI was changed and at the same temperature, a 100-angstrom-thick barrier layer made of undoped $In_{0.01}Ga_{0.99}N$ was grown. The quantum well layer and the barrier layer were laminated alternately so that a barrier layer was the last one, resulting in the active layer having a multi-quantum-well structure and a total thickness of 440 angstroms.

(p-Side Cap Layer 316)

Next, the temperature was increased to 1050° C. and a 300-angstrom-thick p-side cap layer 316 made of p-type $Al_{0.3}Ga_{0.7}N$ doped Mg to $1\times10^{20}/cm^3$ and has a larger band gap energy than the p-side light waveguide layer 317 was grown using TMG, TMA, ammonia an Cp2Mg (cyclopentadienyl magnesium).

(p-side Light Waveguide Layer 317)

Subsequently, Cp2Mg and TMA were stopped and a 0.1-μm-thick p-side light waveguide layer made of undoped GaN and having a smaller band gap energy than the p-side cap layer 316 was grown at 1050° C.

(p-side Cladding Layer 318)

Subsequently, a 25-angstrom-thick third layer made of p-type $Al_{0.16}Ga_{0.84}N$ doped with Mg to $1\times10^{20}/cm^3$ was grown at 1050° C. Successively, only TMG was stopped and a 25-angstrom-thick fourth layer made of undoped GaN was grown, so as to obtain the p-side cladding layer having a super lattice layer with a total thickness of 0.6 μm. The p-side cladding layer also had an Al average composition of 8% and the product thereof multiplied by the thickness was 4.8.

(p-side Cladding Layer 319)

Subsequently, a 25-angstrom-thick third layer made of p-type $Al_{0.16}Ga_{0.84}N$ doped with Mg to $1\times10^{20}/cm^3$ was grown at 1050° C. and successively, only TMA was stopped and a 25-angstrom-thick fourth layer made of undoped GaN was grown, so as to grow the p-side cladding layer 318 having a super lattice structure with a total thickness of 0.6 μm. The p-side cladding layer had an average Al composition of 8% and the product thereof multiplied by the thickness was 4.8.

(p-side Contact Layer 319)

Finally, a 150-angstrom-thick p-side contact layer 318 made of p-type GaN doped with Mg to $2\times10^{20}/cm^3$ was grown on the p-side cladding layer 318 at 1050° C.

The wafer on which the nitride semiconductor was grown in the above-mentioned way was annealed in the nitrogen atmosphere within the reactor to decreased the resistance of the layer doped with a p-type impurity.

After annealing, the wafer was removed out of the reactor and the p-side contact layer 318 which was the top layer and the p-side cladding layer 317 were etched into a ridge having a stripe width of 4 μm, as shown in FIG. 9, with a RIE apparatus. When the ridge stripe was formed, said ridge was formed at the position where the crystal defects did not develop on the surface of the nitride semiconductor substrate.

Next, a mask was formed on the ridge surface and the etching was performed to expose the surface of the n-side buffer layer 311.

Next, the p electrode 320 made of Ni and Au was formed in the form of stripe on the outermost surface of the ridge of the p-side contact layer 319, while the n electrode 322 made of Ti and Al was formed in the form of stripe on the surface of the n-side buffer layer 311 which had been just exposed. Thereafter, as shown in FIG. 9, an insulating film 323 made of $SiO_2$ was formed on the surface of the nitride semiconductor layer which were exposed between the p electrode 320 and the n electrode 322. The p pad electrode 321 was formed which was electrically connected to the p electrode 320 via said insulating layer 323.

The sapphire substrate of the wafer on which the n electrode and p electrode were formed in the above-mentioned manner was polished to a thickness of $70\mu$, and then the wafer was cleaved into bars perpendicularly to the stripe-geometry electrode from the substrate side to fabricate a facet of a resonator on the cleaving facet. A multi-layer dielectric film consisting $SiO_2$ and $TiO_2$ was formed on the facet of the resonator and finally, the bar was cut parallel to the p-electrode, resulting in laser chips.

The laser device was set onto the heat sink and each electrode was connected by wire-bonding. The laser oscillation was tried at room temperature. The continuous emission was observed at room temperature. The FFP of the single laser was uniform and the shape thereof was an oval, which was a good shape. Concerning the characteristics of the laser device, the threshold was decreased by not less than 10% and the lifetime was increased by not less than 50%, compared with the laser device which we had published in Jpn. J. Appl. phys. Vol. 36 (1997).

Example 42

With the same procedures as in Example 41 except that the n-side cladding layer 313 had a super lattice layer structure with a total thickness of 1.0 $\mu$m which was obtained by laminating a 25-angstrom-thick Si-doped n-type $Al_{0.20}Ga_{0.80}N$ and a 25-angstrom-thick undoped GaN, the laser device was fabricated. The n-side cladding layer had an average Al composition of 10.0% and the product thereof multiplied by the thickness was 10.0. The laser device had almost the same characteristics as that in Example 41.

Example 43

With the same procedures as in Example 41 except that the n-side cladding layer 313 had a super lattice layer structure with a total thickness of 0.7 $\mu$m which was obtained by laminating a 25-angstrom-thick Si-doped n-type $A_{0.20}Ga_{0.80}N$ and a 25-angstrom-thick undoped GaN, the laser device was fabricated. The n-side cladding layer had an average Al composition of 1.0% and the product thereof multiplied by the thickness was 7.0. The laser device had almost the same characteristics as that in Example 41.

Example 44

With the same procedures as in Example 41 except that the n-side cladding layer 313 had a super lattice layer structure with a total thickness of 0.8 $\mu$m which was obtained by laminating a 25-angstrom-thick Si-doped n-type $Al_{0.12}Ga_{0.88}N$ and a 25-angstrom-thick undoped GaN, the laser device was fabricated. The n-side cladding layer had an average Al composition of 6.0% and the product thereof multiplied by the thickness was 4.8. The threshold of said laser device was decreased by not less than 5% and the lifetime was increased by not less than 20%, compared with the laser device which we had published in Jpn. J. Appl. phys. Vol. 36 (1997).

Example 45

With the same procedures as in Example 41 except that the n-side cladding layer 313 had a super lattice layer structure with a total thickness of 1.4 $\mu$m which was obtained by laminating a 25-angstrom-thick Si-doped n-type $Al_{0.07}Ga_{0.93}N$ and a 25-angstrom-thick undoped GaN, the laser device was fabricated. The n-side cladding layer had an average Al composition of 3.5% and the product thereof multiplied by the thickness was 4.9. The laser device had almost the same characteristics as that in Example 41.

INDUSTRIAL APPLICABILITY

As mentioned above, the nitride semiconductor devices according to the present invention are composed of super-lattice layers in the domain of the p-type nitride semiconductor or n-type nitride semiconductor except for the active layer, to improve the electric power efficiency extremely.

That is, in the conventional nitride semiconductor devices, the active layer having a multi-quantum-well-structure has been proposed. However, the layer such as the cladding layer, which was on the either side of the active layer, has been usually composed of a single nitride semiconductor layer. In the nitride semiconductor devices according to the present invention, the cladding layer or the contact layer injecting electric current is composed of super-lattice layer which shows quantum effect to reduce the resistivity of the cladding layer side. Therefore, the threshold electric current and the threshold voltage of LD devices can be low and the lifetime thereof can be long. Moreover, the conventional LED has been weak to the static electricity, but the devices according to the present invention can have a good electrical static discharge survivability. Thus, since Vf and the threshold voltage can be low, the calorific value can be small and the reliability of the devices can be enhanced. The nitride semiconductor devices according to the present invention can be applied to emitting devices such as LED and LD, as well as solar cells using nitride semiconductors, light sensors, transistors and so on, to realize devices with very high efficiency and the industrial applicability is very wide.

What is claimed is:

1. A nitride semiconductor device comprising;

an active layer of a nitride semiconductor positioned between a p-side region and an n-side region, said p-side region including a p-side contact layer, a p-side first layer positioned between said active layer and said p-side contact layer and a p-side second layer positioned between said p-side first layer and said active layer, wherein at least one of said p-side first layer, said p-side second layer and said p-side contact layer is a super lattice layer comprising first and second nitride thin layers, each of said first and second nitride thin layers having a thickness of not more than 100 angstroms, wherein said n-side region including an n-side contact layer, an n-side first layer positioned between said active layer and said n-side contact layer and a n-side second layer positioned between said n-side first layer and said active layer, and wherein at least one of said n-side first layer, said n-side second layer and said n-side contact layer is a super lattice layer.

2. A nitride semiconductor device according to claim 1; wherein said n-side first layer is a super lattice layer.

3. A nitride semiconductor device according to claim 2; wherein said n-side first layer comprises third nitride thin layers and fourth nitride thin layers having a different band gap from that of said third nitride thin layer, each of said third nitride thin layers and each of said fourth nitride thin layers being laminated alternately.

4. A nitride semiconductor device according to claim 3, wherein said third nitride thin layers have a higher band gap energy and a larger concentration of the n-type impurity than those of said fourth nitride thin layers.

5. A nitride semiconductor device according to claim 4; wherein said third nitride thin layers are made of $Al_YGa_{1-Y}N$ ($0<Y<1$) and said fourth nitride thin layers are made of $In_XGa_{1-X}N$ ($0 \leq X<1$).

6. A nitride semiconductor device according to claim 5, wherein said fourth nitride thin layers are made of GaN.

7. A nitride semiconductor device according to claim 4, wherein each of said fourth nitride thin layers is not doped with a n-type impurity.

8. A nitride semiconductor device according to claim 1; wherein said n-side first layer contains Al.

* * * * *